United States Patent
Yu et al.

(10) Patent No.: US 12,183,604 B2
(45) Date of Patent: Dec. 31, 2024

(54) INTEGRATED DRY PROCESSES FOR PATTERNING RADIATION PHOTORESIST PATTERNING

(71) Applicant: Lam Research Corporation, Fremont, CA (US)

(72) Inventors: Jengyi Yu, San Ramon, CA (US); Samantha S. H. Tan, Newark, CA (US); Mohammed Haroon Alvi, San Jose, CA (US); Richard Wise, Los Gatos, CA (US); Yang Pan, Los Altos, CA (US); Richard Alan Gottscho, Menlo Park, CA (US); Adrien LaVoie, Newberg, OR (US); Sivananda Krishnan Kanakasabapathy, Pleasanton, CA (US); Timothy William Weidman, Sunnyvale, CA (US); Qinghuang Lin, Yorktown Heights, NY (US); Jerome S. Hubacek, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/184,545

(22) Filed: Mar. 15, 2023

(65) Prior Publication Data
US 2023/0290657 A1      Sep. 14, 2023

Related U.S. Application Data

(63) Continuation of application No. 17/758,125, filed as application No. PCT/US2021/040381 on Jul. 2, 2021.
(Continued)

(51) Int. Cl.
*H01L 21/67* (2006.01)
*G03F 7/004* (2006.01)
(Continued)

(52) U.S. Cl.
CPC ...... *H01L 21/67225* (2013.01); *G03F 7/0042* (2013.01); *G03F 7/16* (2013.01);
(Continued)

(58) Field of Classification Search
None
See application file for complete search history.

(56) References Cited

U.S. PATENT DOCUMENTS

| 3,442,648 A | 5/1969 | Smith et al. |
| 3,513,010 A | 5/1970 | Notley et al. |

(Continued)

FOREIGN PATENT DOCUMENTS

| CN | 101098575 A | 1/2008 |
| CN | 101490810 B | 4/2011 |

(Continued)

OTHER PUBLICATIONS

Banerjee, D et al., "Potential of Metal-Organic Frameworks for Separation of Xenon and Krypton", Accounts of Chemical Research, 2015, vol. 48, No. 2, pp. 211-219.
(Continued)

*Primary Examiner* — Binu Thomas
(74) *Attorney, Agent, or Firm* — Weaver Austin Villeneuve & Sampson LLP

(57) ABSTRACT

Methods for making thin-films on semiconductor substrates, which may be patterned using EUV, include: depositing the organometallic polymer-like material onto the surface of the semiconductor substrate, exposing the surface to EUV to form a pattern, and developing the pattern for later transfer to underlying layers. The depositing operations may be performed by chemical vapor deposition (CVD), atomic layer deposition (ALD), and ALD with a CVD component,
(Continued)

such as a discontinuous, ALD-like process in which metal precursors and counter-reactants are separated in either time or space.

37 Claims, 17 Drawing Sheets

Related U.S. Application Data

(60) Provisional application No. 62/705,616, filed on Jul. 7, 2020.

(51) Int. Cl.
*G03F 7/16* (2006.01)
*G03F 7/36* (2006.01)
*G03F 7/38* (2006.01)

(52) U.S. Cl.
CPC .............. *G03F 7/167* (2013.01); *G03F 7/168* (2013.01); *G03F 7/36* (2013.01); *G03F 7/38* (2013.01); *H01L 21/6715* (2013.01); *H01L 21/67167* (2013.01); *H01L 21/67207* (2013.01)

(56) References Cited

U.S. PATENT DOCUMENTS

| | | | |
|---|---|---|---|
| 3,529,963 A | 9/1970 | Marchese et al. |
| 3,576,755 A | 4/1971 | Patella et al. |
| 3,720,515 A | 3/1973 | Stanley |
| 4,061,829 A | 12/1977 | Taylor |
| 4,241,165 A | 12/1980 | Hughes et al. |
| 4,292,384 A | 9/1981 | Straughan et al. |
| 4,328,298 A | 5/1982 | Nester |
| 4,341,592 A | 7/1982 | Shortes et al. |
| 4,396,704 A | 8/1983 | Taylor |
| 4,590,149 A | 5/1986 | Nakane et al. |
| 4,738,748 A | 4/1988 | Kisa |
| 4,806,456 A | 2/1989 | Katoh |
| 4,814,243 A | 3/1989 | Ziger |
| 4,834,834 A | 5/1989 | Ehrlich et al. |
| 4,842,989 A | 6/1989 | Taniguchi et al. |
| 4,845,053 A | 7/1989 | Zajac |
| 4,940,854 A | 7/1990 | Debe |
| 4,956,204 A | 9/1990 | Amazawa et al. |
| 5,077,085 A | 12/1991 | Schnur et al. |
| 5,079,600 A | 1/1992 | Schnur et al. |
| 5,094,936 A | 3/1992 | Misium et al. |
| 5,322,765 A | 6/1994 | Clecak et al. |
| 5,399,464 A | 3/1995 | Lee |
| 5,445,988 A | 8/1995 | Schwalke |
| 5,534,312 A | 7/1996 | Hill et al. |
| 5,761,023 A | 6/1998 | Lue et al. |
| 5,798,203 A | 8/1998 | Haraguchi et al. |
| 5,914,278 A | 6/1999 | Boitnott et al. |
| 5,925,494 A | 7/1999 | Horn |
| 6,013,418 A | 1/2000 | Ma et al. |
| 6,017,553 A | 1/2000 | Burrell et al. |
| 6,045,877 A | 4/2000 | Gleason et al. |
| 6,162,577 A | 12/2000 | Felter et al. |
| 6,179,922 B1 | 1/2001 | Ishikawa et al. |
| 6,261,938 B1 | 7/2001 | Beauvais et al. |
| 6,290,779 B1 | 9/2001 | Saleh et al. |
| 6,313,035 B1 | 11/2001 | Sandhu et al. |
| 6,319,654 B1 | 11/2001 | Kim et al. |
| 6,348,239 B1 | 2/2002 | Hill et al. |
| 6,410,421 B1 | 6/2002 | Ghandehari et al. |
| 6,448,097 B1 | 9/2002 | Singh et al. |
| 6,573,030 B1 | 6/2003 | Fairbairn et al. |
| 6,607,867 B1 | 8/2003 | Kim et al. |
| 6,666,986 B1 | 12/2003 | Vaartstra |
| 6,797,439 B1 | 9/2004 | Alpay |
| 6,833,306 B2 | 12/2004 | Lyding et al. |
| 6,841,341 B2 | 1/2005 | Fairbairn et al. |
| 6,841,943 B2 | 1/2005 | Vahedi et al. |
| 7,112,489 B1 | 9/2006 | Lyons et al. |
| 7,169,440 B2 | 1/2007 | Balasubramaniam et al. |
| 7,223,526 B2 | 5/2007 | Fairbairn et al. |
| 7,307,695 B2 | 12/2007 | Hazenberg et al. |
| 7,335,462 B2 | 2/2008 | Fairbairn et al. |
| 7,608,367 B1 | 10/2009 | Aigeldinger et al. |
| 8,383,316 B2 | 2/2013 | Cooper et al. |
| 8,465,903 B2 | 6/2013 | Weidman et al. |
| 8,536,068 B2 | 9/2013 | Weidman et al. |
| 8,552,334 B2 | 10/2013 | Tappan et al. |
| 8,664,124 B2 | 3/2014 | Graff |
| 8,664,513 B2 | 3/2014 | Pfenninger et al. |
| 8,703,386 B2 | 4/2014 | Bass et al. |
| 8,808,561 B2 | 8/2014 | Kanarik |
| 8,883,028 B2 | 11/2014 | Kanarik |
| 8,883,405 B2 | 11/2014 | Shiobara |
| 9,023,731 B2 | 5/2015 | Ji et al. |
| 9,261,784 B2 | 2/2016 | Wuister et al. |
| 9,281,207 B2 | 3/2016 | Stowers et al. |
| 9,310,684 B2 | 4/2016 | Meyers et al. |
| 9,551,924 B2 | 1/2017 | Burkhardt et al. |
| 9,576,811 B2 | 2/2017 | Kanarik et al. |
| 9,632,411 B2 | 4/2017 | Michaelson et al. |
| 9,719,169 B2 | 8/2017 | Mohn et al. |
| 9,778,561 B2 | 10/2017 | Marks et al. |
| 9,823,564 B2 | 11/2017 | Stowers et al. |
| 9,829,805 B2 | 11/2017 | Michaelson et al. |
| 9,996,004 B2 | 6/2018 | Smith et al. |
| 10,025,179 B2 | 7/2018 | Meyers et al. |
| 10,074,543 B2 | 9/2018 | Mahorowala et al. |
| 10,228,618 B2 | 3/2019 | Meyers et al. |
| 10,416,554 B2 | 9/2019 | Meyers et al. |
| 10,514,598 B2 | 12/2019 | Marks et al. |
| 10,566,212 B2 | 2/2020 | Kanarik |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,763,083 B2 | 9/2020 | Yang et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,796,912 B2 | 10/2020 | Shamma et al. |
| 10,831,096 B2 | 11/2020 | Marks et al. |
| 11,209,729 B2 | 12/2021 | Marks et al. |
| 11,257,674 B2 | 2/2022 | Shamma et al. |
| 11,314,168 B2 | 4/2022 | Tan et al. |
| 11,488,831 B2 | 11/2022 | Zhu et al. |
| 11,921,427 B2 | 3/2024 | Weidman et al. |
| 11,988,965 B2 | 5/2024 | Tan et al. |
| 12,105,422 B2 | 10/2024 | Tan et al. |
| 2001/0024769 A1 | 9/2001 | Donoghue et al. |
| 2001/0055731 A1* | 12/2001 | Irie .................... G03F 7/38 430/324 |
| 2002/0015855 A1 | 2/2002 | Sajoto et al. |
| 2002/0017243 A1 | 2/2002 | Pyo |
| 2002/0123221 A1 | 9/2002 | Jost et al. |
| 2002/0180372 A1 | 12/2002 | Yamazaki |
| 2002/0185067 A1 | 12/2002 | Upham |
| 2003/0008246 A1 | 1/2003 | Cheng et al. |
| 2003/0027060 A1 | 2/2003 | Lederer |
| 2003/0049571 A1 | 3/2003 | Hallock et al. |
| 2003/0134231 A1 | 7/2003 | Tsai et al. |
| 2003/0183244 A1 | 10/2003 | Rossman |
| 2004/0067444 A1 | 4/2004 | Wakabayashi et al. |
| 2004/0097388 A1 | 5/2004 | Brask et al. |
| 2004/0103914 A1 | 6/2004 | Cheng et al. |
| 2004/0113087 A1 | 6/2004 | Ikeda et al. |
| 2004/0115956 A1 | 6/2004 | Ishida |
| 2004/0175631 A1 | 9/2004 | Crocker et al. |
| 2004/0191423 A1 | 9/2004 | Ruan et al. |
| 2004/0203256 A1 | 10/2004 | Yang et al. |
| 2004/0209201 A1 | 10/2004 | Nakano et al. |
| 2004/0213563 A1 | 10/2004 | Irie |
| 2004/0229169 A1 | 11/2004 | Sandstrom |
| 2004/0233401 A1 | 11/2004 | Irie |
| 2005/0120955 A1 | 6/2005 | Yamasaki et al. |

(56) References Cited

U.S. PATENT DOCUMENTS

| | | |
|---|---|---|
| 2005/0142885 A1 | 6/2005 | Shinriki |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2005/0257747 A1 | 11/2005 | Wakabayashi et al. |
| 2006/0001064 A1 | 1/2006 | Hill et al. |
| 2006/0046470 A1 | 3/2006 | Becknell et al. |
| 2006/0068173 A1 | 3/2006 | Kajiyama et al. |
| 2006/0084192 A1 | 4/2006 | Zhang |
| 2006/0128127 A1 | 6/2006 | Seo et al. |
| 2006/0147818 A1 | 7/2006 | Lee |
| 2006/0151462 A1 | 7/2006 | Lee et al. |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2006/0246713 A1 | 11/2006 | Tsai et al. |
| 2006/0287207 A1 | 12/2006 | Park et al. |
| 2007/0017386 A1 | 1/2007 | Kamei |
| 2007/0037357 A1 | 2/2007 | Culp |
| 2007/0037410 A1 | 2/2007 | Chang et al. |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2007/0259492 A1 | 11/2007 | Roh et al. |
| 2007/0287073 A1 | 12/2007 | Goodwin |
| 2008/0070128 A1 | 3/2008 | Wu et al. |
| 2008/0131616 A1 | 6/2008 | Besson et al. |
| 2008/0157011 A1 | 7/2008 | Nagai et al. |
| 2009/0130859 A1 | 5/2009 | Itatani et al. |
| 2009/0134119 A1 | 5/2009 | Matsumaru et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0009274 A1 | 1/2010 | Yamamoto |
| 2010/0022078 A1 | 1/2010 | Rockenberger et al. |
| 2010/0051446 A1 | 3/2010 | Wang et al. |
| 2010/0068660 A1 | 3/2010 | Shibazaki et al. |
| 2010/0086880 A1 | 4/2010 | Saito et al. |
| 2010/0131093 A1 | 5/2010 | Yokoyama et al. |
| 2010/0197135 A1 | 8/2010 | Ishizaka |
| 2010/0260994 A1 | 10/2010 | Groenen et al. |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2011/0104595 A1 | 5/2011 | Hayashi et al. |
| 2011/0117702 A1 | 5/2011 | Rietzler et al. |
| 2011/0195142 A1 | 8/2011 | Mitamura et al. |
| 2011/0195362 A1 | 8/2011 | Watanabe et al. |
| 2011/0198756 A1 | 8/2011 | Thenappan et al. |
| 2011/0200953 A1 | 8/2011 | Arima et al. |
| 2011/0207302 A1 | 8/2011 | Wang et al. |
| 2011/0209725 A1 | 9/2011 | Kim et al. |
| 2011/0242508 A1 | 10/2011 | Kobayashi |
| 2011/0244680 A1 | 10/2011 | Tohnoe et al. |
| 2011/0266252 A1 | 11/2011 | Thadani et al. |
| 2011/0292356 A1* | 12/2011 | Tsukinoki ......... H01L 21/67778 355/27 |
| 2012/0024388 A1 | 2/2012 | Burrows et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0118225 A1 | 5/2012 | Hsu et al. |
| 2012/0126358 A1 | 5/2012 | Arnold et al. |
| 2012/0161405 A1 | 6/2012 | Mohn et al. |
| 2012/0183689 A1 | 7/2012 | Suzuki et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0023124 A1 | 1/2013 | Nemani et al. |
| 2013/0129995 A1 | 5/2013 | Ouattara et al. |
| 2013/0157177 A1 | 6/2013 | Yu et al. |
| 2013/0164691 A1 | 6/2013 | Shiobara |
| 2013/0177847 A1 | 7/2013 | Chatterjee et al. |
| 2013/0183609 A1 | 7/2013 | Seon et al. |
| 2013/0224652 A1 | 8/2013 | Bass et al. |
| 2013/0273733 A1 | 10/2013 | Tang et al. |
| 2013/0299089 A1 | 11/2013 | Kim et al. |
| 2013/0319466 A1 | 12/2013 | Mizoguchi et al. |
| 2013/0330928 A1* | 12/2013 | Ishikawa ............ H01L 21/6715 118/728 |
| 2013/0330932 A1 | 12/2013 | Rangarajan et al. |
| 2014/0014745 A1 | 1/2014 | Burrows et al. |
| 2014/0120688 A1 | 5/2014 | Booth, Jr. et al. |
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0193580 A1 | 7/2014 | Tiron et al. |
| 2014/0209015 A1 | 7/2014 | Yamada et al. |
| 2014/0220489 A1 | 8/2014 | Kozuma et al. |
| 2014/0239462 A1 | 8/2014 | Shamma et al. |
| 2014/0255844 A1 | 9/2014 | Iwao et al. |
| 2014/0261568 A1 | 9/2014 | Delgado et al. |
| 2014/0263172 A1 | 9/2014 | Xie et al. |
| 2014/0263177 A1 | 9/2014 | Povolny et al. |
| 2014/0268082 A1 | 9/2014 | Michaelson et al. |
| 2014/0272726 A1 | 9/2014 | Chang |
| 2015/0020848 A1* | 1/2015 | Kim ................. H01L 21/67028 156/345.47 |
| 2015/0041809 A1 | 2/2015 | Arnold et al. |
| 2015/0056542 A1 | 2/2015 | Meyers et al. |
| 2015/0077733 A1 | 3/2015 | Huang et al. |
| 2015/0079393 A1 | 3/2015 | Freedman et al. |
| 2015/0096494 A1 | 4/2015 | Nishiura et al. |
| 2015/0096683 A1 | 4/2015 | Deshmukh et al. |
| 2015/0125679 A1 | 5/2015 | Ishikawa |
| 2015/0132965 A1 | 5/2015 | Devilliers et al. |
| 2015/0152551 A1 | 6/2015 | Yamaguchi et al. |
| 2015/0170957 A1 | 6/2015 | Tsao |
| 2015/0170977 A1 | 6/2015 | Singh |
| 2015/0194343 A1 | 7/2015 | Chi et al. |
| 2015/0217330 A1 | 8/2015 | Haukka et al. |
| 2015/0218695 A1 | 8/2015 | Odedra |
| 2015/0221519 A1 | 8/2015 | Marks et al. |
| 2015/0243520 A1 | 8/2015 | Park et al. |
| 2015/0270148 A1 | 9/2015 | Shinoda et al. |
| 2015/0303064 A1 | 10/2015 | Singer et al. |
| 2015/0332922 A1 | 11/2015 | Chien et al. |
| 2015/0355549 A1 | 12/2015 | Xie et al. |
| 2016/0011505 A1 | 1/2016 | Stowers et al. |
| 2016/0011516 A1 | 1/2016 | DeVilliers |
| 2016/0021660 A1 | 1/2016 | Krishnamurthy |
| 2016/0035631 A1 | 2/2016 | Lee et al. |
| 2016/0041471 A1 | 2/2016 | Briend et al. |
| 2016/0086864 A1 | 3/2016 | Fischer et al. |
| 2016/0116839 A1 | 4/2016 | Meyers et al. |
| 2016/0118246 A1 | 4/2016 | Kang et al. |
| 2016/0126106 A1 | 5/2016 | Shimizu et al. |
| 2016/0135274 A1 | 5/2016 | Fischer et al. |
| 2016/0179005 A1 | 6/2016 | Shamma et al. |
| 2016/0216606 A1 | 7/2016 | Meyers et al. |
| 2016/0284559 A1 | 9/2016 | Kikuchi et al. |
| 2016/0293405 A1 | 10/2016 | Matsumoto et al. |
| 2016/0307786 A1 | 10/2016 | Evans et al. |
| 2016/0314964 A1 | 10/2016 | Tang et al. |
| 2016/0343544 A1 | 11/2016 | Watanabe et al. |
| 2016/0357103 A1 | 12/2016 | Nagahara et al. |
| 2016/0357107 A1* | 12/2016 | Buchberger, Jr. ... G03F 7/70866 |
| 2016/0365248 A1 | 12/2016 | Mebarki et al. |
| 2016/0379824 A1 | 12/2016 | Wise et al. |
| 2017/0004974 A1 | 1/2017 | Manna et al. |
| 2017/0010535 A1 | 1/2017 | Fujitani et al. |
| 2017/0066225 A1 | 3/2017 | Chen et al. |

(56) References Cited

U.S. PATENT DOCUMENTS

| | | |
|---|---|---|
| 2017/0069462 A1 | 3/2017 | Kanarik et al. |
| 2017/0102612 A1 | 4/2017 | Meyers et al. |
| 2017/0146909 A1* | 5/2017 | Smith ................... G03F 7/167 |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0184961 A1 | 6/2017 | Nakagawa et al. |
| 2017/0192357 A1 | 7/2017 | Carcasi et al. |
| 2017/0261850 A1 | 9/2017 | Stowers et al. |
| 2017/0316963 A1 | 11/2017 | Parkhe |
| 2017/0328775 A1 | 11/2017 | Aderhold |
| 2017/0330787 A1 | 11/2017 | Mitsunaga et al. |
| 2017/0342553 A1 | 11/2017 | Yu et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0061663 A1 | 3/2018 | Chandrashekar et al. |
| 2018/0093306 A1 | 4/2018 | Kang et al. |
| 2018/0096840 A1 | 4/2018 | Jeong et al. |
| 2018/0122648 A1 | 5/2018 | Kim et al. |
| 2018/0149976 A1 | 5/2018 | Liu et al. |
| 2018/0151350 A1 | 5/2018 | Li |
| 2018/0164689 A1 | 6/2018 | Sano et al. |
| 2018/0166278 A1 | 6/2018 | Belyansky et al. |
| 2018/0173096 A1 | 6/2018 | Zi et al. |
| 2018/0224744 A1 | 8/2018 | Bae et al. |
| 2018/0233362 A1* | 8/2018 | Glodde ............... G03F 7/70016 |
| 2018/0233398 A1 | 8/2018 | Van Cleemput et al. |
| 2018/0261481 A1 | 9/2018 | Eto |
| 2018/0294155 A1 | 10/2018 | Soppera et al. |
| 2018/0307137 A1 | 10/2018 | Meyers et al. |
| 2018/0308687 A1* | 10/2018 | Smith ............... C23C 16/45525 |
| 2018/0314167 A1 | 11/2018 | Chang et al. |
| 2018/0323064 A1 | 11/2018 | Jung et al. |
| 2018/0323092 A1 | 11/2018 | Rao et al. |
| 2018/0330930 A1 | 11/2018 | Murakami et al. |
| 2018/0337046 A1 | 11/2018 | Shamma et al. |
| 2018/0337243 A1 | 11/2018 | Li et al. |
| 2018/0354804 A1 | 12/2018 | Venkatasubramanian et al. |
| 2018/0356731 A1 | 12/2018 | Tagawa |
| 2019/0027357 A1 | 1/2019 | Girard et al. |
| 2019/0041755 A1* | 2/2019 | Tanaka ............... H01L 21/67742 |
| 2019/0043731 A1 | 2/2019 | Bristol et al. |
| 2019/0051541 A1 | 2/2019 | Hill et al. |
| 2019/0055654 A1 | 2/2019 | George et al. |
| 2019/0086808 A1 | 3/2019 | Nakayama et al. |
| 2019/0088521 A1 | 3/2019 | Chua et al. |
| 2019/0094685 A1 | 3/2019 | Marks et al. |
| 2019/0129307 A1 | 5/2019 | Kwon et al. |
| 2019/0131130 A1 | 5/2019 | Smith et al. |
| 2019/0137870 A1 | 5/2019 | Meyers et al. |
| 2019/0153001 A1 | 5/2019 | Cardineau et al. |
| 2019/0163056 A1 | 5/2019 | Maes et al. |
| 2019/0163065 A1 | 5/2019 | Hatakeyama et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0311923 A1 | 10/2019 | Kim |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0382890 A1 | 12/2019 | Lerner et al. |
| 2019/0391486 A1 | 12/2019 | Jiang et al. |
| 2020/0041897 A1 | 2/2020 | Moon et al. |
| 2020/0050109 A1 | 2/2020 | Ho et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0133131 A1 | 4/2020 | Ouyang |
| 2020/0157683 A1 | 5/2020 | Kato et al. |
| 2020/0166845 A1 | 5/2020 | Berendsen et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0005425 A1 | 1/2021 | Yang et al. |
| 2021/0013034 A1* | 1/2021 | Wu .................. G03F 7/167 |
| 2021/0013037 A1 | 1/2021 | Sun et al. |
| 2021/0022212 A1 | 1/2021 | Cimino et al. |
| 2021/0041784 A1 | 2/2021 | Chen et al. |
| 2021/0249274 A1 | 8/2021 | Zhu et al. |
| 2021/0271170 A1 | 9/2021 | Telecky et al. |
| 2021/0302833 A1 | 9/2021 | Weng et al. |
| 2021/0305040 A1 | 9/2021 | Kuo et al. |
| 2021/0391166 A1 | 12/2021 | Zhu et al. |
| 2021/0397085 A1 | 12/2021 | Weidman et al. |
| 2022/0002882 A1 | 1/2022 | Kalutarage et al. |
| 2022/0020584 A1 | 1/2022 | Volosskiy et al. |
| 2022/0035247 A1 | 2/2022 | Tan et al. |
| 2022/0043334 A1 | 2/2022 | Tan et al. |
| 2022/0075260 A1 | 3/2022 | Marks et al. |
| 2022/0122846 A1 | 4/2022 | Shamma et al. |
| 2022/0157617 A1 | 5/2022 | Zhou et al. |
| 2022/0179328 A1 | 6/2022 | Xia et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0356585 A1 | 11/2022 | Mui et al. |
| 2022/0365434 A1 | 11/2022 | Nardi et al. |
| 2023/0031955 A1 | 2/2023 | Yu et al. |
| 2023/0045336 A1* | 2/2023 | Yu ................... G03F 7/36 |
| 2023/0107357 A1 | 4/2023 | Dictus et al. |
| 2023/0131233 A1 | 4/2023 | Lavdovsky et al. |
| 2023/0152701 A1 | 5/2023 | Kanakasabapathy |
| 2023/0230811 A1 | 7/2023 | Yu et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0268189 A1 | 8/2023 | Musselwhite et al. |
| 2023/0273516 A1 | 8/2023 | Marks et al. |
| 2023/0288798 A1 | 9/2023 | Hansen et al. |
| 2023/0314946 A1 | 10/2023 | Hansen et al. |
| 2023/0314954 A1 | 10/2023 | Peter et al. |
| 2023/0416606 A1 | 12/2023 | Dictus et al. |
| 2024/0036483 A1 | 2/2024 | Dictus et al. |
| 2024/0134274 A1 | 4/2024 | Weidman et al. |
| 2024/0145272 A1 | 5/2024 | Yu et al. |
| 2024/0192590 A1 | 6/2024 | Kanakasabapathy et al. |
| 2024/0231224 A9 | 7/2024 | Weidman et al. |
| 2024/0329538 A1 | 10/2024 | Li et al. |
| 2024/0355650 A1 | 10/2024 | Kanakasabapathy et al. |
| 2024/0361696 A1 | 10/2024 | Tan et al. |

FOREIGN PATENT DOCUMENTS

| | | |
|---|---|---|
| CN | 102027577 A | 4/2011 |
| CN | 102610516 A | 7/2012 |
| CN | 103119695 A | 5/2013 |
| CN | 103243310 A | 8/2013 |
| CN | 105047541 A | 11/2015 |
| CN | 105579906 A | 5/2016 |
| CN | 105719949 A | 6/2016 |
| CN | 105990113 A | 10/2016 |
| CN | 106558477 A | 4/2017 |

(56) References Cited

FOREIGN PATENT DOCUMENTS

| | | |
|---|---|---|
| CN | 106876251 A | 6/2017 |
| CN | 107153326 A | 9/2017 |
| CN | 108351594 A | 7/2018 |
| CN | 108388079 A | 8/2018 |
| CN | 108780739 A | 11/2018 |
| CN | 109521657 A | 3/2019 |
| CN | 109976097 A | 7/2019 |
| CN | 111258190 A | 6/2020 |
| EP | 0197286 A2 | 10/1986 |
| EP | 0197286 B1 | 9/1991 |
| EP | 0465064 A2 | 1/1992 |
| EP | 1123423 B1 | 8/2007 |
| EP | 2608247 A1 | 6/2013 |
| EP | 3230294 A1 | 10/2017 |
| EP | 3258317 A1 | 12/2017 |
| EP | 3451059 A1 | 3/2019 |
| JP | S5119974 A | 2/1976 |
| JP | S57205736 A | 12/1982 |
| JP | S58108744 A | 6/1983 |
| JP | S6112653 U | 1/1986 |
| JP | S61234035 A | 10/1986 |
| JP | S6347364 A | 2/1988 |
| JP | H04226462 A | 8/1992 |
| JP | H0637050 A | 2/1994 |
| JP | H06169021 A | 6/1994 |
| JP | H06232041 A | 8/1994 |
| JP | H07106224 A | 4/1995 |
| JP | H07161607 A | 6/1995 |
| JP | H0869959 A | 3/1996 |
| JP | H08316237 A | 11/1996 |
| JP | H08339950 A | 12/1996 |
| JP | H1041206 A | 2/1998 |
| JP | H10209133 A | 8/1998 |
| JP | 2000305273 A | 11/2000 |
| JP | 2000347413 A | 12/2000 |
| JP | 2000347421 A | 12/2000 |
| JP | 2000356857 A | 12/2000 |
| JP | 2001089860 A | 4/2001 |
| JP | 2001308019 A | 11/2001 |
| JP | 2002030445 A | 1/2002 |
| JP | 2002100558 A | 4/2002 |
| JP | 2002118096 A | 4/2002 |
| JP | 2003131364 A | 5/2003 |
| JP | 2003213001 A | 7/2003 |
| JP | 2003280155 A | 10/2003 |
| JP | 2003532303 A | 10/2003 |
| JP | 2004006798 A | 1/2004 |
| JP | 2004513515 A | 4/2004 |
| JP | 2004247678 A | 9/2004 |
| JP | 2004259786 A | 9/2004 |
| JP | 2005504146 A | 2/2005 |
| JP | 2005123651 A | 5/2005 |
| JP | 2005260015 A | 9/2005 |
| JP | 2006253282 A | 9/2006 |
| JP | 2006310681 A | 11/2006 |
| JP | 2007027617 A | 2/2007 |
| JP | 2007114255 A | 5/2007 |
| JP | 2008091215 A | 4/2008 |
| JP | 2009192350 A | 8/2009 |
| JP | 2009212404 A | 9/2009 |
| JP | 2010016083 A | 1/2010 |
| JP | 2010016314 A | 1/2010 |
| JP | 2010500762 A | 1/2010 |
| JP | 2010034491 A | 2/2010 |
| JP | 2010067979 A | 3/2010 |
| JP | 2010123732 A | 6/2010 |
| JP | 2010531931 A | 9/2010 |
| JP | 2010239087 A | 10/2010 |
| JP | 2011520242 A | 7/2011 |
| JP | 2011526082 A | 9/2011 |
| JP | 2011529126 A | 12/2011 |
| JP | 2012074738 A | 4/2012 |
| JP | 2012142481 A | 7/2012 |
| JP | 2012173315 A | 9/2012 |
| JP | 2012185485 A | 9/2012 |
| JP | 5055743 B2 | 10/2012 |
| JP | 2012191242 A | 10/2012 |
| JP | 2013033291 A | 2/2013 |
| JP | 2013047848 A | 3/2013 |
| JP | 2013096011 A | 5/2013 |
| JP | 2013526061 A | 6/2013 |
| JP | 2013145874 A | 7/2013 |
| JP | 2013151627 A | 8/2013 |
| JP | 2014504004 A | 2/2014 |
| JP | 2014512458 A | 5/2014 |
| JP | 5544914 B2 | 7/2014 |
| JP | 2014146767 A | 8/2014 |
| JP | 2014521111 A | 8/2014 |
| JP | 2014159625 A | 9/2014 |
| JP | 2015012198 A | 1/2015 |
| JP | 2015504604 A | 2/2015 |
| JP | 5705103 B2 | 4/2015 |
| JP | 2015513540 A | 5/2015 |
| JP | 2015105405 A | 6/2015 |
| JP | 2015201622 A | 11/2015 |
| JP | 2016037656 A | 3/2016 |
| JP | 2016072557 A | 5/2016 |
| JP | 2016517633 A | 6/2016 |
| JP | 2016131238 A | 7/2016 |
| JP | 2016208027 A | 12/2016 |
| JP | 2017014602 A | 1/2017 |
| JP | 2017500448 A | 1/2017 |
| JP | 2017045869 A | 3/2017 |
| JP | 2017108053 A | 6/2017 |
| JP | 2017116923 A | 6/2017 |
| JP | 2017208374 A | 11/2017 |
| JP | 2017228596 A | 12/2017 |
| JP | 2018006742 A | 1/2018 |
| JP | 2018502173 A | 1/2018 |
| JP | 2018017780 A | 2/2018 |
| JP | 2018025686 A | 2/2018 |
| JP | 2018098229 A | 6/2018 |
| JP | 2018518688 A | 7/2018 |
| JP | 2018164076 A | 10/2018 |
| JP | 2018200930 A | 12/2018 |
| JP | 2019500490 A | 1/2019 |
| JP | 2019024129 A | 2/2019 |
| JP | 2019506730 A | 3/2019 |
| JP | 2019053305 A | 4/2019 |
| JP | 2019056730 A | 4/2019 |
| JP | 2019095794 A | 6/2019 |
| JP | 2019135755 A | 8/2019 |
| JP | 2019192814 A | 10/2019 |
| JP | 2021523403 A | 9/2021 |
| KR | 890015374 A | 10/1989 |
| KR | 900001238 B1 | 3/1990 |
| KR | 950001406 A | 1/1995 |
| KR | 960000375 B1 | 1/1996 |
| KR | 19990029141 A | 4/1999 |
| KR | 20000073111 A | 12/2000 |
| KR | 20020000292 A | 1/2002 |
| KR | 100398312 B1 | 9/2003 |
| KR | 20050112115 A | 11/2005 |
| KR | 100575847 B1 | 5/2006 |
| KR | 20070003657 A | 1/2007 |
| KR | 20080046577 A | 5/2008 |
| KR | 100841495 B1 | 6/2008 |
| KR | 20090042059 A | 4/2009 |
| KR | 20100015073 A | 2/2010 |
| KR | 20100090643 A | 8/2010 |
| KR | 20110007192 A | 1/2011 |
| KR | 20120040124 A | 4/2012 |
| KR | 20130007389 A | 1/2013 |
| KR | 20130093038 A | 8/2013 |
| KR | 20140064227 A | 5/2014 |
| KR | 101426105 B1 | 8/2014 |
| KR | 20140106442 A | 9/2014 |
| KR | 20140109816 A | 9/2014 |
| KR | 20150091260 A | 8/2015 |
| KR | 20150127145 A | 11/2015 |
| KR | 20160035995 A | 4/2016 |
| KR | 20170066218 A | 6/2017 |
| KR | 20170066225 A | 6/2017 |
| KR | 20180036263 A | 4/2018 |

(56) References Cited

FOREIGN PATENT DOCUMENTS

| | | |
|---|---|---|
| KR | 20180054917 A | 5/2018 |
| KR | 20180116438 A | 10/2018 |
| KR | 20190085654 A | 7/2019 |
| KR | 20190139594 A | 12/2019 |
| KR | 20190142242 A | 12/2019 |
| KR | 102078157 B1 | 2/2020 |
| KR | 20200144580 A | 12/2020 |
| KR | 20210142118 A | 11/2021 |
| TW | 200504864 A | 2/2005 |
| TW | 200903686 A | 1/2009 |
| TW | 200947117 A | 11/2009 |
| TW | 201005568 A | 2/2010 |
| TW | 201140230 A | 11/2011 |
| TW | 201145383 A | 12/2011 |
| TW | 201224190 A | 6/2012 |
| TW | I365354 B | 6/2012 |
| TW | 201241555 A | 10/2012 |
| TW | 201245918 A | 11/2012 |
| TW | 201246273 A | 11/2012 |
| TW | 201327057 A | 7/2013 |
| TW | 201330093 A | 7/2013 |
| TW | 201430164 A | 8/2014 |
| TW | 201501179 A | 1/2015 |
| TW | I494689 B | 8/2015 |
| TW | 201631377 A | 9/2016 |
| TW | 201729006 A | 8/2017 |
| TW | 201734025 A | 10/2017 |
| TW | 201734667 A | 10/2017 |
| TW | 201811876 A | 4/2018 |
| TW | 201830472 A | 8/2018 |
| TW | 201837066 A | 10/2018 |
| TW | 201930323 A | 8/2019 |
| TW | 201931011 A | 8/2019 |
| TW | 202001407 A | 1/2020 |
| TW | 202006168 A | 2/2020 |
| WO | WO-03029015 A2 | 4/2003 |
| WO | WO-03080892 A1 | 10/2003 |
| WO | WO-2004001840 A1 | 12/2003 |
| WO | WO-2004007797 A1 | 1/2004 |
| WO | WO-2004095551 A1 | 11/2004 |
| WO | WO-2007058120 A1 | 5/2007 |
| WO | WO-2007123539 A1 | 11/2007 |
| WO | WO-2008019362 A2 | 2/2008 |
| WO | WO-2008088076 A1 | 7/2008 |
| WO | WO-2011081151 A1 | 7/2011 |
| WO | WO-2011137059 A2 | 11/2011 |
| WO | WO-2012075249 A1 | 6/2012 |
| WO | WO-2012048094 A3 | 7/2012 |
| WO | WO-2013007442 A1 | 1/2013 |
| WO | WO-2013078211 A1 | 5/2013 |
| WO | WO-2013128313 A1 | 9/2013 |
| WO | WO-2013146595 A1 | 10/2013 |
| WO | WO-2014152023 A1 | 9/2014 |
| WO | WO-2015088613 A1 | 6/2015 |
| WO | WO-2016065120 A1 | 4/2016 |
| WO | WO-2016144960 A1 | 9/2016 |
| WO | WO-2017066319 A2 | 4/2017 |
| WO | WO-2017109040 A1 | 6/2017 |
| WO | WO-2017153725 A1 | 9/2017 |
| WO | WO-2017198418 A1 | 11/2017 |
| WO | WO-2018004551 A1 | 1/2018 |
| WO | WO-2018004646 A1 | 1/2018 |
| WO | WO-2018061670 A1 | 4/2018 |
| WO | WO-2018173446 A1 | 9/2018 |
| WO | WO-2018180663 A1 | 10/2018 |
| WO | WO-2019023797 A1 | 2/2019 |
| WO | WO-2019163455 A1 | 8/2019 |
| WO | WO-2019217749 A1 | 11/2019 |
| WO | WO-2019222320 A1 | 11/2019 |
| WO | WO-2019230462 A1 | 12/2019 |
| WO | WO-2019241402 A1 | 12/2019 |
| WO | WO-2020014179 A1 | 1/2020 |
| WO | WO-2020030855 A2 | 2/2020 |
| WO | WO-2020033602 A1 | 2/2020 |
| WO | WO-2020050035 A1 | 3/2020 |
| WO | WO-2020102085 A1 | 5/2020 |
| WO | WO-2020132281 A1 | 6/2020 |
| WO | WO-2020190941 A1 | 9/2020 |
| WO | WO-2020223011 A1 | 11/2020 |
| WO | WO-2020223152 A1 | 11/2020 |
| WO | WO-2020263750 A1 | 12/2020 |
| WO | WO-2020264158 A1 | 12/2020 |
| WO | WO-2020264557 A1 | 12/2020 |
| WO | WO-2020264571 A1 | 12/2020 |
| WO | WO-2021067632 A2 | 4/2021 |
| WO | WO-2021072042 A1 | 4/2021 |
| WO | WO-2021146138 A1 | 7/2021 |
| WO | WO-2021202171 A1 | 10/2021 |
| WO | WO-2021202681 A1 | 10/2021 |
| WO | WO-2021262371 A1 | 12/2021 |
| WO | WO-2021262529 A1 | 12/2021 |
| WO | WO-2022103764 A1 | 5/2022 |

OTHER PUBLICATIONS

Cardineau, B et al., "EUV Resists Based on Tin-oxo Clusters", Advances in Patterning Materials and Processes XXXI, Proceedings of Spie, Apr. 4, 2014, vol. 9051, pp. 335-346.

Chinese First Office Action dated May 24, 2017 issued in Application No. CN 201510053668.7.

Chinese Second Office Action dated Feb. 28, 2018 issued in Application No. CN 201510053668.7.

CN Office Action dated Jun. 8, 2022 in Application No. CN202180002531.2 With English Translation.

CN Office Action dated Nov. 16, 2022, in Application No. CN202180002531.2 with English translation.

CN Office Action dated Nov. 18, 2022, in Application No. CN201810783756.6 with English translation.

Coons et al., (2010) "Comparison of EUV spectral and ion emission features from laser-produced Sn and Li plasmas," Extreme Ultraviolet (EUV) Lithography, Proc. of SPIE, 7636:763636-1 to 763636-7.

Danilo D.E., et al., "Metal Containing Resist Readiness for HVM EUV Lithography", Journal of Photopolymer Science and Technology, 2016, vol. 29(3), pp. 501-507.

European Search Report dated Feb. 15, 2022, in Application No. EP21741104.

European Office Action dated Feb. 25, 2022 in Application No. 21741104.

Extended European Search Report dated Dec. 23, 2021, in Application No. EP19800353.5.

Fan, Y et al., (2016) "Benchmarking Study of EUV Resists for NXE:3300B," Proc. of Spie, 9776:97760W-1 to 97760W-11 [Downloaded From http://proceedings.spiedigitallibrary.org/ on Mar. 30, 2017].

Fujifilm Corp., (Presentation) "Negative tone development process for double patterning," 5th International Symposium on Immersion Lithography, Sep. 2008, Presentation Slides No. P-1-P-27.

Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.

Gangnaik, A.S. et al., (Jan. 12, 2017) "New Generation Electron Beam Resists: A Review," Chem. Mater., 29:1898-1917.

Gerritsen et al., (Apr. 1, 1986) "Laser-generated plasma as soft x-ray source," J. Appl. Phys., 59(7):2337-2344.

Gross, R.A. et al., "Biodegradable Polymers for the Environment", Science, Aug. 2, 2002, vol. 297, No. 5582, pp. 803-807.

Hamley, I.W., "Nanostructure fabrication using block copolymers", Nanotechnology. Sep. 2003. 17;14(10):R39-R54.

Harrisson, S. et al., "RAFT Polymerization of Vinyl Esters: Synthesis and Applications", Polymers, 2014, vol. 6, No. 5, pp. 1437-1488.

Hench, L.L. and West, J.K., "The sol-gel process," Chemical reviews, Jan. 1, 1990; 90(1) pp. 33-72.

International Preliminary Report on Patentability dated Oct. 13, 2022, in PCT Application No. PCT/US2021/023493.

(56) References Cited

OTHER PUBLICATIONS

International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Sep. 9, 2022, in PCT Application No. PCT/US2021/019245.
International Preliminary Report on Patentability dated Sep. 30, 2021 issued in Application No. PCT/US2020/023146.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Aug. 8, 2018 issued in Application No. PCT/US2018/028192.
International Search Report and Written Opinion dated Jan. 27, 2021 issued in Application No. PCT/US2020/054730.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Mar. 23, 2021 issued in Application No. PCT/US2020/053856.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 16, 2018 issued in Application No. PCT/US2018/032783.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Joo, W et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated Jan. 17, 2023, in Application No. JP2022-552422 with English translation.
JP Office Action dated Jun. 14, 2022, in Application No. JP20190563508 with English translation.
JP Office Action dated Jun. 28, 2022 in Application No. JP2021560945 with English translation.
Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
Korean Decision for Grant dated Sep. 2, 2021 issued in Application No. KR 10-2015-0015184.
Korean First Office Action dated Dec. 22, 2020 issued in Application No. KR 10-2015-0015184.

(56) References Cited

OTHER PUBLICATIONS

Korean Second Office Action dated Jul. 27, 2021 issued in Application No. KR 10-2015-0015184.
KR Office Action dated Feb. 8, 2022, in Application No. KR10-2021-7030794 with English Translation.
KR Office Action dated May 9, 2022, in Application No. KR1020217030794 with English translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
McGinniss, Vincent D., (1978) "Light Sources," Edited by: Pappas, S. Peter, UV Curing: Science and Technology; technology marketing corporation, 642 Westover Rd., Stamford, Ct, USA; pp. 96-129.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, p. 18326-18378.
Molloy, K. C., "Precursors for the Formation of Tin (IV) Oxide and Related Materials", Journal of Chemical Research, 2008, vol. 2008, No. 10, pp. 549-554.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Stulen, et al., "Extreme Ultraviolet Lithography" IEEE Journal of Quantum Electronics, vol. 35, No. 5, May 1999, pp. 694-699.
Sundberg, P. et al., "Organic and Inorganic-organic Thin Film Structures by Molecular Layer Deposition: A Review", Beilstein Journal of Nanotechnology, 2014, vol. 5, pp. 1104-1136.
Taiwanese First Office Action dated Aug. 10, 2020 issued in Application No. TW 105137362.
Taiwanese First Office Action dated May 31, 2018 issued in Application No. TW 104103153.
Taiwanese Office Action dated Apr. 10, 2023 in TW Application No. TW108140940 with English translation.
Taiwanese Second Office Action dated Nov. 18, 2020 issued in Application No. TW 105137362.
TW Office Action dated Jan. 9, 2023 In Application No. TW20190116155 with English translation.
TW Office Action dated Sep. 5, 2022, in Application No. TW110101388 with English translation.
TW Office Action dated Sep. 8, 2022 in Application No. TW111123386 with English translation.
TW First Office Action dated Oct. 6, 2021, in application No. TW20180116415 with English translation.
TW Office Action dated Apr. 29, 2022 in Application No. TW110118172 with English translation.
TW Office Action dated Jan. 13, 2023, in Application No. TW110124741 with English translation.
TW Office Action dated Jan. 19, 2023 in Application No. TW110141961 with English translation.
TW Office Action dated Jun. 3, 2022, in Application No. TW110143913 with English translation.
TW Office Action dated Mar. 7, 2022, in Application No. TW110101388 with English translation.
US Final Office Action, dated Feb. 5, 2019 issued in U.S. Appl. No. 15/495,701.
US Final Office Action, dated May 11, 2017, issued in U.S. Appl. No. 14/610,038.
US Final Office Action, dated Sep. 10, 2018, issued in U.S. Appl. No. 15/691,659.
U.S. Non-Final office Action dated Feb. 7, 2023 in U.S. Appl. No. 17/455,185.
US Notice of Allowance, dated Apr. 25, 2018 issued in U.S. Appl. No. 14/948,109.
US Notice of Allowance, dated Aug. 22, 2017, issued in U.S. Appl. No. 14/610,038.
U.S. Notice of Allowance dated Feb. 22, 2022 in U.S. Appl. No. 17/310,635.
US Notice of Allowance, dated Jul. 28, 2020, issued in U.S. Appl. No. 16/206,959.
US Notice of Allowance, dated Jun. 10, 2020 issued in U.S. Appl. No. 15/979,340.
US Notice of Allowance dated Sep. 15, 2021 issued in U.S. Appl. No. 16/691,508.
US Notice of Allowance, dated Sep. 19, 2019, issued in U.S. Appl. No. 15/691,659.
US Notice of Allowance, dated Sep. 30, 2021 issued in U.S. Appl. No. 17/008,095.
US Notice of Allowance dated Sep. 9, 2021, issued in U.S. Appl. No. 16/691,508.
US Office Action, dated Apr. 9, 2019, issued in U.S. Appl. No. 15/691,659.
US Office Action, dated Aug. 9, 2018 issued in U.S. Appl. No. 15/495,701.
US Office Action, dated Jan. 23, 2017, issued in U.S. Appl. No. 14/610,038.
US Office Action, dated Mar. 18, 2021 issued in U.S. Appl. No. 17/008,095.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.
US Office Action, dated Nov. 6, 2019 issued in U.S. Appl. No. 15/979,340.
U.S. Appl. No. 17/758, 125, Inventors Yu et al., filed Jun. 28, 2022.
U.S. Appl. No. 17/759,281, inventors Dictus et al., filed Jul. 21, 2022.
U.S. Appl. No. 17/759,896, inventors Nagabhirava et al., filed Aug. 1, 2022.
U.S. Appl. No. 17/905,632, inventor Kanakasabapathy., filed Sep. 2, 2022.
U.S. Appl. No. 17/905,754, inventors Kanakasabapathy et al., filed Sep. 6, 2022.
U.S. Appl. No. 17/998,354, inventors Yu et al., filed Nov. 9, 2022.

(56) References Cited

OTHER PUBLICATIONS

U.S. Appl. No. 18/005,169, inventors Hansen et al., filed Jan. 11, 2023.
U.S. Appl. No. 18/005,328, inventors Hansen et al., filed Jan. 12, 2023.
U.S. Appl. No. 18/005,571 inventors Hansen et al., filed Jan. 13, 2023.
U.S. Appl. No. 18/005,594, inventors Hansen et al., filed Jan. 13, 2023.
U.S. Appl. No. 18/005,595, inventors Hansen et al., filed Jan. 13, 2023.
U.S. Appl. No. 18/011,707, inventors Peter et al., filed Dec. 20, 2022.
U.S. Appl. No. 18/297,989, inventors Marks et al., filed Apr. 10, 2023.
U.S. Appl. No. 18/298,003, inventors Marks et al., filed Apr. 10, 2023.
U.S. Restriction Requirement dated Nov. 14, 2022 in U.S. Appl. No. 17/455,185.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep- Ultraviolet Lithography" IEEE, (2012) pp. 288-290.
Xu, et al., "Underlayer designs to enhance the performance of EUV resists," Proceedings of SPIE, vol. 7273, 2009, pp. 727311-1-727311-11.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.
Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
Chiang C L., et al., "Secondary Electron Emission Characteristics of Oxide Electrodes in Flat Electron Emission Lamp," AIP Advances, 2016, vol. 6, 015317, 9 Pages.
CN Office Action dated Dec. 13, 2023 in CN Application No. 201810783756.6 with English translation.
CN Office Action dated Dec. 26, 2023 in CN Application No. 201980028279.5, with English Translation.
CN Office Action dated Jan. 3, 2024 in CN Application No. 202310318757.4 with English Translation.
CN Office Action dated Jan. 22, 2024 in CN Application No. 202080047683.X, with English Translation.
CN Office Action dated Jan. 23, 2024 in CN Application No. 202080046943.1 with English Translation.
CN Office Action dated Jun. 1, 2023, in application No. CN201810783756 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Dahuang, D., et al., Functional Thin Films and Their Deposition Preparation Techniques, Metallurgy Industrial Press, Jan. 31, 2013, pp. 450-454. [with English Translation].
EP Extended European Search Report dated Jul. 13, 2023, in Application No. EP20831843.6.
EP Extended European Search report dated Jun. 23, 2023, in Application No. EP20831420.3.
EP Extended European Search report dated Jun. 26, 2023, in Application No. 20831242.1.
EP Extended European Search Report dated Jun. 26, 2023, in Application No. 20831343.7.
EP Extended European Search report dated Jun. 28, 2023, in Application No. EP 20832501.9.
EP Extended European Search report dated Nov. 29, 2023 in EP Application No. 23173688.5.
EP Extended European Search report dated Oct. 25, 2023, in Application No. EP21837274.6.
EP Extended European Search report dated Sep. 25, 2023, in Application No. EP20870849.5.
EP Partial European Search Report dated Aug. 29, 2023, in Application No. 23173688.5.
Fitzgerald C B., et al., "Magnetism in Dilute Magnetic Oxide Thin Films Based on SnO2," The American Physical Society, 2006, vol. 74, 115307, 10 Pages.
International Search Report and Written Opinion dated Jul. 13, 2021, in PCT Application No. PCT/US2021/023901.
International Search Report and Written Opinion dated May 18, 2022, in International Application No. PCT/US2022/014984.
International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.
International Preliminary Report on Patentability dated Aug. 24, 2023, in PCT Application No. PCT/US2022/014984.
International Preliminary Report on Patentability dated Jun. 22, 2023, in Application No. PCT/US2021/061751.
International Preliminary Report on Patentability dated May 25, 2023, in Application No. PCT/US2021/058647.
International Preliminary Report on Patentability dated Oct. 13, 2022, in PCT Application No. PCT/US2021/023901.
International Preliminary Report on Patentability dated Sep. 7, 2023, in PCT Application No. PCT/US2022/014281.
International Search Report and Written Opinion dated Aug. 17, 2023, in Application No. PCT/US2023/019871.
International Search Report and Written Opinion dated Feb. 1, 2024 in PCT Application No. PCT/US2023/034545.
International Search Report and Written Opinion dated Jan. 10, 2024 in PCT Application No. PCT/US2023/033020.
International Search Report and Written Opinion dated Mar. 24, 2022, for International Application No. PCT/US2021/061751.
International Search Report and Written Opinion dated May 3, 2023, in Application No. PCT/US2023/060306.
International Search Report and Written Opinion dated May 16, 2022, In International Application No. PCT/US2022/014281.
International Search Report and Written Opinion dated Nov. 7, 2022 in PCT Application No. PCT/US2022/037393.
International Search Report and Written Opinion dated Oct. 13, 2023 in PCT Application No. PCT/US2023/069419.
Jalife S., et al., "Noble Gas Endohedral Fullerenes," Chemical Science, 2020, vol. 11, pp. 6642-6652.
JP Office Action dated Apr. 11, 2023 in Application No. JP2021-176082 with English translation.
JP Office Action dated Apr. 27, 2023 in Application No. JP2021-575910 with English translation.
JP Office Action dated Dec. 26, 2023 in JP Application No. 20210576241, with English Translation.
JP Office Action dated Dec. 26, 2023 in JP Application No. 2021-526240, with English Translation.
JP Office Action dated Feb. 28, 2023 in Application No. JP2020-562160 with English translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Jun. 27, 2023, in Application No. JP2022-552422 with English translation.
JP Office Action dated Jun. 27, 2023, in application No. JP2023-63868 with English translation.
JP Office Action dated Nov. 14, 2023, in JP Application No. 2021-0575910 with English Translation.
JP Office Action dated Nov. 14, 2023 in JP Application No. 2022-559416, with English Translation.
JP Office Action dated Oct. 3, 2023 in Application No. JP2021-176082 with English Translation.
JP Office Action dated Oct. 10, 2023 in Application No. JP2022-552422 with English Translation.

(56) References Cited

OTHER PUBLICATIONS

JP Office Action dated Sep. 19, 2023 in Application No. JP2020-562160 with English translation.
Komen C V., et al., "Structure-Magnetic Property Relationship Intransition Metal (M=V,Cr, Mn, Fe, Co, Ni) Doped Sno2 Nanoparticles," Journal of Applied Physics, 2008, vol. 103, 5 Pages.
KR Office Action dated Aug. 11, 2023, in Application No. KR10-2023-7011840 with English translation.
KR Office Action dated Jan. 2, 2023 in Application No. KR10-2022-7027233 with English translation.
KR Office Action dated Nov. 21, 2023 in KR Application No. 10-2022-7002869 with English Translation.
KR Office Action dated Nov. 21, 2023 in KR Application No. 10-2022-7029421 with English Translation.
KR Office Action dated Sep. 28, 2022, in Application No. KR10-2022-7027233 with English translation.
Kvon V., et al., "Secondary Electron Emission of Tin and Tin-Lithium Under Low Energy Helium Plasma Exposure," Nuclear Materials and Energy, 2017, vol. 13, pp. 21-27.
Lin Y., et al., "A New Examination of Secondary Electron Yield Data," Surface and Interface Analysis, 2005, vol. 37, pp. 895-900.
Ogale S B., et al., "High Temperature Ferromagnetism with Giant Magnetic Moment in Transparent Co-doped SnO2-σ," Physical Review Letters, 2003, 17 Pages.
Pedersen A., et al., "Lithiation of Tin Oxide: A Computational Study," Integrated Systems Laboratory, 2014, 20 Pages.
Saunders M., et al., "Noble Gas Atoms Inside Fullerenes," Science, 1996, vol. 271, pp. 1693-1697.
Singh R ., "Unexpected Magnetism in Nanomaterials," Journal of Magnetism and Magnetic Materials, 2013, vol. 346, pp. 58-73.
Tian Y F., et al., "Oxide Magnetic Semiconductors: Materials, Properties, and Devices," Magnetism, Magnetic Materials, and Interdisciplinary Research, 2013, vol. 22(8), 2 Pages.
TW Office Action dated Aug. 17, 2023, in application No. TW110124741 with Translation [LAMRP573TW].
TW Office Action dated Dec. 20, 2023, in TW Application No. 109121579 with English Translation.
TW Office Action dated Jan. 2, 2024 in TW Application No. 109121639, with English Translation.
TW Office Action dated Jan. 11, 2024 in TW Application No. 108146890, with English Translation.
TW Office Action dated May 16, 2023, in Application No. TW20190146890 with English translation.
TW Office Action dated Oct. 13, 2023, in application No. TW109121680 with English Translation.
TW Office Action dated Oct. 30, 2023, in application No. TW108116155 with English Translation.
U.S. Corrected Notice of Allowance dated Jan. 31, 2024 in U.S. Appl. No. 17/309,247.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final Office Action dated Feb. 1, 2024 in U.S. Appl. No. 17/759,281.
U.S. Non-Final Office Action dated May 11, 2023, in U.S. Appl. No. 17/452,365.
U.S. Non-Final Office Action dated Nov. 6, 2023, in U.S. Appl. No. 17/309,587.
U.S. Non-Final Office Action dated Nov. 20, 2023 in U.S. Appl. No. 18/377,245.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Non-Final Office Action dated Oct. 26, 2023, in U.S. Appl. No. 17/596,928.
U.S. Non-Final Office Action dated Sep. 13, 2023, in U.S. Appl. No. 17/596,651.
U.S. Non-Final Office Action dated Sep. 28, 2023, in U.S. Appl. No. 15/733,598.
U.S. Notice of Allowance dated Aug. 21, 2023 in U.S. Appl. No. 17/452,365.
U.S. Notice of Allowance dated Dec. 4, 2023 in U.S. Appl. No. 17/452,365.
U.S. Notice of Allowance dated Oct. 18, 2023 in U.S. Appl. No. 17/309,247.
U.S. Appl. No. 18/264,391, inventors Kanakasabapathy S K, et al., filed Aug. 4, 2023.
U.S. Appl. No. 18/377,267, inventors Yu J, et al., filed Oct. 5, 2023.
U.S. Appl. No. 18/546,879, inventors Weidman T W, et al., filed Aug. 17, 2023.
U.S. Appl. No. 18/580,334, inventors Peter D, et al., filed Jan. 18, 2024.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Restriction Requirement dated Nov. 20, 2023 in U.S. Appl. No. 17/759,281.
U.S. Restriction requirement dated Sep. 7, 2023, in U.S. Appl. No. 17/309,587.
International Search Report and Written Opinion dated Oct. 28, 2021 in PCT Application No. PCT/US2021/040381.
JP Office Action dated Feb. 13, 2024 in JP Application No. 2023-63868, with English Translation.
TW Office Action dated Feb. 21, 2024 in TW Application No. 109121664 with English translation.
TW Office Action dated Feb. 29, 2024 in TW Application No. 109134377, with English Translation.
U.S. Final Office Action dated Feb. 27, 2024 in U.S. Appl. No. 18/298,003.
ALF, M.E., et al., "Chemical Vapor Deposition of Conformal, Functional, and Responsive Polymer Films," Advanced Materials, 2010, vol. 22(18), pp. 1993-2027.
CN Office Action dated Apr. 22, 2024 in CN Application No. 201980085227.1 with English translation.
CN Office Action dated Apr. 24, 2024 in CN Application No. 201980075389.7 with English translation.
CN Office Action dated Mar. 14, 2024 in CN Application No. 201810783756.6, with English Translation.
JP Office Action dated Apr. 2, 2024 in JP Application No. 2022-559416, with English Translation.
JP Office Action dated Apr. 30, 2024 in JP Application No. 2021-577241 with English translation.
JP Office Action dated Mar. 5, 2024 in JP Application No. 2021-575910, with English translation.
JP Office Action dated Mar. 22, 2024 in JP Application No. 2020-562160, with English Translation.
JP Office Action dated Mar. 26, 2024 in JP Application No. 2021-576240, with English Translation.
JP Office Action dated May 14, 2024 in JP Application No. 2021-576241 with English translation.
JP Office Action dated May 14, 2024 in JP Application No. 2021-576792 with English translation.
KR Office Action dated Apr. 5, 2024 in KR Application No. 10-2021-7036139, with English Translation.
KR Office Action dated Apr. 9, 2024 in KR Application No. 10-2023-7038357 with English Translation.
KR Office Action dated Apr. 23, 2024 in KR Application No. 10-2016-0152489 with English translation.
KR Office Action dated Feb. 29, 2024 in KR Application No. 10-2022-7026649, with English Translation.
KR Office Action dated Mar. 14, 2024 in KR Application No. 10-2021-7022858, with English Translation.
KR Office Action dated May 24, 2024 in KR Application No. 10-2020-7035732 with English translation.
SG Search Report and Written Opinion dated May 13, 2024 in SG Application No. 11202251864Y.

(56) References Cited

OTHER PUBLICATIONS

SG Written Opinion dated Apr. 16, 2024 in SG Application No. 11202114197Y.
Singapore Search Report and Written Opinion dated Mar. 17, 2023 issued in Application No. SG11202114197Y.
TW Office Action dated Apr. 19, 2024 in TW Application No. 112146727 with English translation.
TW Office Action dated Apr. 22, 2024 in TW Application No. 112126160 with English translation.
TW Office Action dated Mar. 11, 2024 in TW Application No. 109121649, with English Translation.
TW Office Action dated Mar. 21, 2024 in TW Application No. 108146890, with English Translation.
U.S. Advisory Action dated Apr. 16, 2024 in U.S. Appl. No. 17/596,648.
U.S. Advisory Action dated May 7, 2024 in U.S. Appl. No. 18/298,003.
U.S. Final Office Action dated Apr. 10, 2024 in U.S. Appl. No. 15/733,598.
U.S. Final Office Action dated Apr. 23, 2024 in U.S. Appl. No. 17/596,928.
U.S. Final Office Action dated Mar. 5, 2024 in U.S. Appl. No. 17/596,648.
U.S. Final Office Action dated Mar. 12, 2024 in U.S. Appl. No. 18/377,245.
U.S. Final Office Action dated Mar. 14, 2024 in U.S. Appl. No. 17/596,651.
U.S. Final Office Action dated May 3, 2024 in U.S. Appl. No. 18/297,989.
U.S. Final Office Action dated May 9, 2024 in U.S. Appl. No. 17/309,587.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Non-Final Office Action dated May 29, 2024 in U.S. Appl. No. 18/298,003.
U.S. Notice of Allowance dated Mar. 15, 2024 in U.S. Appl. No. 17/452,365.
U.S. Appl. No. 18/628,111, inventors Tan S.S, et al., filed Apr. 5, 2024.
U.S. Restriction Requirement dated Apr. 8, 2024 in U.S. Appl. No. 17/754,019.
CN Office Action dated Jul. 23, 2024 in CN Application No. 201810783756.6 with English translation.
International Preliminary Report on Patentability dated Oct. 13, 2022, in PCT Application No. PCT/US2021/023701.
International Search Report and Written Opinion dated Jul. 15, 2021, in PCT Application No. PCT/US2021/023701.
International Preliminary Report on Patentability and Written Opinion dated Dec. 28, 2023 in PCT Application No. PCT/US2022/033488.
International Preliminary Report on Patentability and Written Opinion dated Feb. 29, 2024 in PCT Application No. PCT/US2022/075035.
International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Preliminary Report on Patentability dated Aug. 3, 2023, in Application No. PCT/US2022/013407.
International Search Report and Written Opinion dated Dec. 5, 2022 in PCT Application No. PCT/US2022/075035.
International Search Report and Written Opinion dated Jul. 4, 2024 in PCT Application No. PCT/US2024/019555.
International Search Report and Written Opinion dated Jul. 24, 2023 in PCT Application No. PCT/US2023/016766.
International Search Report and Written Opinion dated Jul. 31, 2023, in Application No. PCT/US2023/016762.
International Search Report and Written Opinion dated May 9, 2022, in PCT Application No. PCT/US2022/013407.
International Search Report and Written Opinion dated Oct. 17, 2022 in PCT Application No. PCT/US2022/033488.
Kazunori, S et al., "Isotropic Atomic Level Etching of Tungsten Using Formation and Desorption of Tungsten Fluoride," Proceedings of SPIE, Mar. 2018, vol. 10589, 7 pages.
KR Notice of Allowances dated Jul. 8, 2024, in KR Application No. 10-2024-7006338 with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jun. 24, 2024 in KR Application No. 10-2022-7002869, with English Translation.
Mini O2 Oxygen Sensor 0-30% vol. 02, Euro-Gas Management Services LTD, Jan. 2017, https://euro-gasman.com/product/oxygen-02-ss-gas-sensor/.
"Optical Properties of Silicon"[exact date of publication unknown; summarizing data from papers published in 1995 and 2008], https://www.pveducation.org/pvcdrom/materials/optical-properties-of-silicon.
Pattison, P.M., et al., "LED lighting Efficacy: Status and Directions," Comptes Rendus Physique, vol. 19, Apr. 2018, pp. 134-145.
SG Search Report and Written Opinion dated Jul. 3, 2024 in SG Application No. 11202114196U.
TW Office Action dated Jul. 2, 2024 in TW Application No. 109134940 with English translation.
TW Office Action dated Jul. 9, 2024 in TW Application No. 110111086 with English translation.
TW Office Action dated Jun. 27, 2024 in TW Application No. 110103944, with English Translation.
TW Office Action dated Jun. 27, 2024 in TW Application No. 113107490 with English translation.
U.S. Advisory Action dated Jun. 10, 2024 in U.S. Appl. No. 17/596,651.
U.S. Advisory Action dated Jun. 24, 2024 in U.S. Appl. No. 18/377,245.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Non-Final Office Action dated Jul. 2, 2024 in U.S. Appl. No. 17/596,651.
U.S. Non-Final Office Action dated Jun. 21, 2024 in U.S. Appl. No. 17/596,648.
U.S. Appl. No. 17/995,032, inventors Nathan et al., filed Sep. 29, 2022.
U.S. Appl. No. 18/569,213, inventors Kanakasabapathy S K, et al., filed Dec. 11, 2023.
U.S. Appl. No. 18/684,643, inventor Kanakasabapathy S, filed Feb. 16, 2024.
U.S. Appl. No. 18/719,443, inventor Kenane N, et al., filed Jun. 13, 2024.
U.S. Appl. No. 18/700,238, inventor Li D, filed Apr. 10, 2024.
U.S. Appl. No. 18/719,815, inventor Wu C, et al., filed Jun. 13, 2024.
U.S. Appl. No. 18/769,038, inventors Tan S.S, et al., filed Jul. 10, 2024.
U.S. Appl. No. 18/769,048, inventors Tan S.S, et al., filed Jul. 10, 2024.
U.S. Restriction Requirement dated Jun. 21, 2024 in U.S. Appl. No. 17/596,858.
CN Office Action dated Aug. 31, 2024 in CN Application No. 201980028279.5 with English translation.
CN Office Action dated Sep. 23, 2024 in CN Application No. 202080046943.1 with English translation.
JP Notice of Allowances dated Aug. 27, 2024 in JP Application No. 2022-559416 with English translation.

(56) References Cited

OTHER PUBLICATIONS

JP Office Action dated Oct. 8, 2024 in JP Application No. 2020-562160 with English translation.
KR Notice of Allowance dated Aug. 1, 2024 in KR Application No. 10-2024-7012307, with English Translation.
KR Notice of Allowances dated Oct. 16, 2024 in KR Application No. 10-2022-7002869 with English Translation.
SG Written Opinion dated Aug. 30, 2024 in SG Application No. 11202114183P.
U.S. Advisory Action dated Sep. 5, 2024 in U.S. Appl. No. 17/759,281.
U.S. Corrected Notice of Allowance dated Aug. 29, 2024 in U.S. Appl. No. 17/596,648.
U.S. Non-Final Office Action dated Aug. 28, 2024 in U.S. Appl. No. 15/733,598.
U.S. Non-Final Office Action dated Oct. 1, 2024 in U.S. Appl. No. 17/309,587.
U.S. Non-Final Office Action dated Oct. 9, 2024 in U.S. Appl. No. 18/377,245.
U.S. Notice of Allowance dated Aug. 16, 2024 in U.S. Appl. No. 17/596,648.
U.S. Restriction requirement dated Aug. 30, 2024 in U.S. Appl. No. 18/700,238.
U.S. Restriction requirement dated Oct. 30, 2024 in U.S. Appl. No. 18/769,038.
U.S. Restriction requirement dated Oct. 30, 2024 in U.S. Appl. No. 18/769,048.
U.S. Advisory Action dated Sep. 3, 2024 in U.S. Appl. No. 18/377,267.
U.S. Appl. No. 18/850,628, inventors Li D, et al., filed Sep. 25, 2024.
U.S. Appl. No. 18/850,990, inventors Lee Y, et al., filed Sep. 25, 2024.
U.S. Appl. No. 18/855,026, inventors Lee Y, et al., filed Oct. 8, 2024.
CN Office Action dated Sep. 14, 2024 in CN Application No. 202310318757.4 with English translation.
JP Notice of Allowances dated Sep. 3, 2024 in JP Application No. 2023-63868 with English translation.

* cited by examiner

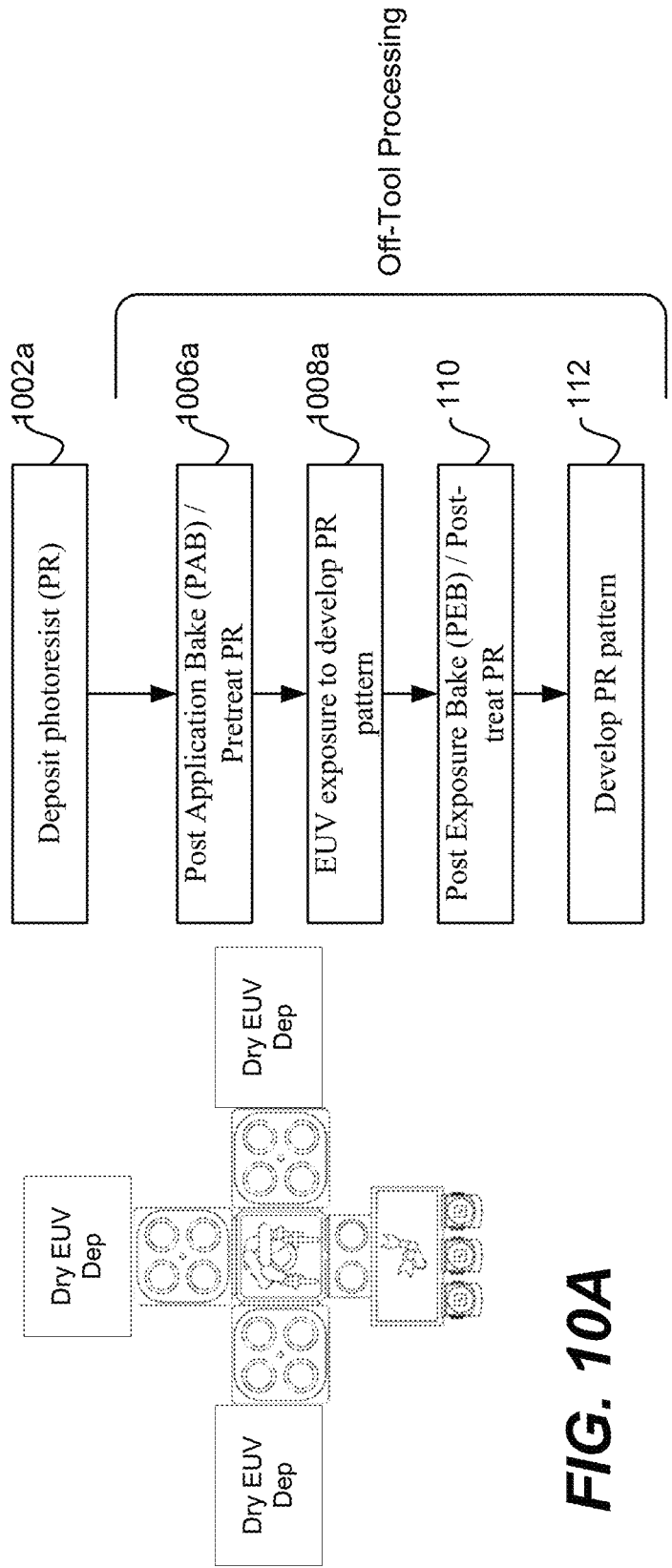

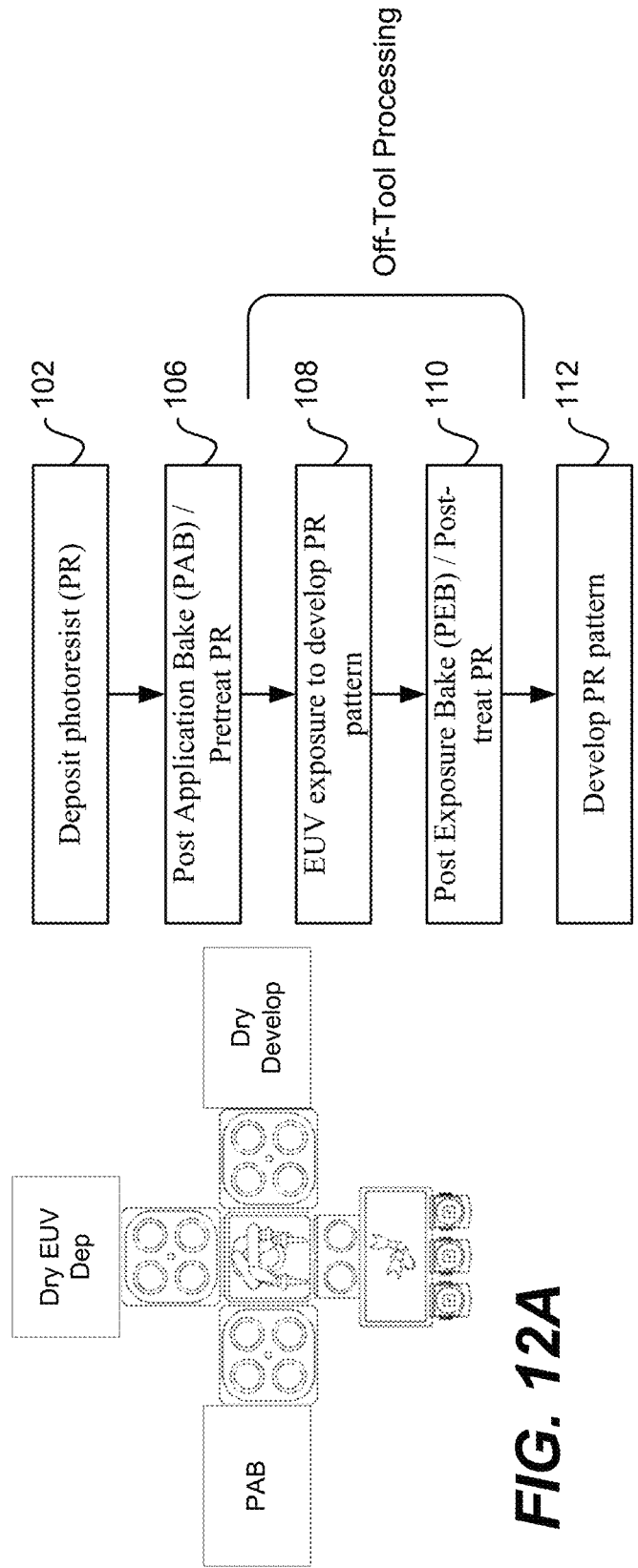

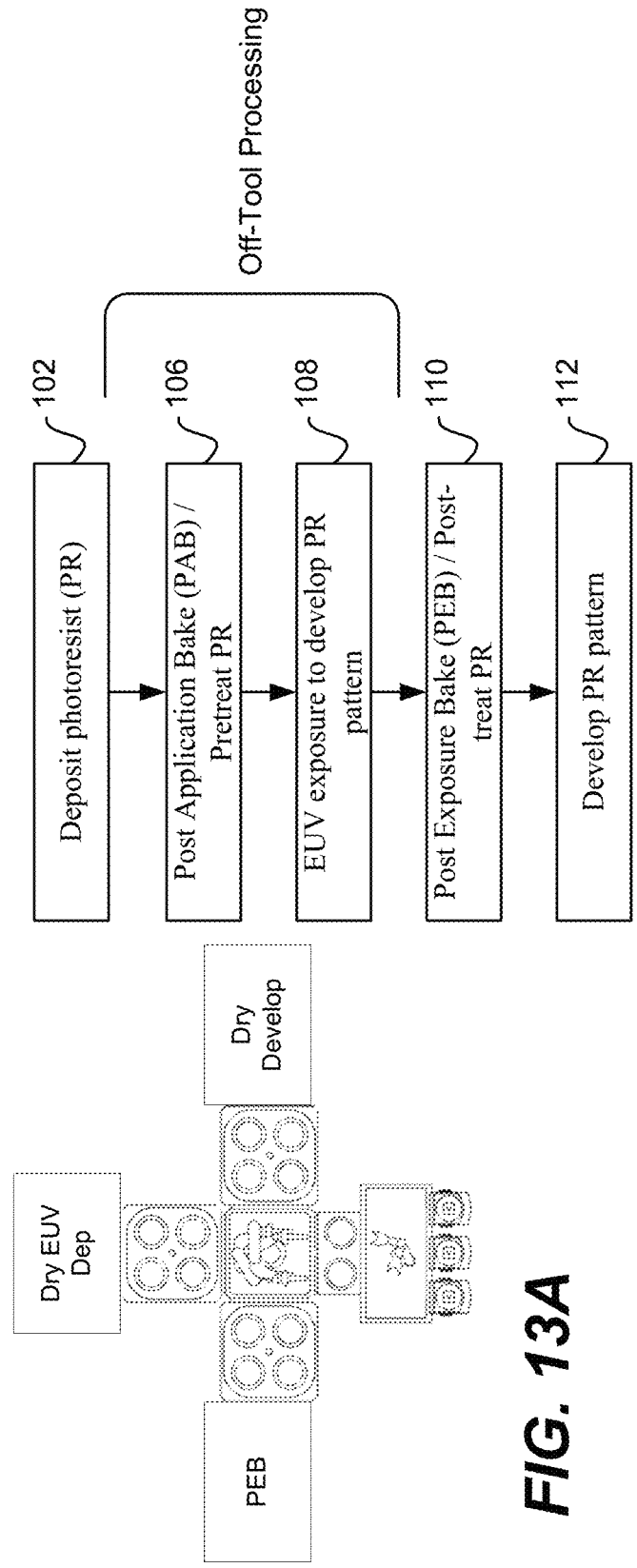

INTEGRATED DRY PROCESSES FOR PATTERNING RADIATION PHOTORESIST PATTERNING

INCORPORATED BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

The fabrication of semiconductor devices, such as integrated circuits, is a multi-step process involving photolithography. In general, the process includes the deposition of material on a wafer and patterning the material through lithographic techniques to form structural features (e.g., transistors and circuitry) of the semiconductor device. The steps of a typical photolithography process known in the art include: preparing the substrate; applying a photoresist, such as by spin coating; exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

SUMMARY

Disclosed herein are methods and systems of an integrated process for forming a patterned photoresist. In one aspect of the embodiments disclosed herein, an integrated lithography system is provided, the system including: a plurality of reaction chambers within a cluster, the plurality of reaction chambers including: a photoresist (PR) deposition chamber, a post-application bake (PAB) chamber, a post-exposure bake (PEB) chamber, and a development chamber; and a controller that includes one or more processors and one or more memory devices, where the one or more memory devices store computer-executable instructions for controlling the one or more processors to: receive a substrate in the PR deposition chamber, deposit a PR on a surface of the substrate within the PR deposition chamber, receive the substrate having the PR in the PAB chamber, treat the PR within the PAB chamber to modify material properties of the PR, after treating the PR, receive the substrate in the PEB chamber, where portions of the PR have been chemically altered by exposure to radiation to create a patterned PR, treat the patterned PR within the PEB chamber to modify material properties of the patterned PR, and dry developing the patterned PR within the development chamber by removing either an exposed portion or an unexposed portion of the patterned PR by a dry development process including exposure to a chemical compound to form a PR mask.

In some embodiments, the PR may be a metal-containing PR. In some embodiments, the PR may be an EUV PR. In some embodiments, the plurality of reaction chambers further includes a substrate clean chamber, and the computer-executable instructions further include instructions for controlling the one or more processors to, prior to the computer-executable instruction to receive the substrate having the PR in the PAB chamber: receive the substrate having the PR in the clean chamber and perform a dry clean process to remove PR from the bevel edge and/or backside of the substrate. In some embodiments, the plurality of reaction chambers further includes an underlayer deposition chamber, and the computer-executable instructions further include instructions for controlling the one or more processors to, prior to the computer-executable instruction to deposit a PR: deposit an underlayer on the surface of the substrate via a dry process, where the underlayer increases the adhesion of the PR to the substrate. In some embodiments, the underlayer deposition chamber may be the PR deposition chamber.

In some embodiments, the plurality of reaction chambers further includes a pre-treatment chamber, and the computer-executable instructions further include instructions for controlling the one or more processors to, prior to the computer-executable instruction to deposit a metal-containing PR:

treat the surface of the substrate via a dry process to cause more exposed hydroxyl groups on the surface of the substrate. In some embodiments, the plurality of reaction chambers are each below atmospheric pressure, and the PR may be under below-atmospheric pressure until after the dry development process. In some embodiments, the ambient environment of the substrate may be controlled to reduce exposure of the photoresist to moisture prior to dry developing the patterned PR. In some embodiments, the computer-executable instructions further include computer-executable instructions to deposit the PR via a dry process including mixing a vapor stream of an organometallic precursor with a vapor stream of a counter-reactant. In some embodiments, the processes performed by the plurality of reaction chambers are all dry processes. In some embodiments, the processes performed by the plurality of reaction chambers include wet and dry processes.

In some embodiments, the cluster includes multiple PR deposition chambers. In some embodiments, the PAB chamber and the PEB chamber are the same chamber. In some embodiments, the computer-executable instructions further include instructions for controlling the one or more processors to perform a dry clean process to remove PR from the bevel edge and/or backside of the substrate within the PAB chamber. In some embodiments, the plurality of reaction chambers further includes a lithography scanner, and the computer-executable instructions further include instructions for controlling the one or more processors to, prior to the computer-executable instruction to receive the substrate in the PEB chamber: receive the substrate in the lithography scanner and expose portions of the PR to radiation to create a patterned PR. In some embodiments, the plurality of substrate processing environments further includes a thermal treatment processing environment, and the one or more memory devices store further computer-executable instructions for controlling the one or more processors to: before and/or after portions of the metal-containing PR have been chemically altered by exposure to radiation to create a patterned PR, thermally treat the metal-containing PR within the thermal treatment processing environment.

In another aspect of the embodiments disclosed herein, an integrated substrate processing system is provided, the system including: a plurality of substrate processing environments, the plurality of substrate processing environments comprising a metal-containing photoresist (PR) deposition environment and one or more other separate integrated processing environments selected from the group consisting of: an additional metal-containing photoresist (PR) deposition environment; a metal-containing PR development environment, and a thermal treatment processing environment; and a controller that includes one or more processors and one or more memory devices, wherein the one or more memory devices store computer-executable instructions for controlling the one or more processors to: receive a substrate in the metal-containing PR deposition environment; deposit a metal-containing PR on a surface of the substrate within the metal-containing PR deposition environment; and conduct additional PR processing operations in the one or more other separate integrated processing environments.

In some implementations, the plurality of substrate processing environments further includes a PR dry development processing environment, and the one or more memory devices store further computer-executable instructions for controlling the one or more processors to: after portions of the metal-containing PR have been chemically altered by exposure to radiation to create a patterned PR, dry develop the patterned PR within the development environment by removing either an exposed portion or an unexposed portion of the patterned PR by a dry development process including exposure to a chemical compound to form a PR mask. In some implementations, the plurality of substrate processing environments further includes a scanner environment, and the one or more memory devices store further computer-executable instructions for controlling the one or more processors to: expose portions of the metal-containing PR to radiation within the scanner environment to chemically alter the exposed portions.

In some implementations, the plurality of substrate processing environments are different process chambers within a cluster. In some implementations, the plurality of substrate processing environments are different stations within a chamber. In some implementations, the plurality of substrate processing environments includes three metal-containing PR deposition environments. In some implementations, the plurality of substrate processing environments includes two metal-containing PR deposition environments and a metal-containing PR development environment, and the one or more memory devices store further computer-executable instructions for controlling the one or more processors to: after portions of the metal-containing PR have been chemically altered by exposure to radiation to create a patterned PR, develop the patterned PR via a dry process.

In some implementations, the plurality of substrate processing environments includes a metal-containing PR deposition environments, a thermal treatment processing environment, and a metal-containing PR development environment, and the one or more memory devices store further computer-executable instructions for controlling the one or more processors to: before and/or after portions of the metal-containing PR have been chemically altered by exposure to radiation to create a patterned PR, thermally treat the metal-containing PR within the thermal treatment processing environment and after thermally treating the metal-containing PR within the thermal treatment processing environment, developing the patterned PR via a dry process. In some implementations, the plurality of substrate processing environments includes a metal-containing PR deposition environments, a first thermal treatment processing environment, a second thermal treatment processing environment, and a metal-containing PR development environment, and the one or more memory devices store further computer-executable instructions for controlling the one or more processors to: before portions of the metal-containing PR have been chemically altered by exposure to radiation to create a patterned PR, thermally treat the metal-containing PR within the first thermal treatment processing environment, after portions of the metal-containing PR have been chemically altered by exposure to radiation to create a patterned PR, thermally treat the metal-containing PR within the second thermal treatment processing environment, and after thermally treating the metal-containing PR within the second thermal treatment processing environment, developing the patterned PR via a dry process.

These and other features of the disclosed embodiments will be described in detail below with reference to the associated drawings.

BRIEF DESCRIPTION OF DRAWINGS

FIGS. 10A-B present schematic diagrams of various process cluster configurations in accordance with disclosed embodiments.

FIGS. 12A-B present schematic diagrams of various process cluster configurations in accordance with disclosed embodiments.

FIGS. 13A-B present schematic diagrams of various process cluster configurations in accordance with disclosed embodiments.

DETAILED DESCRIPTION

Figure 1:
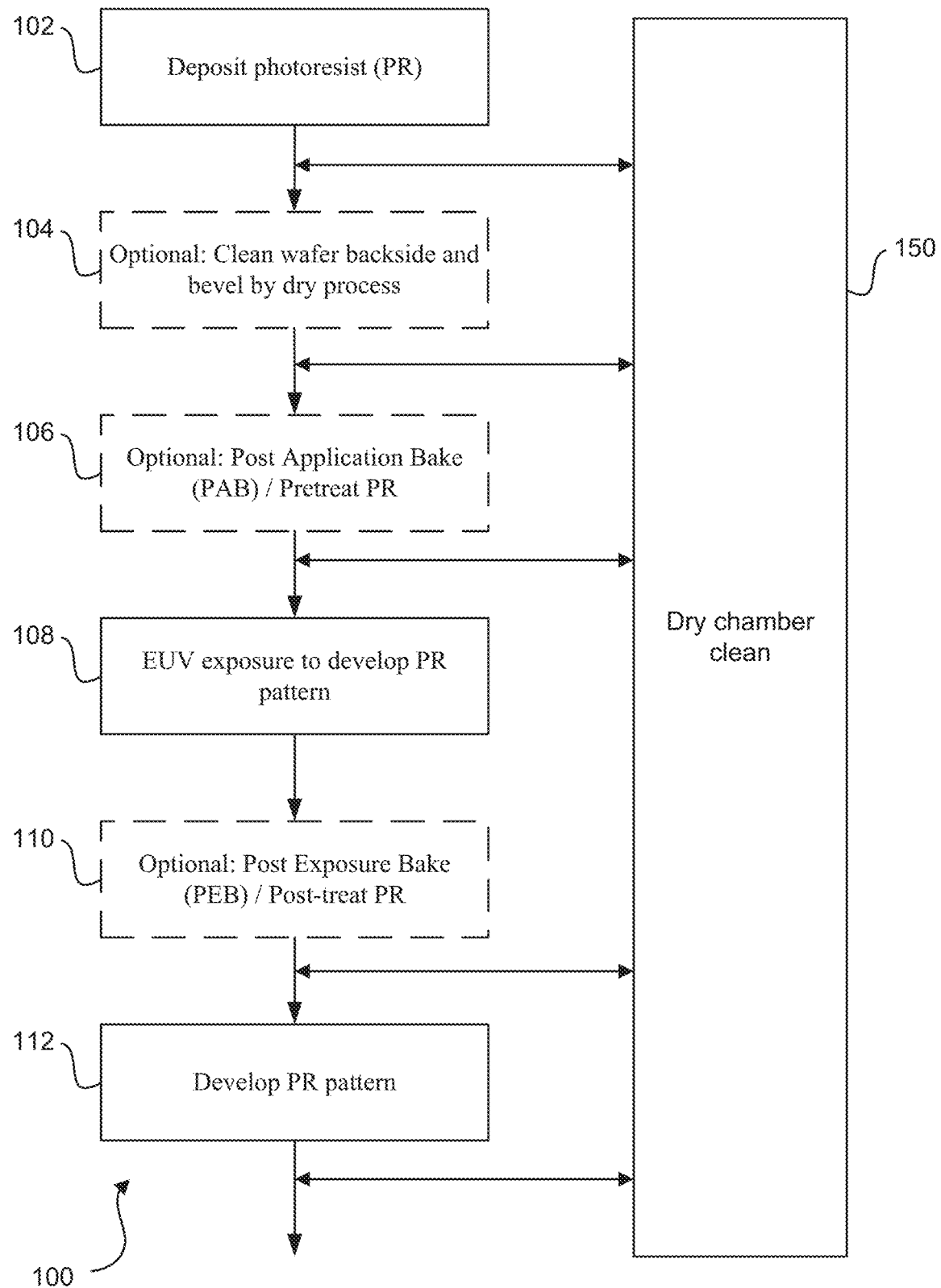
FIG. 1 presents a process flow diagram for one example embodiment.

This disclosure relates generally to the field of semiconductor processing. In particular aspects, the disclosure is directed to methods and apparatus for processing of EUV photoresists (e.g., EUV-sensitive metal and/or metal oxide-containing resist films) in the context of EUV patterning and EUV patterned film development to form a patterning mask.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs are directly photopatternable metal oxide-containing films, such as those available from Inpria, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in Application PCT/US19/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. To date, these resists have been developed using a wet (solvent) approach, which requires the wafer to move to the track, where it is exposed to developing solvent, dried and baked. Wet development does not only limit productivity but can also lead to line collapse due to surface tension effects during the evaporation of solvent between fine features.

Dry development techniques have been proposed to overcome these issues by eliminating substrate delamination and interface failures. Dry development has its own challenges, including etch selectivity between unexposed and EUV exposed resist material which can lead to a higher dose to size requirement for effective resist exposure when compared to wet development. Suboptimal selectivity can also cause PR corner rounding due to longer exposures under etching gas, which may increase line critical dimension (CD) variation in the following transfer etch step.

FIG. 1 presents a flow diagram of an example method for performing a dry chamber clean when depositing and developing a photoresist according to some embodiments. The operations of a process 100 may be performed in different orders and/or with different, fewer, or additional operations. One or more operations of the process 100 may be performed using various apparatuses described herein. In some embodiments, the operations of the process 100 may be implemented, at least in part, according to software stored in one or more non-transitory computer readable media.

Figure 2:
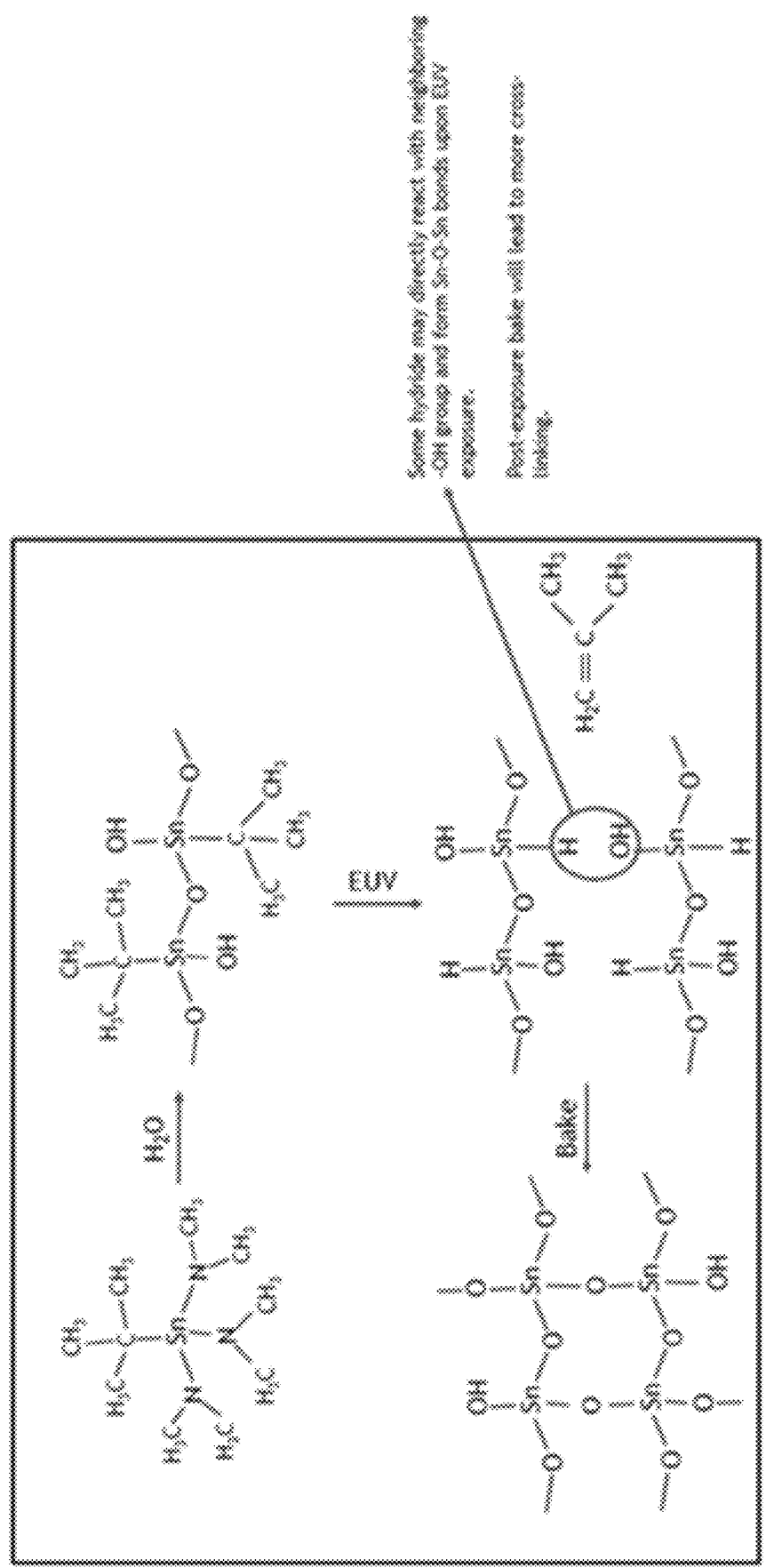
FIG. 2 presents an exemplary chemical reaction scheme of the present technology.

At block 102 of the process 100, a layer of photoresist is deposited. This may be either a dry deposition process such as a vapor deposition process or a wet process such as a spin-on deposition process. The photoresist can be an EUV resist or metal-containing EUV rests. FIG. 2 presents an exemplary process by which a polymerized organometallic material may be formed to deposit a metal-containing EUV resist.

Returning to FIG. 1, in addition to depositing a metal-containing EUV resist thin film on a semiconductor substrate at block 102 of the process 100, metal-containing EUV resist material may be formed on internal surfaces of the process chamber. The internal surfaces may include chamber walls, floors, and ceilings of the process chamber. Other internal surfaces may include a showerhead, nozzles, and substrate support surfaces. The metal-containing EUV resist material may form as a result of dry deposition processes, such as CVD or ALD processes. A thickness of the metal-containing EUV resist material formed on the internal surfaces may increase over time as a result of additional processing (e.g., deposition) operations being performed in the process chamber. The metal-containing EUV resist material is prone to flake off, shed particles, or peel from the internal surfaces of the process chamber to contaminate subsequent semiconductor substrates during processing.

At block 150 of the process 100, a dry chamber clean operation of the present disclosure may be performed after deposition of the metal-containing EUV resist thin film on the semiconductor substrate at block 102 of the process 100. This allows for deposition and dry cleaning to be performed in the same process chamber. However, it will be understood that the dry chamber clean may be performed in a different process chamber than the deposition operation in embodiments. In fact, the dry chamber clean may be performed subsequent to a bevel and/or backside clean, bake, development, or etch operation.

The dry-deposited metal-containing EUV photoresist films being removed are generally composed of Sn, O and C, but the same clean approaches can be extended to films of other metal oxide resists and materials. In addition, this approach can also be used for film strip and PR rework.

At block 104 of the process 100, an optional cleaning process is performed to clean a backside and/or bevel edge of the semiconductor substrate. The backside and/or bevel edge clean may non-selectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Moreover, this bevel edge and backside deposition can cause downstream processing problems, including contamination of the patterning (scanner) and development tools. Conventionally, removal of this bevel edge and backside deposition is done by wet cleaning techniques. For spin-coated photoresist material, this process is called edge bead removal (EBR) and is performed by directing a stream of solvent from above and below the bevel edge while the substrate is spinning. The same process can be applied to soluble organotin oxide-based resists deposited by vapor deposition techniques. The substrate bevel edge and/or backside clean may also be a dry clean process.

At block 150 of the process 100, a dry chamber clean operation of the present disclosure may be performed after a bevel edge and/or backside clean operation. This allows for bevel and/or backside clean and dry chamber clean to be performed in the same process chamber. However, it will be understood that the dry chamber clean may be performed in a different process chamber than the bevel edge and/or backside clean operation in some embodiments.

At block 106 of the process 100, an optional post-application bake (PAB) is performed after deposition of the EUV-patternable film and prior to EUV exposure. The PAB treatment may involve a combination of thermal treatment, chemical exposure, and moisture to increase the EUV sensitivity of the EUV-patternable film, reducing the EUV dose to develop a pattern in the EUV-patternable film.

At block 150 of the process 100, a dry chamber clean operation of the present disclosure may be performed after a PAB treatment. This allows for bake and dry chamber clean to be performed in the same process chamber. However, it will be understood that the dry chamber clean may be performed in a different process chamber than the PAB treatment operation in some embodiments.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development. Following exposure of the metal-containing EUV resist film to EUV light, a photopatterned metal-containing EUV resist is provided. The photopatterned metal-containing EUV resist includes EUV-exposed and unexposed regions.

At block 110 of the process 100, an optional post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions of the photopatterned metal-containing EUV resist or simply baked on a hot plate in ambient air.

At block 150 of the process 100, a dry chamber clean operation of the present disclosure may be performed after a PEB treatment. This allows for bake and dry chamber clean to be performed in the same process chamber. However, it will be understood that the dry chamber clean may be performed in a different process chamber than the PEB treatment operation in some embodiments.

At block 112 of the process 100, the photopatterned metal-containing resist is developed to form a resist mask. In various embodiments, the exposed regions are removed (positive tone) or the unexposed regions are removed (negative tone). In some embodiments, development may include selective deposition on either the exposed or unexposed regions of the photopatterned metal-containing resist, followed by an etching operation. In various embodiments, these processes may be dry processes or wet processes. Examples of processes for development involve an organotin oxide-containing EUV-sensitive photoresist thin film (e.g., 10-30 nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix. The photopatterned metal-containing resist is developed by exposure to a development chemistry. In some embodiments, the development chemistry includes a halide-containing chemistry.

At block 150 of the process 100, a dry chamber clean operation of the present disclosure may be performed after development. This allows for development and dry chamber clean to be performed in the same process chamber. However, it will be understood that the dry chamber clean may be performed in a different process chamber than the development operation in some embodiments. Moreover, it will be understood that the dry chamber clean may be performed in the same or different process chamber than an etch operation in some embodiments. The etch operation may be applied to etch a substrate underlayer of the semiconductor substrate.

Each of operations 102-112 is further elucidated below. In various embodiments, methods of the present technology combine all dry steps of film formation by vapor deposition, (EUV) lithographic photopatterning and dry development. In other embodiments, methods of the present technology include a wet deposition and a dry development, or a dry deposition and a wet development. In some processes, a substrate may directly go to a dry development/etch chamber following photopatterning in an EUV scanner. Such processes may avoid material and productivity costs associated with a wet development. Alternatively, a post exposure bake step during which the exposed regions undergo further crosslinking to form a denser SnO-like network may be conducted in the development chamber, or another chamber.

In some embodiments, a substrate may be provided to various processing environments to perform each of operations 102-112. For example, there may be a PR deposition environment, one or more thermal treatment environments for PAB and/or PEB, a wafer cleaning environment, a scanning environment, and a PR development environment. As will be described below, in some embodiments one or more of these environments may be a station/pedestal within a chamber, a chamber having one or more pedestals, and/or a multi-chamber cluster tool having one or more chambers. In some embodiments, multiple operations may be performed in a single processing environment, e.g., a thermal treatment environment and a wafer cleaning environment may be the same processing environment, where both operations may be performed sequentially without moving the wafer to a different pedestal, chamber, or tool. In some embodiments, multiple processing environments may be within the same chamber or tool, e.g., a thermal treatment environment and a wafer cleaning environment may be at different stations within a quad-station module chamber. In some embodiments, a plurality of processing environments of the same type may be provided in the same tool, for example to enhance or optimize throughput in situations when one processing operation is much slower than another in a multi-operation wafer processing. Other combinations of the above-defined environments should be understood to be within the scope of this disclosure.

Without limiting the mechanism, function or utility of present technology, dry processes of the present technology may provide various benefits relative to wet development processes among those known in the art. For example, dry vapor deposition techniques described herein can be used to deposit thinner and more defect free films than can be applied using wet spin-coating techniques, and that the exact thickness of the deposited film can be modulated and controlled simply by increasing or decreasing the length of the deposition step or sequence. Accordingly, a dry process may provide more tunability and give further critical dimension (CD) control and scum removal. Dry development can improve performance (e.g., prevent line collapse due to surface tension in wet development) and enhance throughput (e.g., by avoiding wet development track). Other advantages may include eliminating the use of organic solvent developers, reduced sensitivity to adhesion issues, avoiding the need to apply and remove wet resist formulations (e.g., avoiding scumming and pattern distortion), improving line edge roughness, patterning directly over device topography, offering the ability to tune hardmask chemistry to the specific substrate and semiconductor device design, and a lack of other solubility-based limitations.

In some instances, a combination of wet and dry processing may be suitable or optimal, such as where substantial capital investment has been made in wet processing wafer processing apparatus whose performance can be enhanced by integrated dry processing and associated apparatus for some operations in a multi-operation process.

Therefore, this disclosure provides processes and apparatus configured for dry development of an EUV-photopatterned metal and/or metal oxide-containing resist as part of a EUV resist mask formation process. Various embodiments include combining all dry operations of film formation by vapor deposition, (EUV) lithographic photopatterning, and dry development. Various other embodiments include dry processing operations described herein advantageously combined with wet processing operations, for example, spin-on EUV photoresists (wet process), such as available from Inpria Corp., may be combined with dry development or other wet or dry processes as described herein. In various embodiments, the wafer clean may be a wet process as described herein, while other processes are dry processes. In further embodiments, a wet development process may be used in combination with (dry) vapor deposition of a PR film.

Lithographic Processing

FIGS. 3A-E illustrate another representative process flow for a metal photoresist hardmask formation process. Generally, a metal-containing film that is sensitive to a patterning agent such as photons, electrons, protons, ions or neutral species, such that the film can be patterned by exposure to one of these species, is deposited on a semiconductor substrate. The metal-containing film is then patterned by exposure to the patterning agent in a vacuum ambient to form the metal mask. This description references primarily metal-containing films, particularly where the metal is Sn, that are patterned by extreme ultraviolet lithography (EUV lithography (EUVL)), particularly EUVL having an EUV source which uses excited Sn droplets. Such films are referred to herein as EUV-sensitive films. However, it should be understood that other implementations are possible, including different metal-containing films and patterning agents/techniques.

Figure 3A:
FIGS. 3A-E illustrate a representative process flow for an example embodiment.

Referring to FIG. 3A, a semiconductor substrate to be patterned 100 is shown. In a typical example, the semiconductor substrate 100 is a silicon wafer including partially-formed integrated circuits.

Figure 3B:

FIG. 3B illustrates a metal-containing film 102 that is sensitive to a patterning agent deposited on the semiconductor substrate 100. The metal-containing film may be a metal salt, for example a metal halide, or an organometallic compound sensitive to exposure to a patterning agent such that the metal-containing film gets decomposed to the base metal or is rendered sensitive to a subsequent development process. Suitable patterning agents may be photons, electrons, protons, ions or neutral species, such that the metal-containing film 102 can be patterned by exposure to one of these species by decomposition to the base metal or is rendered sensitive to a subsequent development process. In general, prior to the deposition, the semiconductor substrate 100 is placed in a reactor chamber for metal-containing film deposition under vacuum.

A blanket of the metal-containing film 102 can be formed by condensation from a suitable precursor (e.g., in a non-plasma CVD reactor, such as an Altus® CVD tool or an Aether® GP CVD tool, available from Lam Research Corporation, Fremont, CA). Suitable process conditions for this deposition via condensation include a deposition temperature between about 0 and 250° C., for example about from ambient temperature (e.g., 23° C.) to 150° C., and a reactor pressure of less than 20 Torr, for example maintained between 0.5 and 2 Torr at 60° C. Maintaining the precursor flow rate between about 100 and 1000 sccm allows for control of the deposition rate.

To prevent degradation due to water vapor, formation and transfer of the Sn-containing films is conducted in a vacuum-ambient. The formed film is then transferred to a EUV patterning tool and patterned via direct exposure, without the use of a photoresist, as illustrated in FIGS. 3C-D.

It should be noted that a EUVL tool typically operates at a higher vacuum than a deposition tool. If this is the case, it is desirable to increase the vacuum environment of the substrate during the transfer from the deposition to the patterning tool to allow the substrate and deposited metal-containing film to degas prior to entry into the patterning tool. This is so that the optics of the patterning tool are not contaminated by off-gassing from the substrate.

Figure 3C:
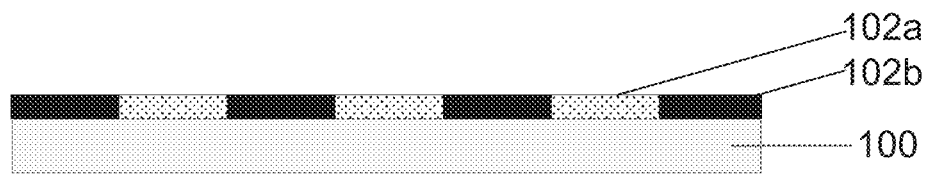

As shown in FIG. 3C, the patterning results in exposed metal-containing film regions of formed metal mask 102a and unexposed regions 102b of material to be removed by pattern development.

Figure 3D:
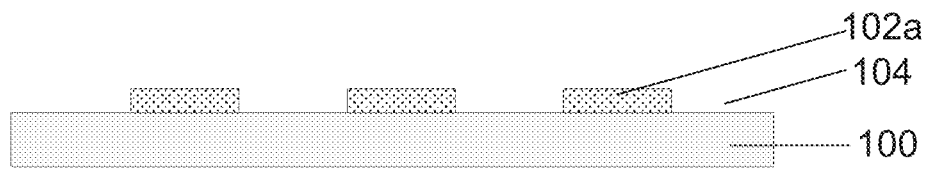

Referring to FIG. 3D, the pattern can then be developed. Development is further discussed elsewhere herein. In some embodiments, development of the pattern can occur simply by heating the substrate to volatilize the unexposed regions 102b of the metal-containing film, so that only the exposed regions 102a remain as a fully-formed metal mask. It should be noted that this pattern development operation may not require vacuum integration since a thermally and environmentally stable patterned metal mask may have been formed. It may also be desirable to conduct the pattern development outside the patterning tool to avoid contaminating the tool optics with any incompatible byproducts of the metal-containing film decomposition.

Figure 3E:
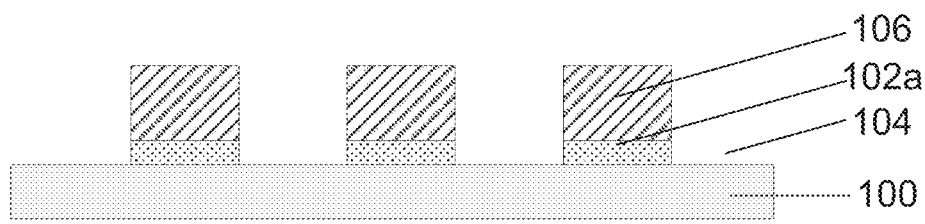

Referring to FIG. 3E, as an optional step, a pattern amplification can be done. For example selective ALD or electroless deposition (ELD) may be performed on the patterned substrate following the operations depicted in FIGS. 3C and/or 3D to build up the thickness of the metal mask with additional selectively deposited metal 106. This may be helpful to reduce optical transmission of the mask or make it more mechanically robust. Such amplification may be accomplished, for example, by adaptation of an electroless deposition process such as that described in U.S. Pat. Nos. 6,911,067, 6,794,288, 6,902,605 and 4,935,312, the disclosures of which in this regard are incorporated by reference herein.

For example, an initial 1 nm seed could be amplified to 10 nm in this way. Like the pattern development discussed with reference to FIG. 3D, this operation may not require vacuum integration since a thermally and environmentally stable patterned metal mask would have been formed before amplification.

One advantage of an all dry or partially dry film formation operation is that dry operations may be one-pass tunable processes. By changing various process conditions (as described below), an operation can be optimized. For example, a dry process for underlayer and PR deposition may be performed in two operations, while wet processes may require cleaning and bake operations before deposition of the PR film. Wet processes, by contrast, may require the use of pre-formulated solution that constrains process parameters, as well as additional passes of thermal treatment, cooling, and spin drying. A dry process may avoid any liquid solution drying steps and reduce PR delamination or line leaning/collapse.

Another advantage of an all dry or partially dry film formation operation is enhanced control over the processing environment. A wet, spin-on process may use pre-formulated solutions and be performed at ambient pressure. A dry process may be performed under vacuum with control of, e.g., pressure, humidity, oxygen, and temperature. In embodiments where integrated processes are performed on the same tool, chamber, or station, vacuum may be maintained between dry processes, which is advantageous to control the environment of the wafer during and between processing operations. Furthermore, integrated processes may allow for reduced queue time as processes are performed within the same tool, chamber, or station.

Deposition of Photoresist (PR)

As discussed above, the present disclosure provides methods for making imaging layers on semiconductor substrates, which may be patterned using EUV or other next generation lithographic techniques. Methods include those where polymerized organometallic materials are produced in a vapor and deposited on a substrate. In other embodiments, a spin-on formulation may be used.

The present technology provides methods by which EUV-sensitive thin films are deposited on a substrate, such films being operable as resists for subsequent EUV lithography and processing. Such EUV-sensitive films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some embodiments, the unexposed film has a hydrophobic surface and the exposed film has a hydrophilic surface (it being recognized that the hydrophilic properties of exposed and unexposed areas are relative to one another) under the conditions at which such subsequent processing is performed. For example, the removal of material may be performed by leveraging differences in chemical composition, density and cross-linking of the film. Removal may be by wet processing or dry processing, as further described below.

The thickness of the EUV-patternable film formed on the surface of the substrate may vary according to the surface characteristics, materials used, and processing conditions. In various embodiments, the film thickness may range from 0.5 nm to 100 nm, and is preferably of sufficient thickness to absorb most of the EUV light under the conditions of EUV patterning. For example, the overall absorption of the resist film may be 30% or less (e.g., 10% or less, or 5% or less) so that the resist material at the bottom of the resist film is sufficiently exposed. In some embodiments, the film thickness is from 10 to 20 nm. Without limiting the mechanism, function or utility of present disclosure, it is believed that, unlike wet, spin-coating processes of the art, the processes of the present disclosure have fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

Substrates

Substrates useful in the methods of the present technology may include any material construct suitable for lithographic processing, particularly for the production of integrated circuits and other semiconducting devices. In some embodiments, substrates are silicon wafers. Substrates may be silicon wafers upon which features have been created ("underlying topographical features"), having an irregular surface topography. (As referred to herein, the "surface" is a surface onto which a film of the present technology is to be deposited or that is to be exposed to EUV during processing.) Such underlying topographical features may include regions in which material has been removed (e.g., by etching) or regions in which materials have been added (e.g., by deposition) during processing prior to conducting a method of this technology. Such prior processing may include methods of this technology or other processing methods in an iterative process by which two or more layers of features are formed on the substrate. Without limiting the mechanism, function or utility of present technology, it is believed that, in some embodiments, methods of the present technology offer advantages relative to methods among those known in the art in which photolithographic films are deposited on the surface of substrates using spin casting methods. Such advantages may derive from the conformance of the films of the present technology to underlying features without "filling in" or otherwise planarizing such features, and the ability to deposit films on a wide variety of material surfaces.

In some embodiments, an incoming wafer can be prepared with a substrate surface of a desired material, with the uppermost material being the layer into which the resist pattern is transferred. While the material selection may vary depending on integration, it is generally desired to select a material which can be etched with high selectivity to (i.e., much faster than) the EUV resist or imaging layer. Suitable substrate materials can include various carbon-based films (e.g., ashable hard mask (AHM), silicon based films (e.g., SiOx, SiOxNy, SiOxCyNz), a-Si:H, poly-Si, or SiN), or any other (generally sacrificial) film applied to facilitate the patterning process.

In some embodiments, the substrate is a hard mask, which is used in lithographic etching of an underlying semiconductor material. The hard mask may comprise any of a variety of materials, including amorphous carbon (a-C), $SnO_x$, $SiO_2$, $SiO_xN_y$, $SiO_xC$, $Si_3N_4$, $TiO_2$, TiN, W, W-doped C, $WO_x$, $HfO_2$, $ZrO_2$, and $Al_2O_3$ For example, the substrate may preferably comprise $SnO_x$, such as $SnO_2$. In various embodiments, the layer may be from 1 nm to 100 nm thick, or from 2 nm to 10 nm thick.

In some embodiments, a substrate comprises an underlayer. An underlayer may be deposited on a hard mask or other layer and is generally underneath an imaging layer as described herein. An underlayer may be used to improve the sensitivity of a PR, increase EUV absorptivity, and/or increase the patterning performance of the PR. In cases where there are device features present on the substrate to be patterned which create significant topography, another important function of the underlayer can be to overcoat and planarize the existing topography so that the subsequent patterning step may be performed on a flat surface with all areas of the pattern in focus. For such applications, the underlayer (or at least one of multiple underlayers) may be applied using spin-coating techniques. When the photoresist material being employed possesses a significant inorganic component, for example it exhibits a predominately metal oxide framework, the underlayer may advantageously be a carbon-based film, applied either by spin-coating or by dry vacuum based deposition processes. The layer may include various ashable hard mask (AHM) films with carbon and hydrogen based compositions and may be doped with additional elements such as tungsten, boron, nitrogen, or fluorine. Methods and apparatus among those useful in such processes are described in U.S. Patent Application 62,909,430, filed Oct. 2, 2019, incorporated by reference herein for its disclosure of the methods and apparatus.

Film Deposition

In various embodiments, the EUV-patternable films are made and deposited on the substrate using vapor deposition equipment and processes among those known in the art. In such processes, the polymerized organometallic material is formed in vapor phase or in situ on the surface of the substrate.

In general, methods comprise mixing a vapor stream of an organometallic precursor with a vapor stream of a counter-reactant so as to form a polymerized organometallic material, and depositing the organometallic material onto the surface of the semiconductor substrate. As will be understood by one of ordinary skill in the art, the mixing and depositing aspects of the process may be concurrent, in a substantially continuous process. Methods and apparatus among those useful in such processes are described in Application PCT/US2019/031618, filed May 9, 2019 and Application PCT/US2019/060742, filed Nov. 11, 2019, incorporated by reference herein for its disclosure of the methods and apparatus, in particular various organometallic precursors.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some embodiments, the unexposed film has a more hydrophobic surface than the exposed film under the conditions at which such subsequent processing is performed. For example, the removal of material may be performed by leveraging differences in chemical composition, density and cross-linking of the film. Removal may be by wet processing or dry processing, as further described below.

The thin films are, in various embodiments, organometallic materials, for example organotin materials comprising tin oxide, or other metal oxide materials/moieties. The organometallic compounds may be made in a vapor phase reaction of an organometallic precursor with a counter reactant. In various embodiments, the organometallic compounds are formed through mixing specific combinations of organometallic precursors having bulky alkyl groups or fluoroalkyl with counter-reactants and polymerizing the mixture in the vapor phase to produce a low-density, EUV-sensitive material that deposits onto the semiconductor substrate.

In various embodiments, organometallic precursors comprise at least one alkyl group on each metal atom that can survive the vapor-phase reaction, while other ligands or ions coordinated to the metal atom can be replaced by the counter-reactants. Organometallic precursors include those of the formula:

$$M_aR_bL_c \quad \text{(Formula 1)}$$

wherein: M is a metal with a high EUV absorption cross-section; R is alkyl, such as $C_nH_{2n+1}$, preferably wherein n≥2; L is a ligand, ion or other moiety which is reactive with the counter-reactant; a≥1; b≥1; and c≥1.

In various embodiments, M has an atomic absorption cross section equal to or greater than $1\times10^7$ cm$^2$/mol. M may be, for example, selected from the group consisting of tin, hafnium, tellurium, bismuth, indium, antimony, germanium, and combinations thereof. In some embodiments, M is tin. R may be fluorinated, e.g., having the formula $C_nF_xH_{(2n+1)}$. In various embodiments, R has at least one beta-hydrogen or beta-fluorine. For example, R may be selected from the group consisting of ethyl, i-propyl, n-propyl, t-butyl, i-butyl, n-butyl, sec-butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various embodiments, a counter-reactant reacts with the organometallic precursor by forming oxygen bridges between neighboring metal atoms.

Other potential counter-reactants include hydrogen sulfide and hydrogen disulfide, which can crosslink metal atoms via sulfur bridges. In other instances, Te-containing precursors may be used counter-reactants with or instead of water to form Te—Sn—Te—Sn cross-links, for example. Suitable tellurium co-reactants for use with Sn(NMe$_2$)x type precursors are RTeH or RTeD (D=deuterium) and R$_2$Te precursors, with R=alkyl groups, particularly t-butyl or isopropyl, such as t-butylTeD. For use with M(OR)x type precursors, Bis(trimethylsilyl)Te may be used, for example.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some embodiments, a gentle remote H$_2$ plasma may be introduced so as to replace some Sn-L bonds with Sn—H, which can increase reactivity of the resist under EUV.

In various embodiments, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space.

In general, methods comprise mixing a vapor stream of an organometallic precursor with a vapor stream of a counter-reactant so as to form a polymerized organometallic material, and depositing the organometallic material onto the surface of the semiconductor substrate. In some embodiments, more than one organometallic precursor is included in the vapor stream. In some embodiments, more than one counter-reactant is included in the vapor stream. As will be understood by one of ordinary skill in the art, the mixing and depositing aspects of the process may be concurrent, in a substantially continuous process.

In an example continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation). The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function, or utility of present technology, it is believed that the product from such vapor-phase reaction becomes heavier in molecular weight as metal atoms are crosslinked by counter-reactants, and is then condensed or otherwise deposited onto the semiconductor substrate. In various embodiments, the steric hindrance of the bulky alkyl groups prevents the formation of densely packed network and produces smooth, amorphous, low-density films.

The CVD process is generally conducted at reduced pressures, such as from 10 milliTorr to 10 Torr. In some embodiments, the process is conducted at from 0.5 to 2 Torr. In some embodiments, the temperature of the semiconductor substrate is at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

The thickness of the EUV-patternable film formed on the surface of the semiconductor substrate may vary according to the surface characteristics, materials used, and processing conditions. In various embodiments, the film thickness may range from 0.5 nm to 100 nm, and may be a sufficient thickness to absorb most of the EUV light under the conditions of EUV patterning. The EUV-patternable film may be able to accommodate absorption equal to or greater than 30%, thereby having significantly fewer EUV photons available towards the bottom of the EUV-patternable film. Higher EUV absorption leads to more cross-linking and densification near the top of an EUV-exposed film compared to the bottom of the EUV-exposed film. Though efficient utilization of EUV photons may occur with EUV-patternable films having higher overall absorption, it will be understood that in some instances, the EUV-patternable film may be less than about 30%. For comparison, the maximum overall absorption of most other resist films are less than 30% (e.g., 10% or less, or 5% or less) so that the resist material at the bottom of the resist film is sufficiently exposed. In some embodiments, the film thickness is from 5 nm to 40 nm or from 10 nm to 20 nm. Without limiting the mechanism, function, or utility of present disclosure, it is believed that, unlike wet, spin-coating processes of the art, the processes of the present disclosure have fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

In some embodiments of the techniques discussed herein, another strategy that can further improve the EUV sensitivity in a PR film is to create a film where the film composition is vertically graded, resulting in depth-dependent EUV sensitivity. In a homogenous PR with a high absorption coefficient, the decreasing light intensity throughout the film depth necessitates a higher EUV dose to ensure the bottom is sufficiently exposed. By increasing the density of atoms with high EUV absorptivity at the bottom of the film relative to the top of the film (i.e., by creating a gradient with increasing EUV absorption) it becomes possible to more efficiently utilize available EUV photons while more uniformly distributing absorption (and the effects of secondary electrons) towards the bottom of more highly absorbing films.

The strategy of engineering a vertical composition gradient in a PR film is particularly applicable to dry deposition methods such as CVD and ALD and can be realized by tuning the flow ratios between different reactants during deposition. The type of composition gradients that can be engineered include: the ratios between different high-absorbing metals, the percentage of metal atoms that have EUV-cleavable bulky groups, the percentages of bulky groups or counter-reactants that contain high-absorbing elements (such as Te, and I), and combinations of the above. Further discussion of vertically graded films is found in Application PCT/US20/70172, filed Jun. 24, 2020, incorporated by reference herein for its disclosure of the methods and apparatus.

Backside/Bevel Clean

During application of an EUV photoresist film to a substrate, either by conventional wet, e.g., spin-on, processing or dry deposition as described herein, there may be some unintended deposition of resist material on the wafer bevel edge and/or backside. This bevel edge and backside deposition can cause downstream processing problems, including contamination of the patterning (scanner) and development tools. Conventionally, removal of this bevel edge and backside deposition is done by wet cleaning techniques.

The current state-of-the-art for cleaning spin-coated metal-organic photoresists is by wet-clean processing. An edge bead removal (EBR) is performed on a wet track on both the front and the backside of a wafer. A nozzle is positioned over the edge of the wafer on both the frontside and the backside of the wafer, and solvent is dispensed while the wafer is rotating. An organic solvent (for example: PGME, PGMEA, 2-heptanone) dissolves the photoresist on the edge, cleaning the bevel edge region. If the backside is contaminated, the wafer needs to go to another wet clean station for backside cleaning of the wafer. For spin-coating, the wafer region contacting the chuck typically remains clean and a separate backside clean is not always used. Additional cleans such as dilute hydrofluoric acid (dHF), dilute hydrochloric acid (dHCl), dilute sulfuric acid, or standard clean 1 (SC-1) may be necessary to reduce metals contamination. Before entering the EUV scanner, a backside scrub is commonly performed.

Solvents used in wet-clean processing inherently have issues of high cost for both acquisition and disposal. Such solvents may become hazardous to the environment and present health concerns. Wet-clean processing may be limited by uniformity of removal of the EUV resist material on the bevel edge regions. Due to surface tension and vapor concerns, the removal is often wavy and does not result in crisp removal of the EUV resist material at the bevel edge regions. Additionally, backsplashes using organic solvents can generate defects on the frontside of the wafer. The wet-clean processing is typically performed in a stand-alone tool/chamber, and so wafers need to be transferred after deposition in between tools/chambers. This can result in contamination of the tools/chambers used in backside and/or bevel edge cleaning.

Described herein is a cleaning process to clean a backside and/or bevel edge of the semiconductor substrate. The backside and/or bevel edge clean may non-selectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Moreover, this bevel edge and backside deposition can cause downstream processing problems, including contamination of the patterning (scanner) and development tools. Conventionally, removal of this bevel edge and backside deposition is done by wet cleaning techniques. For spin-coated photoresist material, this process is called edge bead removal (EBR) and is performed by directing a stream of solvent from above and below the bevel edge while the substrate is spinning. The same process can be applied to soluble organotin oxide-based resists deposited by vapor deposition techniques.

The substrate bevel edge and/or backside clean may also be a dry clean process. In some embodiments, the dry clean process involves a vapor and/or plasma having one or more of the following gases: HBr, HCl, HI, $BCl_3$, $SOCl_2$, $Cl_2$, $BBr_3$, $H_2$, $O_2$, $PCl_3$, $CH_4$, methanol, ammonia, formic acid, $NF_3$, HF. In some embodiments, the dry clean process may use the same chemistries as a dry development process described herein. For example, the bevel edge and backside clean may use hydrogen halide development chemistry. For the backside and bevel edge clean process, the vapor and/or the plasma has to be limited to a specific region of the substrate to ensure that only the backside and the bevel are removed, without any film degradation on a frontside of the substrate.

Process conditions may be optimized for bevel edge and backside clean. In some embodiments, higher temperature, higher pressure, and/or higher reactant flow may lead to increased etch rate. Suitable process conditions for a dry bevel edge and backside clean may be: reactant flow of 100-10000 sccm (e.g., 500 sccm HCl, HBr, HI, or $H_2$ and $Cl_2$ or $Br_2$, $BCl_3$ or $H_2$), temperature of 20 to 140° C. (e.g., 80° C.), pressure of 20-1000 mTorr (e.g., 100 mTorr), plasma power of 0 to 500 W at high frequency (e.g., 13.56 MHz), and for a time of about 10 to 20 seconds, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

Further discussion of bevel edge and backside cleaning is found in Application PCT/US20/70187, filed Jun. 25, 2020, and/or in Application PCT/US20/39615, filed Jun. 25, 2020, incorporated by reference herein for all purposes.

PR Rework

The dry-cleaning operation may alternatively be extended to a full photoresist removal or photoresist "rework" in which an applied EUV photoresist is removed and the semiconductor substrate prepared for photoresist reapplication, such as when the original photoresist is damaged or otherwise defective. Photoresist rework should be accomplished without damaging the underlying semiconductor substrate, so an oxygen-based etch should be avoided. Instead, variants of halide-containing chemistries as described herein may be used. It will be understood that the photoresist rework operation may be applied at any stage during the process 100. Thus, the photoresist rework operation may be applied after photoresist deposition, after bevel edge and backside clean, after PAB treatment, after EUV exposure, after PEB treatment, or after development. In some embodiments, the photoresist rework may be performed for non-selective removal of exposed and unexposed regions of the photoresist but selective to an underlayer.

In some embodiments, the photoresist rework process involves a vapor and/or plasma having one or more of the following gases: HBr, HCl, HI, $BCl_3$, $Cl_2$, $BBr_3$, $H_2$, $PCl_3$, $CH_4$, methanol, ammonia, formic acid, $NF_3$, HF. In some embodiments, the photoresist rework process may use the same chemistries as a dry development process described herein. For example, the photoresist rework may use hydrogen halide development chemistry.

Process conditions may be optimized for the photoresist rework. In some embodiments, higher temperature, higher pressure, and/or higher reactant flow may lead to increased etch rate. Suitable process conditions for a photoresist rework may be: reactant flow of 100-500 sccm (e.g., 500 sccm HCl, HBr, HI, $BCl_3$ or $H_2$ and $Cl_2$ or BO, temperature of 20 to 140° C. (e.g., 80° C.), pressure of 20-1000 mTorr (e.g., 300 mTorr), plasma power of 300 to 800 W (e.g., 500 W) at high frequency (e.g., 13.56 MHz), wafer bias of 0 to 200 $V_b$ (a higher bias may be used with harder underlying substrate materials) and for a time of about 20 seconds to 3 minutes, sufficient to completely remove the EUV photoresist, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

Further discussion of bevel edge and backside cleaning, or PR rework, is found in Application PCT/US20/39615, filed Jun. 25, 2020, incorporated by reference herein for all purposes.

PAB/Softbake

Photolithography processes typically involve one or more bake steps, to facilitate the chemical reactions required to produce chemical contrast between exposed and unexposed areas of the photoresist. For high volume manufacturing (HVM), such bake steps are typically performed on tracks where the wafers are baked on a hot-plate at a pre-set temperature under ambient-air or in some cases $N_2$ flow. More careful control of the bake ambient as well as introduction of additional reactive gas component in the ambient during these bake steps can help further reduce the dose requirement and/or improve pattern fidelity.

According to various aspects of this disclosure, one or more post treatments to metal and/or metal oxide-based photoresists after deposition (e.g., post-application bake (PAB)) and/or exposure (e.g., post-exposure bake (PEB)) are capable of increasing material property differences between exposed and unexposed photoresist and therefore decreasing dose to size (DtS), improving PR profile, and improving line edge and width roughness (LER/LWR) after subsequent dry development. The PAB treatment may involve a combination of thermal treatment, chemical exposure, and moisture to increase the EUV sensitivity of the EUV-patternable film, reducing the EUV dose to develop a pattern in the EUV-patternable film. The PAB treatment temperature may be tuned and optimized for increasing the sensitivity of the EUV-patternable film. For example, the treatment temperature may be between about 90° C. and about 200° C. or between about 150° C. and about 190° C. In some embodiments, the PAB treatment may be conducted with a pressure between atmospheric and vacuum, and a treatment duration of about 1 to 15 minutes, for example about 2 minutes. In some embodiments, the PAB treatment is conducted at a temperature between about 100° C. to 200° C. for about 1 minute to 2 minutes.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur, as through a beta-hydride elimination, leaving behind reactive and accessible metal hydride functionality that can be converted to hydroxide and cross-linked metal oxide moieties via metal-oxygen bridges during a subsequent post-exposure bake (PEB) step. This process can be used to create chemical contrast for development as a negative tone resist. In general, a greater number of beta-H in the alkyl group results in a more sensitive film. This can also be explained as weaker Sn—C bonding with more branching. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example the pattern can be developed using a dry method to form a metal oxide-containing mask.

In particular, in various embodiments, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function or utility of present technology, EUV exposure, for example, at doses of from 10 $mJ/cm^2$ to 100 $mJ/cm^2$ results in the cleavage of Sn—C bonds resulting is loss of the alkyl substituent, alleviating steric hindrance and allowing the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

In some embodiments, a post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions or simply baked on a hot plate in ambient air, for example between 150° C. and 250° C. for between one and five minutes (e.g., 190° C. for two minutes).

In various embodiments, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize any Sn—H, Sn—Sn, or Sn radical species generated by EUV exposure into metal hydroxide, and (3) facilitate cross-linking between neighboring Sn—OH groups to form a more densely crosslinked $SnO_2$-like network. The bake temperature is carefully selected to achieve optimal EUV lithographic performance. Too low a PEB temperature would lead to insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which can contribute to loss of chemical contrast and an increase in defect density due to insoluble scum. The PEB treatment temperature may be between about 100° C. and about 300° C., between about 170° C. and about 290° C., or between about 200° C. and about 240° C. In some embodiments, the PEB treatment may be conducted with a pressure between atmospheric and vacuum, and a treatment duration of about 1 to 15 minutes, for example about 2 minutes. In some embodiments, PEB thermal treatment may be repeated to further increase etch selectivity.

Additionally, the ramping rate of the bake temperature in either PAB or PEB treatments is another useful process parameter that can be manipulated to fine-tune the cross-linking/etch selectivity results. Alternatively, the PAB and PEB thermal process can be done in either a single operation or multiple operations using different process conditions such as ambient gases or mixtures, temperatures, pressures, etc. for each operation, to modulate the PR properties and therefore to tune different etch selectivity.

In alternate embodiment, either or both of the post-application and past-exposure treatments may involve a remote plasma process, together with or instead or thermal processing, to generate radicals for to react with the metal-containing photoresist to modify its material properties. In such implementations, the radicals may be generated from the same or different gas species.

In various embodiments, treating the metal-containing photoresist to modify material properties of the metal-containing photoresist both precedes and follows exposing the metal-containing photoresist to EUV lithography (e.g., PAB and PEB). Further discussion of PAB and PEB operations is found in U.S. Patent Application 62/970,020, filed Feb. 4, 2020, and Application PCT/US20/70171, filed Jun. 24, 2020, incorporated by reference herein for all purposes.

EUV Scanner

Extreme ultraviolet (EUV) lithography can extend lithographic technology beyond its optical limits by moving to smaller imaging source wavelengths achievable with current photolithography methods to pattern small critical dimension features. EUV light sources at approximately 13.5 nm wavelength can be used for leading-edge lithography tools, also referred to as scanners. The EUV radiation is strongly absorbed in a wide range of solid and fluid materials including quartz and water vapor, and so operates in a vacuum.

The present technology also provides methods wherein the imaging layer is patterned by exposing a region of the imaging layer to irradiation, such as EUV, DUV or e-beam. In such patterning, the radiation is focused on one or more regions of the imaging layer. The exposure is typically performed such that imaging layer film comprises one or more regions that are not exposed to the radiation. The resulting imaging layer may comprise a plurality of exposed and unexposed regions, creating a pattern consistent with the creation of transistor or other features of a semiconductor device, formed by addition or removal of material from the substrate in subsequent processing of the substrate. EUV, DUV and e-beam radiation methods and equipment among useful herein include methods and equipment known in the art.

A vacuum-integrated metal hardmask process and related vacuum-integrated hardware that combines film formation (deposition/condensation) and optical lithography with the result of greatly improved EUV lithography (EUVL) performance—e.g. reduced line edge roughness—is disclosed herein.

In various embodiments described herein, a deposition (e.g., condensation) process (e.g., ALD or MOCVD carried out in a PECVD tool, such as the Lam Vector®) can be used to form a thin film of a metal-containing film, such a photosensitive metal salt or metal-containing organic compound (organometallic compound), with a strong absorption in the EUV (e.g., at wavelengths on the order of 10-20 nm), for example at the wavelength of the EUVL light source (e.g., 13.5 nm=91.8 eV). This film photo-decomposes upon EUV exposure and forms a metal mask that is the pattern transfer layer during subsequent etching (e.g., in a conductor etch tool, such as the Lam 2300® Kiyo®).

Following deposition, the EUV-patternable thin film is patterned by exposure to a beam of EUV light, typically under relatively high vacuum. For EUV exposure, the metal-containing film can then be deposited in a chamber integrated with a lithography platform (e.g., a wafer stepper such as the TWINSCAN NXE: 3300B® platform supplied by ASML of Veldhoven, NL) and transferred under vacuum so as not to react before exposure. Integration with the lithography tool is facilitated by the fact that EUVL also requires a greatly reduced pressure given the strong optical absorption of the incident photons by ambient gases such as $H_2O$, $O_2$, etc. In other embodiments, the photosensitive metal film deposition and EUV exposure may be conducted in the same chamber.

It should also be noted that while this disclosure primarily references EUVL as a patterning technique, alternative embodiments could use a focused beam of electrons, ions or neutral species to directly write the pattern onto the blanket mask, where these steps are also performed in vacuum. In-situ chamber cleaning may be used if byproducts condense on the reflective optics of the EUVL system.

In particular, as discussed above, areas of the film are created through EUV patterning that have altered physical or chemical properties relative to unexposed areas. For example, in exposed areas, metal-carbon bond cleavage may occur via beta-hydride elimination, leaving behind reactive and accessible metal hydride functionality that can be converted to hydroxide and cross-linked metal oxide moieties via metal-oxygen bridges, which can be used to create chemical contrast either as a negative tone resist or as a template for hard mask. In general, a greater number of beta-H in the alkyl group results in a more sensitive film. Following exposure, the film may be baked, so as to cause additional cross-linking of the metal oxide film.

Without limiting the mechanism, function or utility of present technology, EUV exposure, for example, at doses of from 10 $mJ/cm^2$ to 100 $mJ/cm^2$, may alleviate steric hindrance and provide space for the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed area.

The vacuum-integration of film deposition and lithography processes and apparatus described herein provides EUV-sensitive metal film deposition and subsequently patterning directly by direct EUV exposure in a vacuum ambient to prevent their decomposition or degradation. EUVL is done in a vacuum to avoid degradation of the incident 13.5 nm light flux by optical absorption of ambient gases. Among the advantages of described vacuum-integrated hardmask processes are: Vacuum operation of the EUV system opens up the possibility of using compounds that are oxygen and moisture sensitive; vacuum integration of the deposition system with the EUV system in an apparatus enables use of these materials. Photo decomposition of a metal precursor creates a non-linear reaction where the photo decomposition is enhanced by the increased adsorption of the metal film. Metals are better at thermalization of high energy secondary electrons than photoresist, thereby improving contrast or LER. Using metal film directly as masks or with pattern amplification allows much thinner films and reduce required exposure times. Metal films make better hardmasks for etch and decrease the thickness required from a mask perspective. Moreover, further development and optimization of materials compatible with the EUV vacuum and optics, organometallic precursors with appropriate dose thresholds for metal deposition, and nucleation films with multiple photo decomposition events to eliminate a nucleation site in a given space may proceed in accordance with the processes described herein.

Further discussion of lithographic irradiation operations is found in U.S. patent application Ser. No. 14/610,038, filed Jan. 30, 2015, incorporated by reference herein for all purposes.

Post Exposure Bake

As describe above, photolithography processes typically involve one or more bake steps to facilitate the chemical reactions required to produce chemical contrast between exposed and unexposed areas of the photoresist. Baking may be performed after depositing an imaging layer/before EUV exposure (e.g., post-application bake (PAB)) and/or exposure to EUV (e.g., post-exposure bake (PEB)).

In various embodiments, a bake strategy involves careful control of the bake ambient, introduction of reactive gases, and/or careful control of the ramping rate of the bake temperature. In some embodiments, the PEB strategies discussed above may be used. Such strategies can be particularly useful for metal oxide based EUV photoresist (PR).

In a typical EUV lithography work flow, the spin-on metal oxide resist materials typically experience two bake steps: one after the application of the resist to evaporate any residual solvent absorbed in the film, and another after EUV exposure. The second bake, commonly referred to as PEB, is designed for multiple purposes: 1) to drive complete evaporation of the organic fragments that are generated during EUV exposure; 2) to oxidize the metal hydride species (the other product from the beta-H elimination reaction during EUV exposure) into metal hydroxide; and 3) to facilitate the cross-linking between neighboring —OH groups and form a cross-linked metal oxide network. The bake temperature is carefully selected to achieve optimal EUV lithographic performance. Too low a PEB temperature would lead to incomplete removal of organic fragments as well as insufficient cross-linking, and consequently less chemical contrast for development at a given dose. Too high a PEB temperature would also have detrimental impacts, including severe oxidation and film shrinkage in the unexposed area (the area that is removed by development of the patterned film to form the mask in this example), as well as, undesired interdiffusion at the interface between PR and an underlayer, both of which will contribute to loss of chemical contrasts and an increase in defect density due to insoluble scum. Having the bake temperature and bake time as the only knobs, the tunability and process window is often very limited.

As discussed above, careful control on the bake ambient and introduction of reactive gas species during the PEB process, as described herein, provides an additional chemistry knob to fine-tune the cross-linking process. The ability to tune the kinetics of cross-linking behavior in PR materials would provide a wider process window that would allow for further optimization of lithographic performance by minimizing interdiffusion and other relevant defect formation mechanisms. Additionally, the ramping rate of the bake temperature and control of pressure (atmospheric pressure and below) are another useful process parameters that can be manipulated to fine-tune the cross-linking process.

Further discussion of PAB and PEB operations is found in U.S. Patent Application 62/970,020, filed Feb. 4, 2020, and Application PCT/US20/70171, filed Jun. 24, 2020, incorporated by reference herein for all purposes.

Pattern Development After EUV Exposure

Following EUV exposure and potentially a PEB, the selectivity between exposed and unexposed regions of the imaging layer is exploited by dry development, wet development, or area-selective ALD. For example, dry or wet development processes may remove the unexposed regions and leave the exposed regions. The subsequent processing of the imaging layer, following EUV exposure, will depend on the substrate materials and the desired features of the semiconducting device made using the substrate. For example, features may be created on the substrate by various lithographic techniques, such as films which become selectively soluble in dry or liquid developers in either exposed (positive tone) or unexposed (negative tone) areas defined by a patterned exposure tool.

Dry development can improve performance (e.g., prevent line collapse due to surface tension in wet development) and enhance throughput (e.g., by avoiding the need for a wet development track). Other advantages of dry development and/or all-dry processing may include eliminating the use of organic solvent developers, reduced sensitivity to adhesion issues, increased EUV absorption for improved dose efficiency, and a lack of solubility-based limitations.

EUV Photoresist Dry Development

As discussed above, exposed areas of a film are created through EUV patterning that have altered physical or chemical properties relative to unexposed areas. For example, in exposed areas, metal-carbon bond cleavage may occur via beta-hydride elimination, leaving behind reactive and accessible metal hydride functionality that can be converted to hydroxide and cross-linked metal oxide moieties via metal-oxygen bridges, which can be used to create chemical contrast either as a negative tone resist or as a template for hard mask. In general, a greater number of beta-H in the alkyl group results in a more sensitive film. Following exposure, the film may be baked, so as to cause additional cross-linking of the metal oxide film.

The difference in properties between exposed and unexposed areas may be exploited in subsequent processing, such as to dissolve unexposed areas or to deposit materials on the exposed areas. For example the pattern can be developed using a dry method to form a metal oxide-containing mask. Methods and apparatus among those useful in such processes are described in Application PCT/US2019/067540, filed Dec. 19, 2019, Application PCT/US20/39615, filed Jun. 25, 2020, and U.S. Pat. App. No. 62/912,330, filed Oct. 8, 2019 incorporated by reference herein for its disclosure of the methods and apparatus.

In thermal development processes, the photopatterned metal-containing EUV resist is exposed to development chemistry at a temperature that is optimized for etch selectivity between exposed and unexposed regions. Lower temperatures may increase contrast in etch selectivity while higher temperatures may decrease contrast in etch selectivity. In some embodiments, a temperature may be between about −60° C. and about 120° C., between about −20° C. and about 60° C., or between about −20° C. and about 20° C., such as about −10° C. Chamber pressure may be tuned, where chamber pressure may influence etch selectivity between exposed and unexposed regions during development. In some embodiments, the chamber pressure may be relatively low and accompanied without dilution, where the chamber pressure may be between about 0.1 mTorr and about 300 mTorr, between about 0.2 mTorr and about 100 mTorr, or between about 0.5 mTorr and about 50 mTorr. In some embodiments, the chamber pressure may be between about 20 mTorr and about 800 mTorr, or between about 20 mTorr and about 500 mTorr, such as about 300 mTorr. In some embodiments, the chamber pressure may be relatively high with high flow and accompanied by dilution, where the chamber pressure may be between about 100 Torr and about 760 Torr or between about 200 Torr and about 760 Torr. Reactant flow rate may be tuned, where reactant flow may influence etch selectivity between exposed and unexposed regions during development. In some embodiments, reactant flow may be between about 50 sccm and about 2000 sccm, between about 100 sccm and about 2000 sccm, or between about 100 sccm and about 1000 sccm, such as about 500 sccm. In instances with high flow, reactant flow may be between about 1 L and about 10 L. Duration of exposure may be tuned in the thermal development process. The duration of exposure may depend on how much resist is desired to be removed, development chemistry, amount of crosslinking in the resist, and composition and properties of the resist, among other factors. In some embodiments, duration of exposure may be between about 5 seconds and about 5 minutes, between about 10 seconds and about 3 minutes, or between about 10 seconds and about 1 minute.

Thermal development processes may expose the photopatterned metal-containing EUV resist to certain halide-containing chemistries in the vapor or liquid phase. In some embodiments, the development chemistry includes a hydrogen halide, hydrogen and halogen gas, boron trichloride, an organic halide, an acyl halide, a carbonyl halide, a thionyl halide, or mixtures thereof. A hydrogen halide can include but is not limited to HF, HCl, HBr, and HI. For example, the hydrogen halide can be HCl or HBr. Hydrogen and halogen gas can include but is not limited to hydrogen gas ($H_2$) mixed with $F_2$, $Cl_2$, $Br_2$, or $I_2$. Boron trichloride ($BCl_3$) may be used in combination with any of the aforementioned hydrogen halides or hydrogen and halogen gases. An organic halide can include but is not limited to $C_xH_yF_z$, $C_xH_yCl_z$, $C_xH_yBr_z$, and $C_xH_yI_z$, where x, y, and z are values equal to or greater than 0. An acyl halide can include but is not limited to $CH_3COF$, $CH_3COCl$, $CH_3COBr$, and $CH_3COI$. A carbonyl halide can include but is not limited to $COF_2$, $COCl_2$, $COBr_2$, and $COI_2$. A thionyl halide can include but is not limited to $SOF_2$, $SOCl_2$, $SOBr_2$, and $SOI_2$. In some embodiments, the halide-containing chemistry may be flowed with or without inert/carrier gas such as He, Ne, Ar, Xe, and Na.

The thermal development process may be done without plasma. By applying a non-plasma thermal approach, productivity can be significantly improved as multiple wafers can be batch developed, at the same time in a low-cost thermal vacuum chamber/oven. However, in some embodiments, the thermal development process may be followed by exposure to plasma. Subsequent exposure to plasma may occur for desorption, descumming, smoothing, or other processing operations.

In plasma development processes, the photopatterned metal-containing EUV resist is exposed to development chemistry including radicals/ions of one or more gases. A process chamber for processing the semiconductor substrate may be a plasma-generating chamber or coupled to a plasma-generating chamber remote from the process chamber. Dry development may occur by remote plasma in some embodiments. The plasma-generating chamber may be an inductively-coupled plasma (ICP) reactor, transformer-coupled plasma (TCP) reactor, or capacitively-coupled plasma (CCP) reactor, employing equipment and techniques among those known in the art. An electromagnetic field acts on the one or more gases to produce a plasma in the plasma-generating chamber. Ions and/or radicals from the remote plasma may interact with the photopatterned metal-containing EUV resist. In some embodiments, a vacuum line is coupled to the process chamber for pressure control, and a development chemistry line may be coupled to the plasma-generating chamber for delivery of the one or more gases into the plasma-generating chamber. The process chamber may include one or more heaters for temperature control, such as heaters coupled to a substrate support in the process chamber for substrate temperature control. In some embodiments, the process chamber interior can be coated with corrosion resistant films, such as organic polymers or inorganic coatings. One such coating is polytetrafluoroethylene (PTFE), e.g., Teflon 1M. Such materials can be used in thermal processes of this disclosure without risk of removal by plasma exposure.

In plasma development processes, the photopatterned metal-containing EUV resist is exposed to remote plasma under conditions that are optimized for etch selectivity between exposed and unexposed regions. The conditions may be optimized for generating a gentle plasma, where a gentle plasma can be characterized by high pressure and low power. Chamber pressure may be tuned, where chamber pressure may influence etch selectivity between exposed and unexposed regions during development. In some embodiments, the chamber pressure may be equal to or greater than about 5 mTorr, or equal to or greater than about 15 mTorr. In some embodiments, the chamber pressure may be relatively high with high flow and accompanied by dilution, where the chamber pressure may be between about 100 Torr and about 760 Torr or between about 200 Torr and about 760 Torr. RF power levels may be tuned, where RF power may affect etch selectivity, roughness, descumming, and other characteristics of development. In some embodiments, the RF power may be equal to or less than about 1000 W, equal to or less than about 800 W, or equal to or less than about 500 W. Temperature may be tuned, where temperature may influence various aspects of development such as etch selectivity. In some embodiments, a temperature may be between about −60° C. and about 300° C., between about 0° C. and about 300° C., or between about 30° C. and about 120° C. Gas flow rate may be tuned, where gas flow may influence etch selectivity between exposed and unexposed regions during development. In some embodiments, gas flow rate is between about 50 sccm and about 2000 sccm, between about 100 sccm and about 2000 sccm, or between about 200 sccm and about 1000 sccm, such as about 500 sccm. Duration of exposure may be tuned in the plasma development process. The duration of exposure may depend on how much resist is desired to be removed, development chemistry, amount of crosslinking in the resist, and composition and properties of the resist, among other factors. In some embodiments, duration of exposure may be between about 1 second and about 50 minutes, between about 3 seconds and about 20 minutes, or between about 10 seconds and about 6 minutes.

Plasma development processes may expose the photopatterned metal-containing EUV resist to radicals of certain halide-containing gases. In some embodiments, the radicals are generated from a remote plasma source. For example, the plasma development may expose the photopatterned metal-containing EUV resist to radicals of hydrogen and halide gases generated from the remote plasma source. In some embodiments, a halide-containing gas includes a hydrogen halide, hydrogen and halogen gas, boron trichloride, an organic halide, an acyl halide, a carbonyl halide, a thionyl halide, or mixtures thereof. A hydrogen halide can include but is not limited to hydrogen fluoride (HF), hydrogen chloride (HCl), hydrogen bromide (HBr), and hydrogen iodide (HI). For example, the hydrogen halide may be HCl or HBr. Hydrogen and halogen gas can include but is not limited to hydrogen gas ($H_2$) mixed with fluorine gas ($F_2$), chlorine gas ($Cl_2$), bromine gas ($Br_2$), or iodine gas ($I_2$). An organic halide can include but is not limited to $C_xH_yF_z$, $C_xH_yCl_z$, $C_xH_yBr_z$, and $C_xH_yI_z$, where x, y, and z are values equal to or greater than 0. An acyl halide can include but is not limited to $CH_3COF$, $CH_3COCl$, $CH_3COBr$, and $CH_3COI$. A carbonyl halide can include but is not limited to $COF_2$, $COCl_2$, $COBr_2$, and $COI_2$. A thionyl halide can include but is not limited to $SOF_2$, $SOCl_2$, $SOBr_2$, and $SOI_2$. In some embodiments, the halide-containing gas may be flowed with or without inert/carrier gas such as He, Ne, Ar, Xe, and Na.

Descum/Smoothing/Curing

In some instances, there may be scum (material in the open portions of the unexposed, for example, regions of the EUV resist after development, most likely with high metal concentrations, like clusters), or roughness (the same composition, but on the sidewalls of the etched features in the developed pattern). Both of these challenges can be largely attributed to stochastics and the non-optimal Gaussian distribution of the light resulting in partially or fully exposed material in areas where the resist should remain unexposed or vice versa.

Process conditions for a descumming and smoothing operations may be controlled during or after development. In some embodiments, reactant flow may be between about 50 sccm and about 1000 sccm or between about 100 sccm and about 500 sccm, such as about 500 sccm He. In some embodiments, a temperature may be between about −60° C. and about 120° C., between about −20° C. and about 60° C., or between about 20° C. and about 40° C., such as about 20° C. In some embodiments, chamber pressure may be between about 1 mTorr and about 300 mTorr, between about 5 mTorr and about 100 mTorr, between about 5 mTorr and about 20 mTorr, such as about 10 mTorr. The plasma power may be relatively low with high ion energy. In some embodiments, plasma power may be between about 50 W and about 1000 W, between about 100 W and about 500 W, or between about 100 W and about 300 W, such as about 300 W. In some embodiments, the wafer bias is between about 10 V and about 500 V, between about 50 V and about 300 V, such as about 200 V. The plasma may be generated using a high RF frequency. In some embodiments, the RF frequency is 13.56 MHz. The duration of exposure to inert gas plasma may be relatively short so as to avoid excess exposure to UV radiation during plasma exposure. In some embodiments, the duration of exposure is between about 0.5 seconds and about 5 seconds, between about 1 second and about 3 seconds, such as about 2 seconds.

The He desorption descum and cleaning of the unexposed resist residue can have the collateral benefit of curing the exposed resist to harden it thereby enhancing its hard mask function in subsequent operations to etch the underlying substrate. This resist hardening is achieved by exposure of the EUV exposed resist to UV radiation generated by the He plasma, which may be continued after the descum/smoothing is complete with the bias turned off. The He plasma curing may alternatively be performed if no descum/smoothing is needed or performed.

In some embodiments, the He plasma descum/smoothing may be cycled with dry development, as described above, for enhanced results. In this way, most of the organic component of the unexposed, for example, region of the pattern is removed by the dry development, then a short He plasma operation can remove some of the concentrated metal at the surface, opening up access to the remaining underlying organic material, that can then be removed in a subsequent dry development operation/cycle. Another cycle of He plasma may be used to remove any remaining metal to leave a clean and smooth feature surface. The cycling can be continued until all or substantially all the scum and roughness residue is removed to leave a clean and smooth feature surface.

In some embodiments, He desorption descum and smoothing may be used with a wet development process. Wet development has very high selectivity and has been shown to exhibit clear on/off behavior, resulting in inability of a wet development process to remove areas that were mistakenly partially or fully exposed. The remaining residues are then left after the wet development process, resulting in scumming and high line edge and width roughness. Interestingly, due to the tunability of the dry development process in which the etch rate and selectivity can be tuned based on multiple knobs, (e.g., time, temperature, pressure, gas/flow) it can be further applied to descum and smooth metal containing resist lines by removing these partially exposed residues.

Apparatus

Current EUV resist coating technology typically uses a spin-on resist which is applied in atmosphere. This technique does not allow for atmospheric control or influence and only allows only a single chemical mixture to be applied for the entire film stack.

A chamber as shown in Figures #AW and #AX below incorporates a number of elements to enable the dry deposition of EUV resist, including a four-zone electrostatic chuck to deliver temperature control of the wafer substrate to +/−0.5 C, and a four precursor vapor delivery system plumbed to a dual plenum gas distribution plate.

In various embodiments, the chamber, gas distribution plate and related delivery plumbing are all heated to prevent the condensation of any of the precursors.

In various embodiments, a gas box is also incorporated to deliver the needed gas constituents to the chamber.

In various embodiments, the ESC is RF-powered to enhance the cleaning capability of the chamber.

In various embodiments, the gate valve and all interior chamber components are heated to prevent or minimize the deposition other than on the wafer surface.

In various embodiments, a gas exclusion ring is used around the periphery of the wafer to prevent deposition on the backside and on the top edge bevel.

Among the innovations in these designs is in coupling different technical elements into one chamber to achieve a desired deposition performance. The uniformity of the wafer temperature, the gradiated distribution of the chemical constituents through the gas distribution plate, the deposition exclusion ring, and the heated chamber surfaces work in conjunction in various embodiments, to achieve remarkable film properties.

In some embodiments a dual plenum fractal (DPF) showerhead may be used during operations described herein. The dual-plenum fractal showerheads discussed herein may be configured to evenly distribute processing gases to a processing volume located above a semiconductor wafer in a semiconductor processing chamber. This may help promote more uniform wafer processing, as the entire wafer surface will generally be simultaneously exposed to such a process gas, as opposed to, for example, a showerhead where process gas flows out of the center of the showerhead for some time before flowing out of the periphery of the showerhead. Further details of a DPF showerhead are described in U.S. Pat. App. No. 62/914,616, titled DUAL PLENUM SHOWERHEAD, the disclosure of which is incorporated herein at least relating to configuration of a process chamber.

Figure 4:
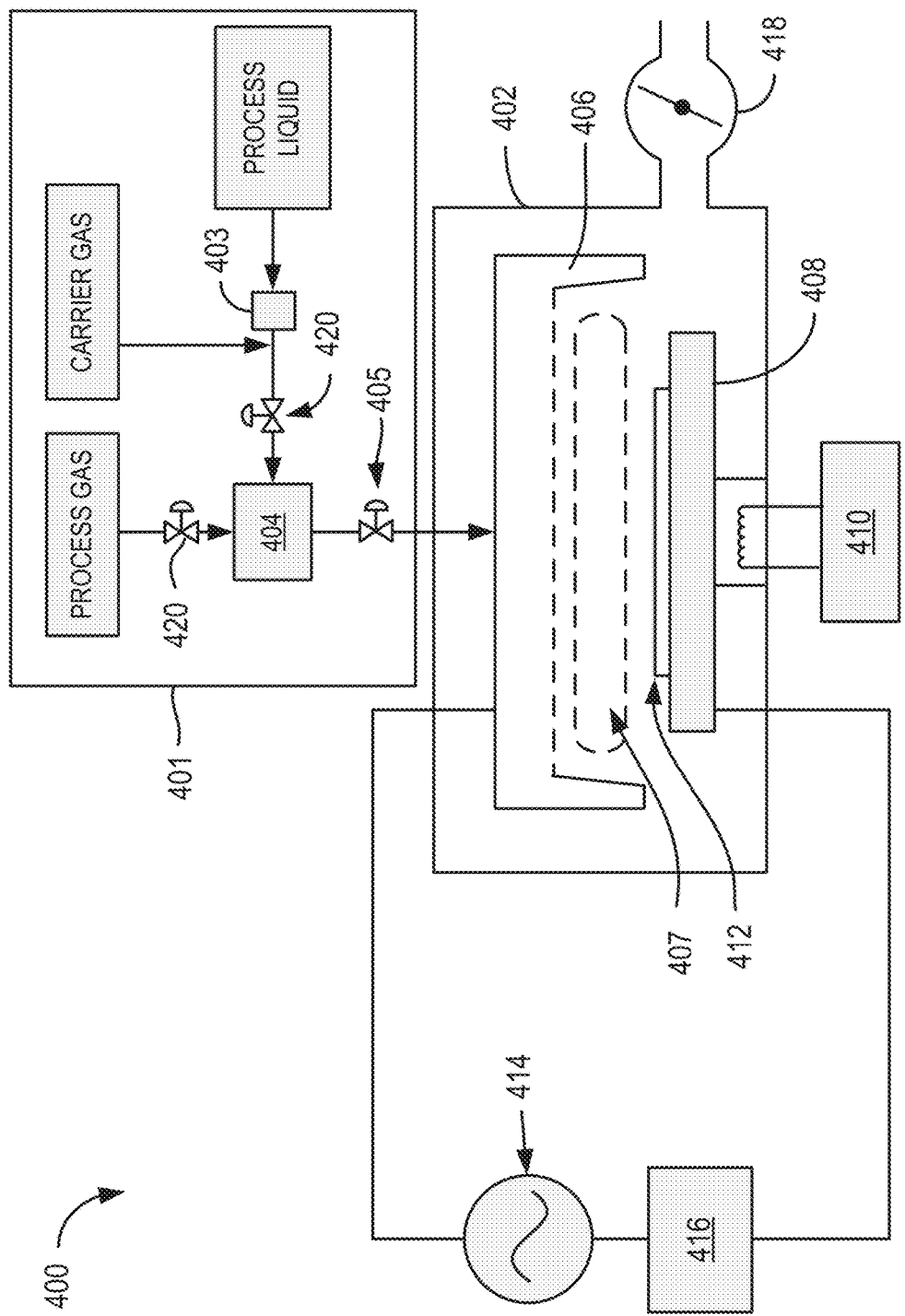
FIGS. 4-9 are schematic diagrams of examples of process chambers for performing methods in accordance with disclosed embodiments.
Figure 5:
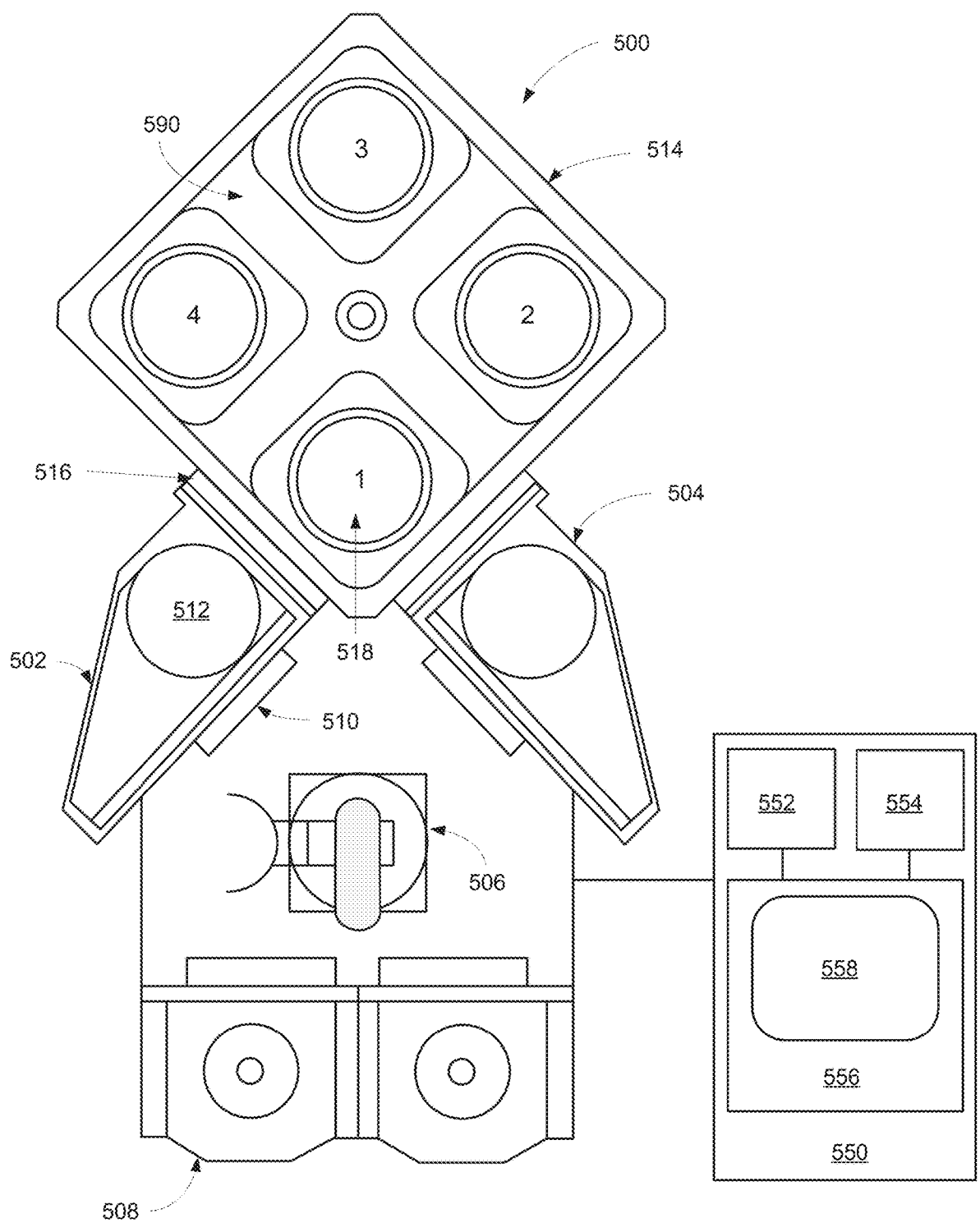

FIG. 4 depicts a schematic illustration of an embodiment of process station 400 having a process chamber body 402 for maintaining a low-pressure environment that is suitable for implementation of described dry development, clean, rework, descum and smoothing embodiments. A plurality of process stations 400 may be included in a common low pressure process tool environment. For example, FIG. 5 depicts an embodiment of a multi-station processing tool 500, such as a VECTOR® processing tool available from Lam Research Corporation, Fremont, CA In some embodiments, one or more hardware parameters of the process station 400 including those discussed in detail below may be adjusted programmatically by one or more computer controllers 450.

A process station may be configured as a module in a cluster tool. FIG. 7 depicts a semiconductor process cluster tool architecture with vacuum-integrated deposition and patterning modules suitable for implementation of the embodiments described herein. Such a cluster process tool architecture can include resist deposition, resist exposure (EUV scanner), resist dry development and etch modules, as described above and further below with reference to FIGS. 6 and 7.

In some embodiments, certain of the processing functions can be performed consecutively in the same module, for example dry development and etch. Embodiments of this disclosure are directed to methods and apparatus for receiving a wafer, including a photopatterned EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 4, process station 400 fluidly communicates with reactant delivery system 401a for delivering process gases to a distribution showerhead 406. Reactant delivery system 401a optionally includes a mixing vessel 404 for blending and/or conditioning process gases, for delivery to showerhead 406. One or more mixing vessel inlet valves 420 may control introduction of process gases to mixing vessel 404. Where plasma exposure is used, plasma may also be delivered to the showerhead 406 or may be generated in the process station 400. As noted above, in at least some embodiments, non-plasma thermal exposure is favored.

FIG. 4 includes an optional vaporization point 403 for vaporizing liquid reactant to be supplied to the mixing vessel 404. In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a suitable computer controller 450.

In some embodiments, pedestal 408 may be temperature controlled via heater 410. In some embodiments, the pedestal 408 may be heated to a temperature of greater than 0° C. and up to 300° C. or more, for example 50 to 120° C., such as about 65 to 80° C., during non-plasma thermal exposure of a photopatterned resist to dry development chemistry, such as HBr, HCl, or $BCl_3$, as described in disclosed embodiments.

Further, in some embodiments, pressure control for process station 400 may be provided by a butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

Where plasma may be used, for example in gentle plasma-based dry development embodiments and/or etch operations conducted in the same chamber, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are up to about 500 W.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a dry development chemistry reactant gas, such as HBr or HCl, and time delay instructions for the recipe phase. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment to treat the silicon nitride surface in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between dry development and etch process modes. Additionally or alternatively, in some embodiments, processing chamber 514 may include one or more matched pairs of dry development and etch process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog, and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling various gas compositions (e.g., HBr or HCl gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate dry development and/or etch processes according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 6:
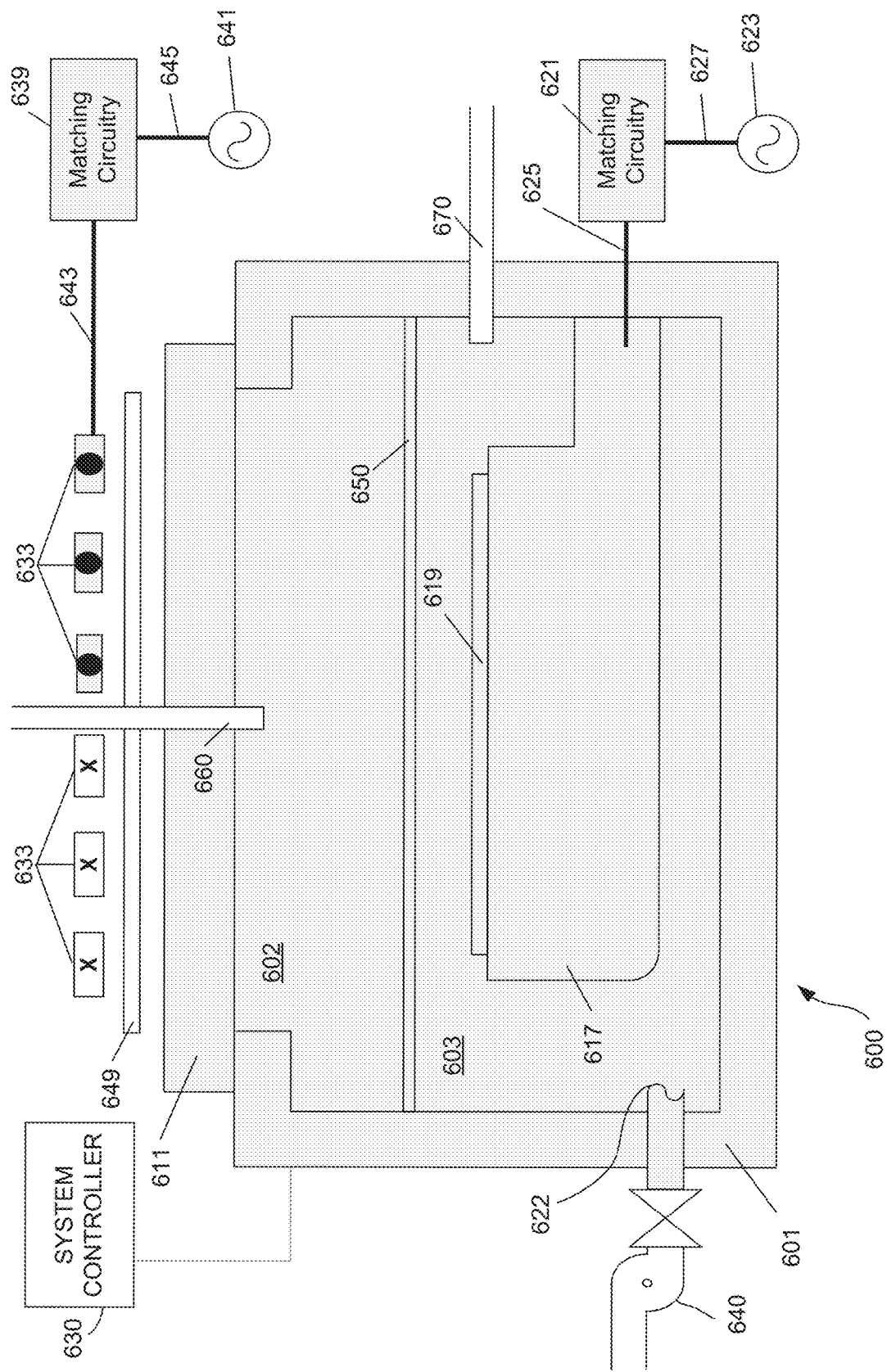
Figure 7:
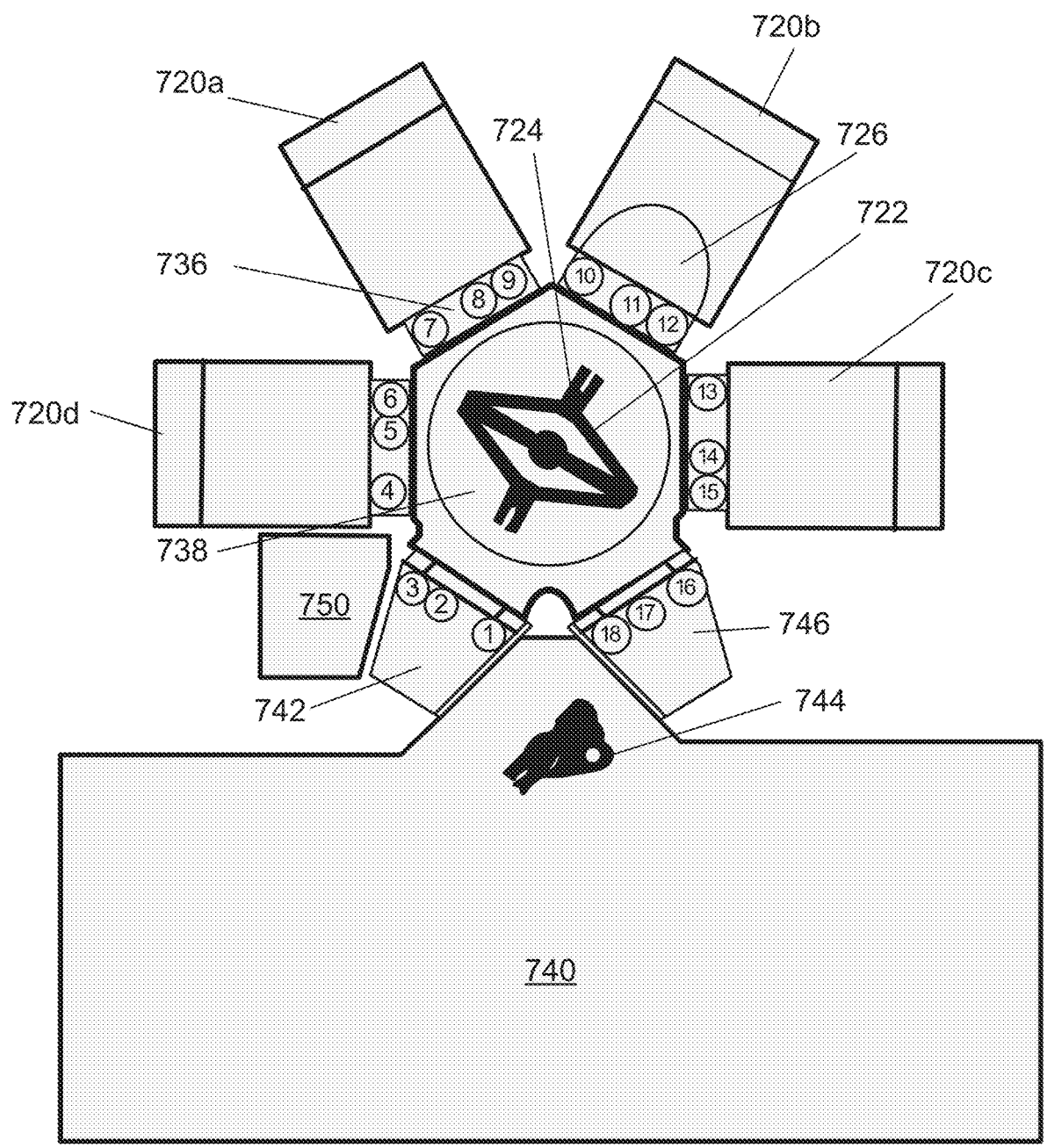

FIG. 6 schematically shows a cross-sectional view of an inductively coupled plasma apparatus 600 appropriate for implementing certain embodiments or aspects of embodiments such as dry development and/or etch, an example of which is a Kiyo® reactor, produced by Lam Research Corp. of Fremont, CA In other embodiments, other tools or tool types having the functionality to conduct the dry development and/or etch processes described herein may be used for implementation.

The inductively coupled plasma apparatus 600 includes an overall process chamber 624 structurally defined by chamber walls 601 and a window 611. The chamber walls 601 may be fabricated from stainless steel or aluminum. The window 611 may be fabricated from quartz or other dielectric material. An optional internal plasma grid 650 divides the overall process chamber into an upper sub-chamber 602 and a lower sub chamber 603. In most embodiments, plasma grid 650 may be removed, thereby utilizing a chamber space made of sub chambers 602 and 603. A chuck 617 is positioned within the lower sub-chamber 603 near the bottom inner surface. The chuck 617 is configured to receive and hold a semiconductor wafer 619 upon which the etching and deposition processes are performed. The chuck 617 can be an electrostatic chuck for supporting the wafer 619 when present. In some embodiments, an edge ring (not shown) surrounds chuck 617, and has an upper surface that is approximately planar with a top surface of the wafer 619, when present over chuck 617. The chuck 617 also includes electrostatic electrodes for chucking and dechucking the wafer 619. A filter and DC clamp power supply (not shown) may be provided for this purpose. Other control systems for lifting the wafer 619 off the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 633 is positioned above window 611. In some embodiments, a coil is not used in disclosed embodiments. The coil 633 is fabricated from an electrically conductive material and includes at least one complete turn. The example of a coil 633 shown in FIG. 6 includes three turns. The cross sections of coil 633 are shown with symbols, and coils having an "X" extend rotationally into the page, while coils having a "●" extend rotationally out of the page. Elements for plasma generation also include an RF power supply 641 configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649a is positioned between the coil 633 and the window 611. The Faraday shield 649a may be maintained in a spaced apart relationship relative to the coil 633. In some embodiments, the Faraday shield 649a is disposed immediately above the window 611. In some embodiments, the Faraday shield 649b is between the window 611 and the chuck 617. In some embodiments, the Faraday shield 649b is not maintained in a spaced apart relationship relative to the coil 633. For example, the Faraday shield 649b may be directly below the window 611 without a gap. The coil 633, the Faraday shield 649a, and the window 611 are each configured to be substantially parallel to one another. The Faraday shield 649a may prevent metal or other species from depositing on the window 611 of the process chamber 624.

Process gases may be flowed into the process chamber through one or more main gas flow inlets 660 positioned in the upper sub-chamber 602 and/or through one or more side gas flow inlets 670. Likewise, though not explicitly shown, similar gas flow inlets may be used to supply process gases to a capacitively coupled plasma processing chamber. A vacuum pump, e.g., a one or two stage mechanical dry pump and/or turbomolecular pump 640, may be used to draw process gases out of the process chamber 624 and to maintain a pressure within the process chamber 624. For example, the vacuum pump may be used to evacuate the lower sub-chamber 603 during a purge operation of ALD. A valve-controlled conduit may be used to fluidically connect the vacuum pump to the process chamber 624 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 600, one or more process gases may be supplied through the gas flow inlets 660 and/or 670. In certain embodiments, process gas may be supplied only through the main gas flow inlet 660, or only through the side gas flow inlet 670. In some cases, the gas flow inlets shown in the figure may be replaced by more complex gas flow inlets, one or more showerheads, for example. The Faraday shield 649a and/or optional grid 650 may include internal channels and holes that allow delivery of process gases to the process chamber 624. Either or both of Faraday shield 649a and optional grid 650 may serve as a showerhead for delivery of process gases. In some embodiments, a liquid vaporization and delivery system may be situated upstream of the process chamber 624, such that once a liquid reactant or precursor is vaporized, the vaporized reactant or precursor is introduced into the process chamber 624 via a gas flow inlet 660 and/or 670.

Radio frequency power is supplied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The physical and chemical interactions of various generated ions and radicals with the wafer 619 etch features of and selectively deposit layers on the wafer 619.

If the plasma grid 650 is used such that there is both an upper sub-chamber 602 and a lower sub-chamber 603, the inductive current acts on the gas present in the upper sub-chamber 602 to generate an electron-ion plasma in the upper sub-chamber 602. The optional internal plasma grid 650 limits the amount of hot electrons in the lower sub-chamber 603. In some embodiments, the apparatus 600 is designed and operated such that the plasma present in the lower sub-chamber 603 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 603 through port 622. The chuck 617 disclosed herein may operate at elevated temperatures ranging between about 10° C. and about 250° C. The temperature will depend on the process operation and specific recipe.

Apparatus 600 may be coupled to facilities (not shown) when installed in a clean room or a fabrication facility. Facilities include plumbing that provide processing gases, vacuum, temperature control, and environmental particle control. These facilities are coupled to apparatus 600, when installed in the target fabrication facility. Additionally, apparatus 600 may be coupled to a transfer chamber that allows robotics to transfer semiconductor wafers into and out of apparatus 600 using typical automation.

In some embodiments, a system controller 630 (which may include one or more physical or logical controllers) controls some or all of the operations of a process chamber 624. The system controller 630 may include one or more memory devices and one or more processors. In some embodiments, the apparatus 600 includes a switching system for controlling flow rates and durations when disclosed embodiments are performed. In some embodiments, the apparatus 600 may have a switching time of up to about 600 ms, or up to about 750 ms. Switching time may depend on the flow chemistry, recipe chosen, reactor architecture, and other factors.

In some implementations, the system controller 630 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 630, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 630 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 630, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 630 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 630 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWINSCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 7 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some implementations.

FIG. 7 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 738 interfaces with four processing modules 720a-720d, which may be individually optimized to perform various fabrication processes. By way of example, processing modules 720a-720d may be implemented to perform deposition, evaporation, ELD, dry development, etch, strip, and/or other semiconductor processes. For example, module 720a may be an ALD reactor that may be operated to perform in a non-plasma, thermal atomic layer depositions as described herein, such as Vector tool, available from Lam Research Corporation, Fremont, CA And module 720b may be a PECVD tool, such as the Lam Vector®. It should be understood that the figure is not necessarily drawn to scale.

Airlocks 742 and 746, also known as a loadlocks or transfer modules, interface with the VTM 738 and a patterning module 740. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as H2O, O2, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 7 but without the integrated patterning module.

Airlock 742 may be an "outgoing" loadlock, referring to the transfer of a substrate out from the VTM 738 serving a deposition module 720a to the patterning module 740, and airlock 746 may be an "ingoing" loadlock, referring to the transfer of a substrate from the patterning module 740 back in to the VTM 738. The ingoing loadlock 746 may also provide an interface to the exterior of the tool for access and egress of substrates. Each process module has a facet that interfaces the module to VTM 738. For example, deposition process module 720a has facet 736. Inside each facet, sensors, for example, sensors 1-18 as shown, are used to detect the passing of wafer 726 when moved between respective stations. Patterning module 740 and airlocks 742 and 746 may be similarly equipped with additional facets and sensors, not shown.

Main VTM robot 722 transfers wafer 726 between modules, including airlocks 742 and 746. In one embodiment, robot 722 has one arm, and in another embodiment, robot 722 has two arms, where each arm has an end effector 724 to pick wafers such as wafer 726 for transport. Front-end robot 744, in is used to transfer wafers 726 from outgoing airlock 742 into the patterning module 740, from the patterning module 740 into ingoing airlock 746. Front-end robot 744 may also transport wafers 726 between the ingoing loadlock and the exterior of the tool for access and egress of substrates. Because ingoing airlock module 746 has the ability to match the environment between atmospheric and vacuum, the wafer 726 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 742 may provide this function by holding the transferred wafers at a lower pressure, no higher than the pressure in the patterning module 740, for a period of time and exhausting any off-gassing, so that the optics of the patterning tool 740 are not contaminated by off-gassing from the substrate. A suitable pressure for the outgoing, off-gassing airlock is no more than 1E-8 Torr.

Figure 8:
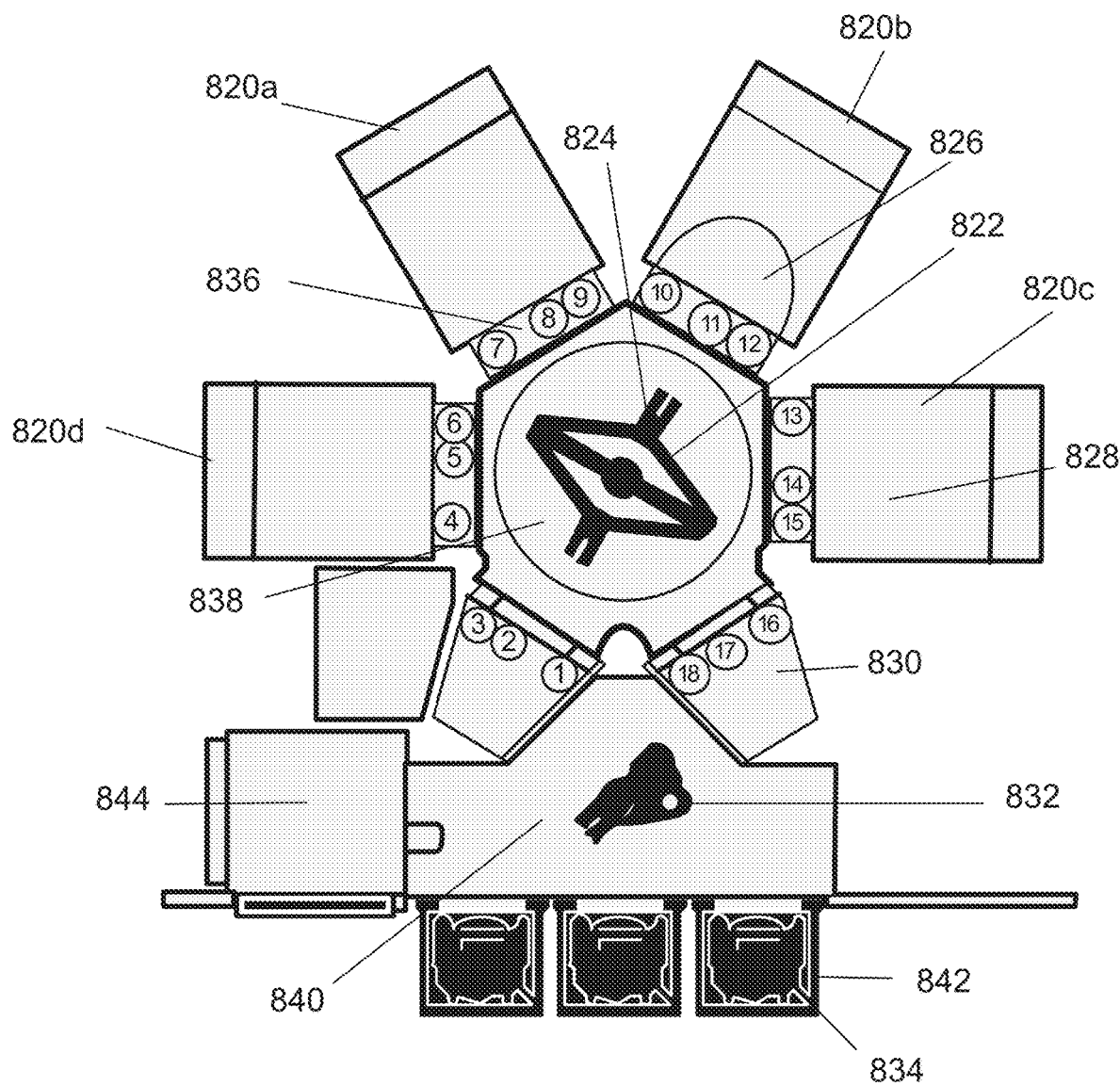

FIG. 8 presents an alternative semiconductor process cluster tool architecture to FIG. 7 that does not have a patterning module 740. Instead, Front-end robot 832, in atmospheric transfer module (ATM) 840, is used to transfer wafers 826 from cassette or Front Opening Unified Pod (FOUP) 834 in Load Port Module (LPM) 842 to airlock 830. Module center 828 inside process module 820 is one location for placing wafer 826. Aligner 844 in ATM 840 is used to align wafers.

In an exemplary processing method, a wafer is placed in one of the FOUPs 834 in the LPM 842. Front-end robot 832 transfers the wafer from the FOUP 834 to an aligner 844, which allows the wafer 826 to be properly centered before it is etched or processed. After being aligned, the wafer 826 is moved by the front-end robot 832 into an airlock 830. Because airlock modules have the ability to match the environment between an ATM and a VTM, the wafer 826 is able to move between the two pressure environments without being damaged. From the airlock module 830, the wafer 826 is moved by robot 822 through VTM 838 and into one of the process modules 820a-820d. In order to achieve this wafer movement, the robot 822 uses end effectors 824 on each of its arms. Once the wafer 826 has been processed, it is moved by robot 822 from the process modules 820a-820d to an airlock module 830. From here, the wafer 826 may be moved by the front-end robot 832 to one of the FOUPs 834 or to the aligner 844.

Figure 9:
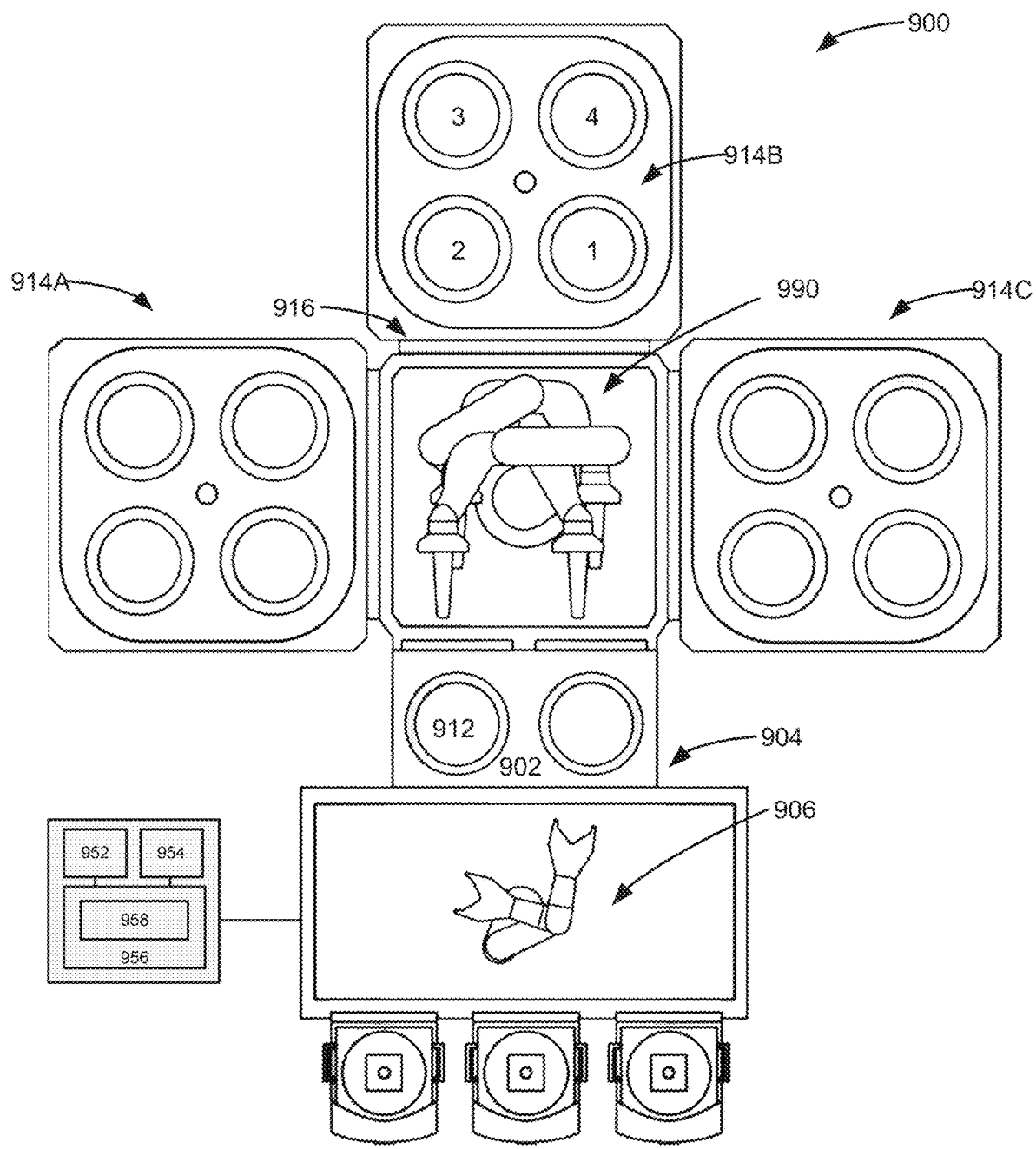

As described above, one or more process stations may be included in a multi-station processing tool. FIG. 9 shows a schematic view of an embodiment of a multi-station processing tool 900 with an inbound load lock 902 and an outbound load lock 904, either or both of which may comprise a remote plasma source. A robot 906, at atmospheric pressure, is configured to move substrates or wafers from a cassette loaded through a pod 908 into inbound load lock 902 via an atmospheric port 910. A substrate is placed by the robot 906 on a pedestal 912 in the inbound load lock 902, the atmospheric port 910 is closed, and the load lock is pumped down. Where the inbound load lock 902 comprises a remote plasma source, the substrate may be exposed to a remote plasma treatment in the load lock prior to being introduced into a processing chamber 914A-C. Further, the substrate also may be heated in the inbound load lock 902 as well, for example, to remove moisture and adsorbed gases. Next, a chamber transport port 916 to one of processing chambers 914A-C is opened, and another robot (not shown) places the substrate into the reactor on a pedestal of a first station shown in the reactor for processing. While the embodiment depicted in FIG. 9 includes load locks, it will be appreciated that, in some embodiments, direct entry of a substrate into a process station may be provided. In various embodiments, the soak gas is introduced to the station when the substrate is placed by the robot 906 on the pedestal 912.

The depicted processing chamber 914B comprises four process stations, numbered from 1 to 4 in the embodiment shown in FIG. 9. Each station has a heated pedestal (shown at 918 for station 1), and gas line inlets. It will be appreciated that in some embodiments, each process station may have different or multiple purposes. For example, in some embodiments, a process station may be switchable between an ALD and PEALD process mode. Additionally or alternatively, in some embodiments, processing chamber 914 may include one or more matched pairs of ALD and plasma-enhanced ALD process stations. While the depicted processing chamber 914 includes four stations, it will be understood that a processing chamber according to the present disclosure may have any suitable number of stations. For example, in some embodiments, a processing chamber may have five or more stations, while in other embodiments a processing chamber may have three or fewer stations. Furthermore, while FIG. 5A depicts a multi-station processing tool 900 having three process chambers, in some embodiments a multi-station processing tool may have four process chambers, such as depicted in FIG. 9B. In some embodiments a multi-station processing tool may have four or more process chambers, while in other embodiments a multi-station processing tool may have one, two, or three process chambers.

FIG. 9 depicts an embodiment of a wafer handling system 990 for transferring substrates within processing chamber 914. In some embodiments, wafer handling system 990 may transfer substrates between various process stations and/or between a process station and a load lock. It will be appreciated that any suitable wafer handling system may be employed. Non-limiting examples include wafer carousels and wafer handling robots. FIG. 9 also depicts an embodiment of a system controller 950 employed to control process conditions and hardware states of process tool 900. System controller 950 may include one or more memory devices 956, one or more mass storage devices 954, and one or more processors 952. Processor 952 may include a CPU or computer, analog and/or digital input/output connections, stepper motor controller boards, etc. In some embodiments, system controller 950 includes machine-readable instructions for performing operations such as those described herein.

In some embodiments, system controller 950 controls the activities of process tool 900. System controller 950 executes system control software 958 stored in mass storage device 954, loaded into memory device 956, and executed on processor 952. Alternatively, the control logic may be hard coded in the system controller 950. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 958 may include instructions for controlling the timing, mixture of gases, amount of gas flow, chamber and/or station pressure, chamber and/or station temperature, substrate temperature, target power levels, RF power levels, substrate pedestal, chuck and/or susceptor position, and other parameters of a particular process performed by process tool 900. System control software 958 may be configured in any suitable way. For example, various process tool component subroutines or control objects may be written to control operation of the process tool components used to carry out various process tool processes. System control software 958 may be coded in any suitable computer readable programming language.

In various embodiments, chambers 914A-C may perform the same or different operations. Additionally, while three chambers 914A-C are shown, in some embodiments there may be four or more chambers, or three or fewer chambers. In some embodiments, each of chambers 914A-C may perform a dry deposition process to deposit a photolithographic layer. In some embodiments, one or more of chambers 914A-C may be used to for a dry deposition process, while different one or more of chambers 914A-C may be used for a dry development process as described herein. In some embodiments, one chamber may be used for a dry deposition process, one chamber may be used for a PAB process, and one chamber may be used for a dry development process. In some embodiments, a chamber used for a PAB process may also be used for a PEB process or alternatively used for a PEB process. In embodiments where there are four chambers, one chamber may be used for a dry deposition process, one chamber may be used for a PAB process, one chamber may be used for a PEB process, and one chamber may be used for a dry development process. In some embodiments, unequal process times can be addressed by different module ratios (e.g., if a PR deposition time is twice the PAB time, then the tool can be configured with twice the PR deposition modules as PAB modules).

In some embodiments, multi-station processing tool 900 may have different modules at each chamber to facilitate embodiments discussed herein. For example, a VECTOR® processing module may be used for deposition processes, and a KIYO® processing module may be used for PAB, PEB, or dry development processes. In some embodiments, a there may be different numbers of each type of module. For example, there may be one VECTOR module and one or more KIYO modules.

In some embodiments, multiple operations may be implemented on different pedestals within the same module(s) of the same tool. In some embodiments, a VECTOR module may be integrated in the same module as a KIYO module. For example, pedestals 1 and 3 of chamber 914 may be used for a dry deposition process, and pedestals 2 and 4 may be used for a different process, such as a wafer clean, PAB, PEB, or dry development process. A wafer may be processed on one pedestal to deposit a PR film, and then a robot may be configured to move the wafer to another pedestal within the chamber for a subsequent process as described herein. In this way, a vacuum may be maintained and indexing a wafer from pedestal to pedestal is faster than transferring wafers between process modules. As a result, efficiency (throughput) is enhanced without substantially sacrificing technical performance, and cross-contamination is controlled or minimized, resulting in excellent film properties.

In addition, each station/pedestal can be configured or optimized for each operation, and pedestals can be isolated from each other to reduce or minimize cross-contamination/cross-talk between deposition, clean, bake, irradiation, and development processes, for example by gas curtains or other station-specific barriers like gas seals, such as are described, for example, in U.S. Patent Application Publication No. 2015/0004798 and U.S. Patent Application Publication No. 2017/0101710, the disclosures of which in this regard are hereby incorporated by reference herein. Within ranges, each pedestal process can be at a different temperature and pressure. And each station's pedestal, showerhead, wall, etc. temperature can be independently set optimally for each process, without needing to cycle. Gas distribution to each station can be kept separate. By adding multiple throttle valves pressures can be independently maintained. In some embodiments, exhaust for each station can be local and not shared, so that the exhaust can stay independent without cross mixing/contamination of gases.

In some embodiments, integrated operations may be implemented on the same pedestal. For example, wafer cleaning and PAB/PEB operations may be implemented on the same pedestal. This may provide for enhanced throughput by reducing transfer or queue time between the wafer cleaning and bake operations.

FIGS. 10A-B, 11A-B 12A-B 13A-B and 14A-B illustrate various embodiments where processing operations may be performed within different chambers of a tool, along with a process flowchart illustrating operations that may be performed on or off the tool. In various embodiments the operations shown in FIGS. 10A-B, 11A-B 12A-B 13A-B and 14A-B may be the same as the those described in FIG. 1, above (as implied by the use of the same reference numbers). While a clean operation is not shown in FIGS. 10A-B, 11A-B 12A-13, 13A-13 and 14A-B, in some embodiments a clean operation may be performed. It should also be understood that some operations may not be performed, as explained further in reference to FIG. 1. FIG. 10A illustrates an embodiment where each chamber of a cluster tool performs a dry deposition process as shown in the process flow presented in FIG. 10B. Other operations in a lithography process, such as the PAB, EUV exposure, PEB, and development process may be performed on a different tool or cluster.

Figures 11A, 11B:
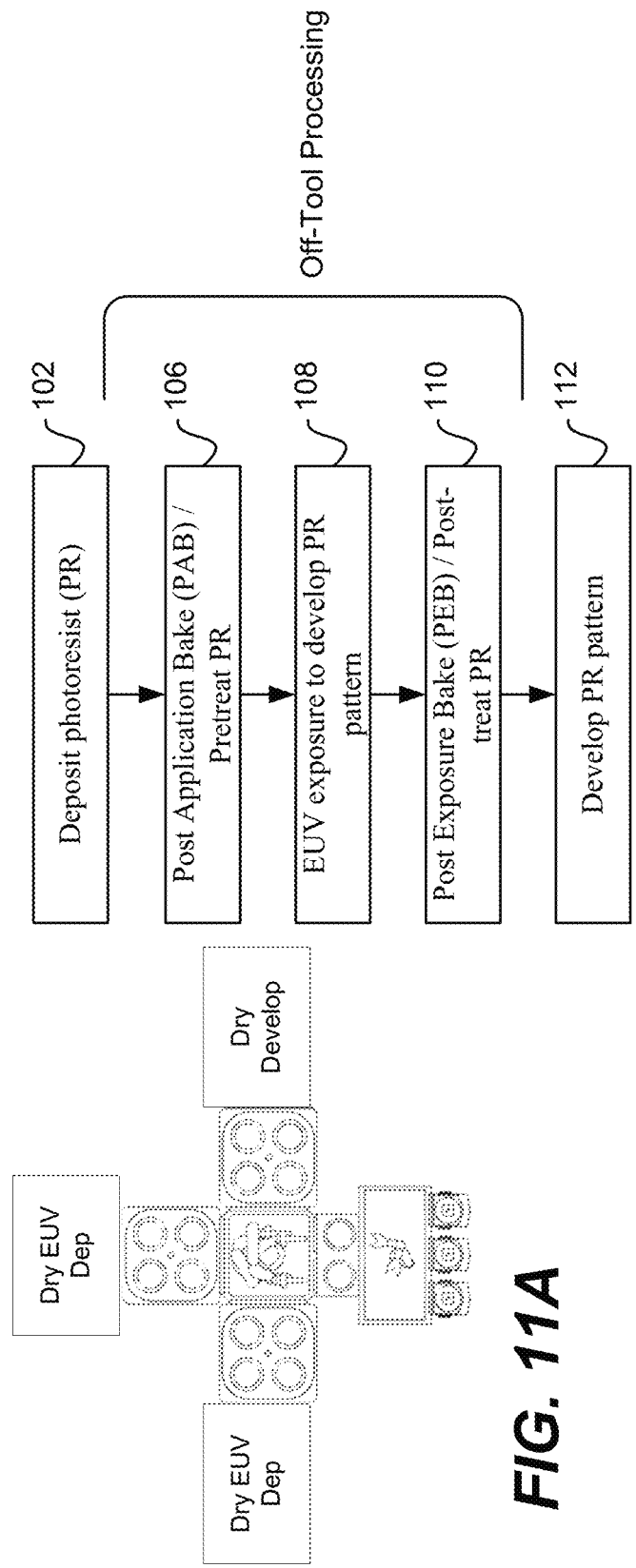
FIGS. 11A-B present schematic diagrams of various process cluster configurations in accordance with disclosed embodiments.

FIG. 11A illustrates an embodiment where a dry deposition and a dry development process may be performed within a single tool as shown in the process flow presented in FIG. 11B. In various embodiments two chambers may be used to a dry deposition process, while a single chamber is used for a dry development process. Other operations may be performed on a different tool.

FIG. 12A illustrates an embodiment where a dry deposition, a PAB, and a dry development are each performed within a single tool as shown in the process flow presented in FIG. 12B. In various embodiments one chamber may be used for each process. In some embodiments a substrate may have queue time between processes. In some embodiments queue time may be spent off the tool, for example in a FOUP or other controlled environment. In other embodiments a wafer may be moved directly from the dry EUV deposition chamber to the PAB chamber without a queue time, or may spend queue time in either process chamber. This may be advantageous to reduce queue time and/or maintain vacuum, both of which may improve the quality of the resulting PR film.

FIG. 13A illustrates an embodiment where a dry deposition, a PEB, and dry development process are performed within a single tool as shown in the process flow presented in FIG. 13B. In some embodiments, a PAB chamber and a PEB chamber may be the same chamber, while in other embodiments they are different chambers. As noted above, in some embodiments queue time may be spent off-tool in a controlled environment, while in other embodiments a wafer may be transferred directly from a PEB chamber to a development chamber. This may be advantageous to reduce queue time and/or maintain vacuum, both of which may improve the quality of the resulting PR film.

Figures 14A, 14B:
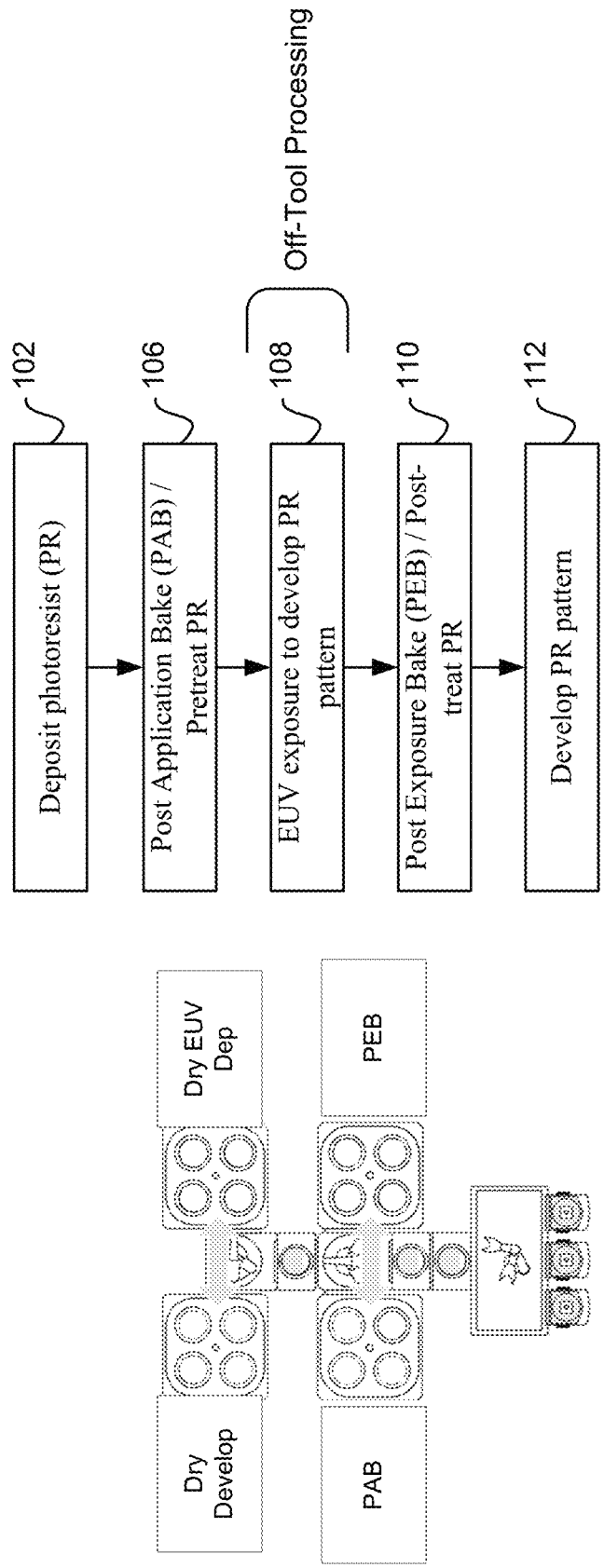
FIGS. 14A-B present schematic diagrams of various process cluster configurations in accordance with disclosed embodiments.

FIG. 14A illustrates an embodiment where dry deposition, PAB, PEB, and dry development are performed within a single tool as shown in the process flow presented in FIG. 14B. In some embodiments, radiation exposure may be performed off-tool in a separate scanner chamber. As noted above, in some embodiments queue time may be spent off-tool in a controlled environment, while in other embodiments a substrate may be moved directly from a dry deposition chamber to a PAB chamber, or a PEB chamber to a dry development chamber. In such embodiments queue time may be spent on-tool. Transfer of substrates between chambers on the same tool for different operations may be advantageous to reduce queue time and maintain vacuum/environmental control.

Figures 15A, 15B:
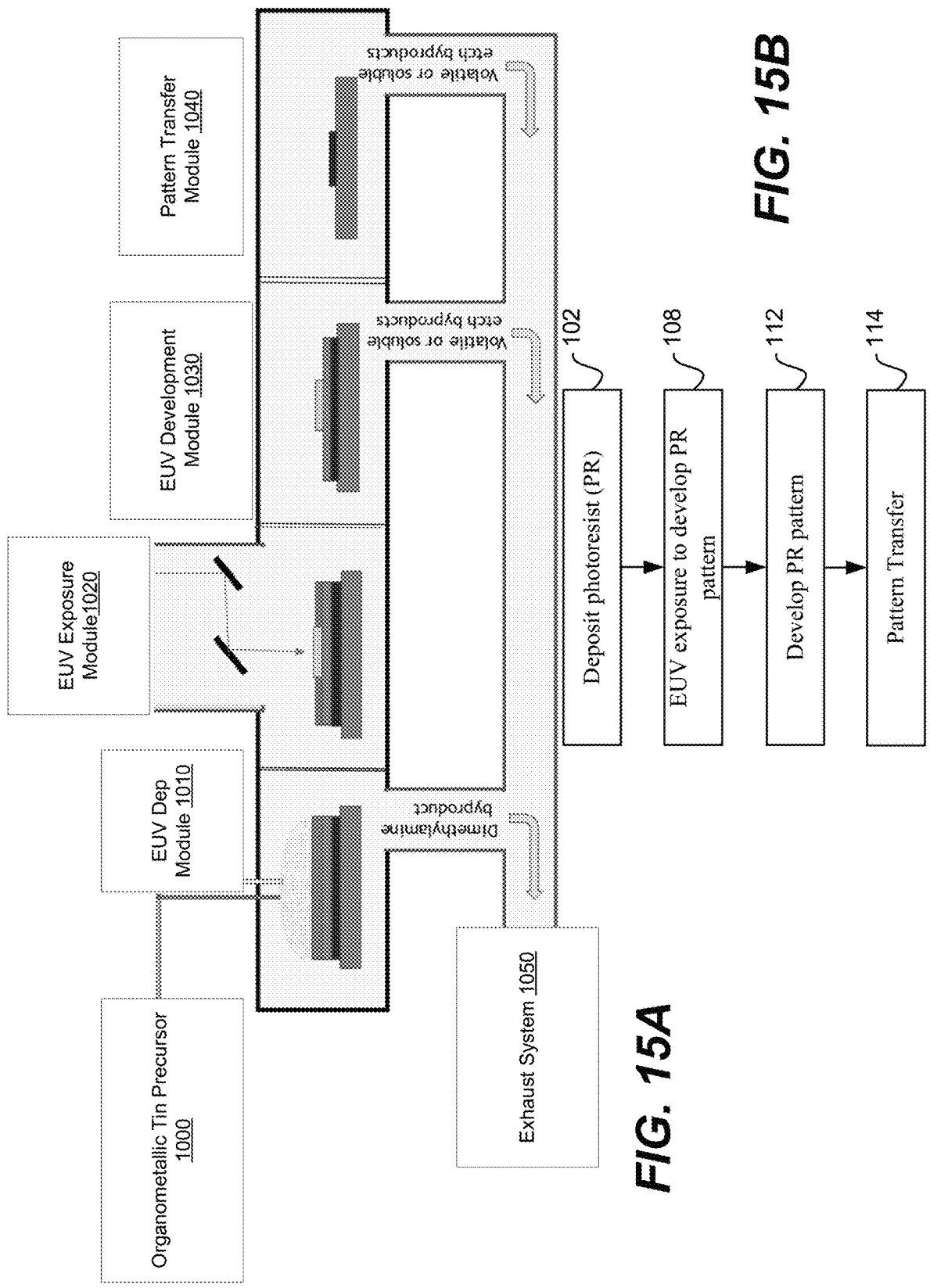
FIGS. 15A-B present schematic diagrams of various process cluster configurations in accordance with disclosed embodiments.

FIG. 15A illustrates an embodiment where a scanner may be integrated with a deposition chamber and/or a wet or dry development chamber. An organometallic tin precursor ampule 1000 and EUV deposition module 1010 may be used to dry deposit an EUV PR. An EUV exposure module 1020 may be used to expose portions of the EUV PR to radiation to chemically alter the exposed portions. An EUV development module 1030 may use a wet or dry process to remove portions of the EUV PR, which may treat the PR as a negative tone resist or a positive tone resist. A Pattern transfer module 1040 may then transfer the pattern of the EUV PR to an underlying layer, e.g., by an etch process forming lines based on the developed EUV PR pattern. In some embodiments, the byproducts from various processing environments may be shared or flow to a singular or multiple exhaust abatement systems 1050. In some embodiments a process flow as presented in FIG. 15B may be performed in the tools illustrated in FIG. 15A.

In some embodiments, a system controller (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, dry developing the photopatterned resist, and etching the underlying layer or layer stack using the patterned resist as a mask.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 6 or 7 may be implemented in any of FIG. 4, 5, 6, 7, 8, 9, 10A-B, 11A-B, 12A-B, 13A-B, 14A-B, or 15A-B, as well as the tool architectures described in FIGS. 16, 17, and 18.

FIGS. 16, 17, and 18A-B provide configurations for alternative processing tool architectures, such as may be implemented at least in part in the EOS or Sens.i products available from Lam Research Corporation, Fremont, CA, that may be used in some embodiments.

Figure 16:
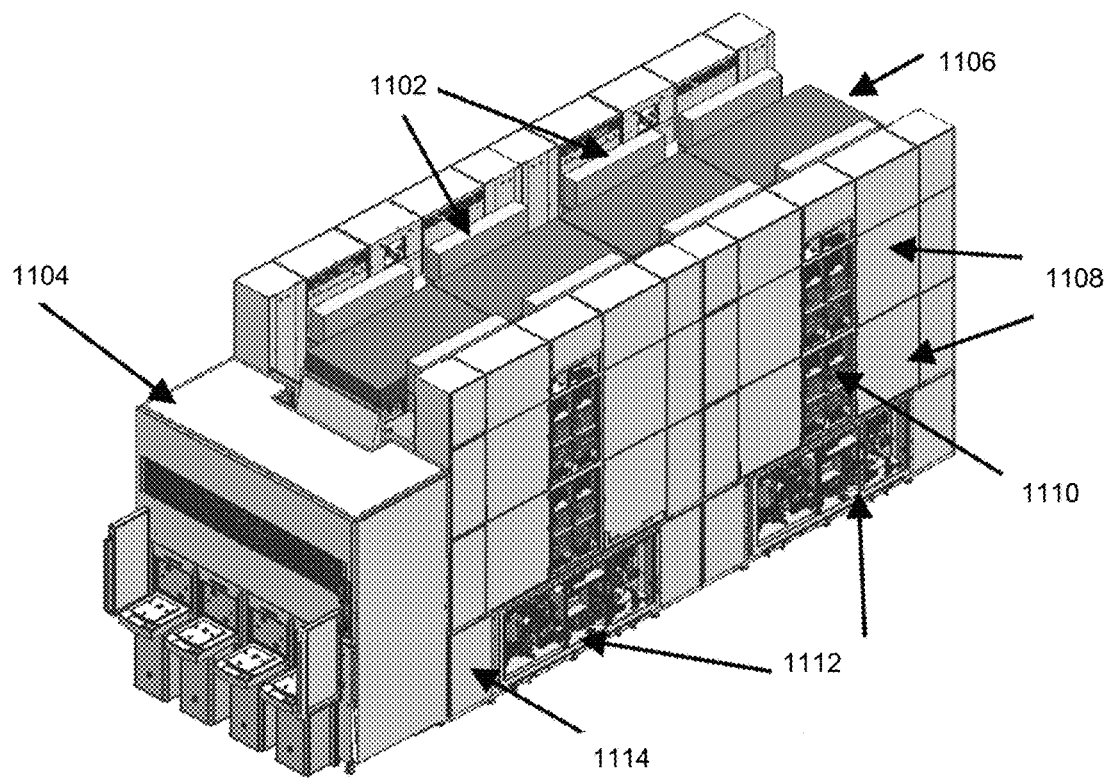
FIGS. 16-17 and 18A-B present various example tool architectures that may be used to perform methods in accordance with disclosed embodiments.

Starting with FIG. 16, a multi-station processing tool 1100 may have an equipment front end module (EFEM) for receiving substrates, optionally via a FOUP. As shown in FIG. 12, which is a cut-away view of the multi-station processing tool 1100, an EFEM robot 1204 may move substrates from EFEM 1104 through a loadport 1206. Substrates may be moved via one or more shuttles 1208, which may move substrates on linear tracks 1214 or lifters 1212. A wafer handling robot 1210 may then move substrates into a process chamber 1108 (in FIG. 17, 8 chambers are depicted for a total of 16 process chambers in multi-station processing tool 1100). Each process chamber may be switchable between various process modes as discussed herein.

Figure 17:
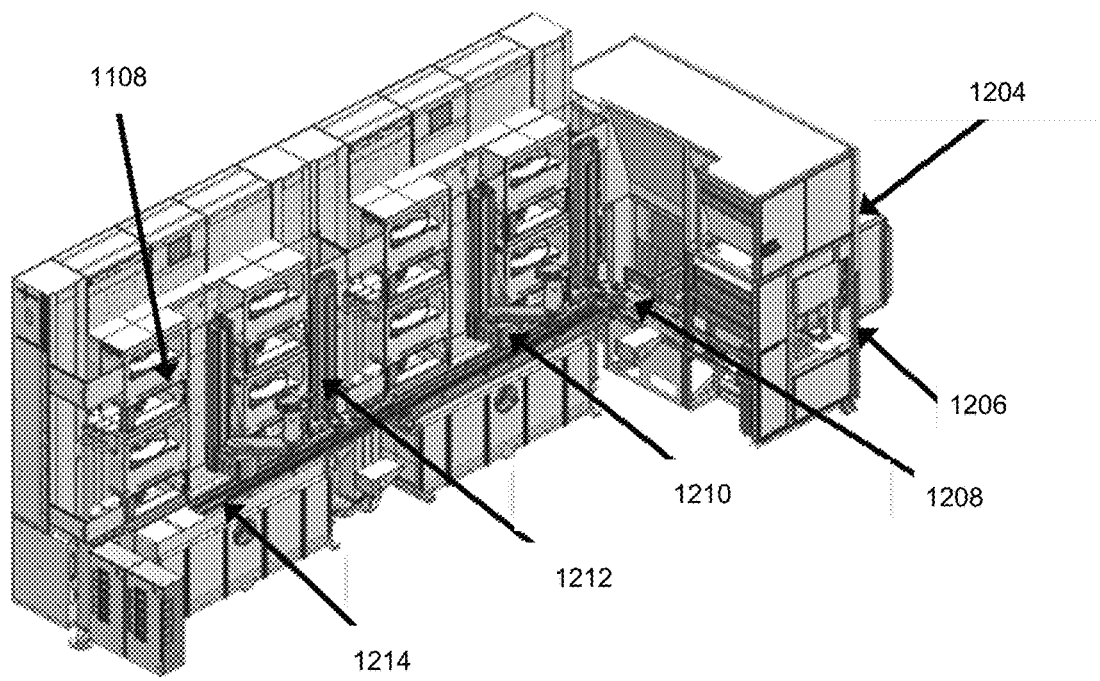

Returning to FIG. 16, multi-station processing tool 1100 may also have fluid delivery systems (FDS) 1112 to deliver process gas and other fluids to each process chamber, as well as FDS controls 1114. Fan filter units 1102 and 1106 may be used to ensure a clean environment in the process chambers as well as the corridor portion, respectively. In some embodiments resist processing tracks, as shown in FIGS. 16 and 17, may be used for implementation of wet development of dry deposited EUV PR.

Figure 18A:
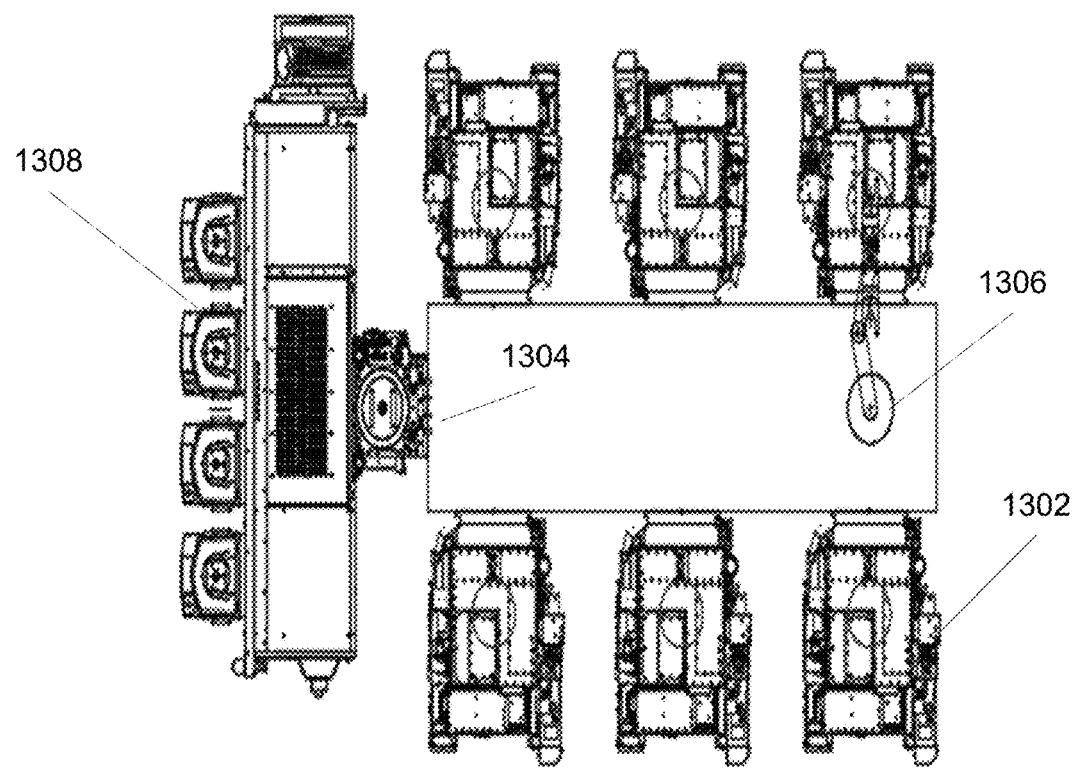
Figure 18B:
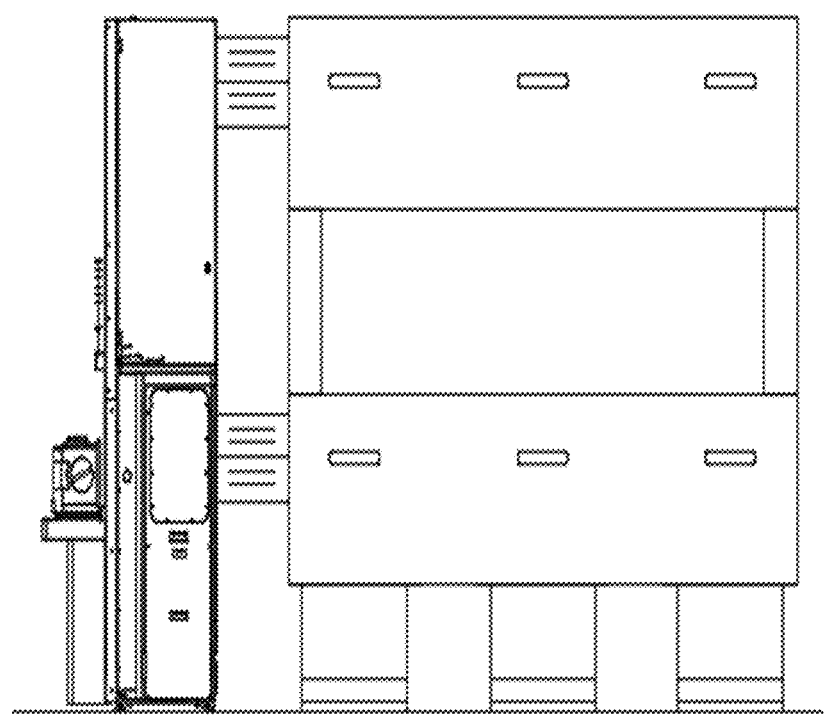

FIG. 18A presents to-down view of another multi-station processing tool 1300, having a robot 1304 that is configured to move wafers from a cassette loaded through a pod 1308. A second robot 1306 may move wafers to one of various process chambers 1302 for carrying out operations as described herein. FIG. 18B presents a side view of multi-station processing tool 1300. Various embodiments described herein may be performed using cluster architecture as shown in FIGS. 16, 17, and 18.

CONCLUSION

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An integrated lithography system, comprising:
   a plurality of reaction chambers within a cluster, the plurality of reaction chambers comprising:
      a photoresist (PR) deposition chamber;
      a post-exposure bake (PEB) chamber;
      a development chamber; and
      a substrate clean chamber;
   a controller that includes one or more processors and one or more memory devices, wherein the one or more memory devices store computer-executable instructions for controlling the one or more processors to:
      receive a substrate in the PR deposition chamber;
      deposit a PR on a surface of the substrate within the PR deposition chamber via a dry process comprising mixing a vapor stream of an organometallic precursor with a vapor stream of a counter-reactant;
      after depositing the PR, receive the substrate in the PEB chamber, wherein portions of the PR have been chemically altered by exposure to radiation to create a patterned PR;
      treat the patterned PR within the PEB chamber to modify material properties of the patterned PR; and
      dry develop the patterned PR within the development chamber by removing either an exposed portion or an unexposed portion of the patterned PR by a dry development process comprising exposure to a chemical compound to form a PR mask;
   wherein the computer-executable instructions further include instructions for controlling the one or more processors to, prior to the computer-executable instruction to receive the substrate in the PEB chamber:
      receive the substrate having the PR in the clean chamber; and
      perform a dry clean process to remove PR from a bevel edge and/or backside of the substrate.

2. The system of claim 1, wherein the PR is a metal-containing PR.

3. The system of claim 1, wherein the PR is an EUV PR.

4. The system of claim 1, wherein the plurality of reaction chambers further includes an underlayer deposition chamber, and the computer-executable instructions further include instructions for controlling the one or more processors to, prior to the computer-executable instruction to deposit a PR:
   deposit an underlayer on the surface of the substrate, wherein the underlayer increases adhesion of the PR to the substrate.

5. The system of claim 4, wherein the underlayer is deposited via a dry process.

6. The system of claim 1, wherein the plurality of reaction chambers further includes a pre-treatment chamber, and the computer-executable instructions further include instructions for controlling the one or more processors to, prior to the computer-executable instruction to deposit the PR:
   treat the surface of the substrate via a dry process to cause more chemical functional groups on the surface of the substrate to improve PR adhesion to the substrate.

7. The system of claim 1, wherein the plurality of reaction chambers further includes a lithography scanner, and the computer-executable instructions further include instructions for controlling the one or more processors to, prior to the computer-executable instruction to receive the substrate in the PEB chamber:
   receive the substrate in the lithography scanner; and
   expose portions of the PR to radiation to create a patterned PR.

8. The system of claim 1, wherein a reaction chamber of the plurality of reaction chambers is configured to perform a wafer clean process, a post-application bake process, a post-exposure bake process, a dry development process, or any combinations thereof.

9. The system of claim 1, wherein the development chamber and the PR deposition chamber, the PEB chamber, the substrate clean chamber, or any combinations thereof are the same chamber.

10. The system of claim 1, wherein the plurality of reaction chambers are each below atmospheric pressure, and the PR is under below-atmospheric pressure until after the dry development process.

11. The system of claim 1, wherein dry developing the patterned PR is performed at a pressure between about 100 Torr and about 760 Torr.

12. The system of claim 1, wherein an ambient environment of the substrate is controlled to reduce exposure of the photoresist to moisture prior to dry developing the patterned PR.

13. The system of claim 1, wherein the cluster comprises multiple PR deposition chambers.

14. An integrated lithography system, comprising:
   a plurality of reaction chambers within a cluster, the plurality of reaction chambers comprising:
      a photoresist (PR) deposition chamber;
      a post-exposure bake (PEB) chamber;
      a development chamber; and
      an underlayer deposition chamber;
   a controller that includes one or more processors and one or more memory devices, wherein the one or more memory devices store computer-executable instructions for controlling the one or more processors to:
      receive a substrate in the PR deposition chamber;
      deposit a PR on a surface of the substrate within the PR deposition chamber via a dry process comprising mixing a vapor stream of an organometallic precursor with a vapor stream of a counter-reactant;
      after depositing the PR, receive the substrate in the PEB chamber, wherein portions of the PR have been chemically altered by exposure to radiation to create a patterned PR;
      treat the patterned PR within the PEB chamber to modify material properties of the patterned PR; and
      dry develop the patterned PR within the development chamber by removing either an exposed portion or an unexposed portion of the patterned PR by a dry development process comprising exposure to a chemical compound to form a PR mask;
   wherein the computer-executable instructions further include instructions for controlling the one or more processors to, prior to the computer-executable instruction to deposit a PR, deposit an underlayer on the surface of the substrate via a dry process, wherein the underlayer increases adhesion of the PR to the substrate.

15. The system of claim 14, wherein the PR is a metal-containing PR.

16. The system of claim 14, wherein the PR is an EUV PR.

17. The system of claim 14, wherein the underlayer is deposited by a dry process.

18. The system of claim 14, wherein the plurality of reaction chambers further includes a pre-treatment chamber, and the computer-executable instructions further include instructions for controlling the one or more processors to, prior to the computer-executable instruction to deposit the PR:

treat the surface of the substrate via a dry process to cause more chemical functional groups on the surface of the substrate to improve PR adhesion to the substrate.

19. The system of claim 14, wherein the plurality of reaction chambers further includes a lithography scanner, and the computer-executable instructions further include instructions for controlling the one or more processors to, prior to the computer-executable instruction to receive the substrate in the PEB chamber:

receive the substrate in the lithography scanner; and
expose portions of the PR to radiation to create a patterned PR.

20. The system of claim 14, wherein a reaction chamber of the plurality of reaction chambers is configured to perform a wafer clean process, a post-application bake process, a post-exposure bake process, a dry development process, or any combinations thereof.

21. The system of claim 14, wherein the development chamber and the PR deposition chamber, the PEB chamber, the underlay deposition chamber, or any combinations thereof are the same chamber.

22. The system of claim 14, wherein the plurality of reaction chambers are each below atmospheric pressure, and the PR is under below-atmospheric pressure until after the dry development process.

23. The system of claim 14, wherein dry developing the patterned PR is performed at a pressure between about 100 Torr and about 760 Torr.

24. The system of claim 14, wherein an ambient environment of the substrate is controlled to reduce exposure of the photoresist to moisture prior to dry developing the patterned PR.

25. The system of claim 14, wherein the processes performed in the plurality of reaction chambers include wet and dry processes.

26. The system of claim 14, wherein the cluster comprises multiple PR deposition chambers.

27. An integrated lithography system, comprising:
a plurality of reaction chambers within a cluster, the plurality of reaction chambers comprising:
a photoresist (PR) deposition chamber;
a post-exposure bake (PEB) chamber;
a development chamber; and
a pre-treatment chamber;
a controller that includes one or more processors and one or more memory devices, wherein the one or more memory devices store computer-executable instructions for controlling the one or more processors to:
receive a substrate in the PR deposition chamber;
deposit a PR on a surface of the substrate within the PR deposition chamber via a dry process comprising mixing a vapor stream of an organometallic precursor with a vapor stream of a counter-reactant;
after depositing the PR, receive the substrate in the PEB chamber, wherein portions of the PR have been chemically altered by exposure to radiation to create a patterned PR;
treat the patterned PR within the PEB chamber to modify material properties of the patterned PR; and
dry develop the patterned PR within the development chamber by removing either an exposed portion or an unexposed portion of the patterned PR by a dry development process comprising exposure to a chemical compound to form a PR mask;
wherein the computer-executable instructions further include instructions for controlling the one or more processors to, prior to the computer-executable instruction to deposit the PR, treat the surface of the substrate via a dry process to cause more chemical functional groups on the surface of the substrate to improve PR adhesion to the substrate.

28. The system of claim 27, wherein the PR is a metal-containing PR.

29. The system of claim 27, wherein the PR is an EUV PR.

30. The system of claim 27, wherein the plurality of reaction chambers further includes a lithography scanner, and the computer-executable instructions further include instructions for controlling the one or more processors to, prior to the computer-executable instruction to receive the substrate in the PEB chamber:

receive the substrate in the lithography scanner; and
expose portions of the PR to radiation to create a patterned PR.

31. The system of claim 27, wherein a reaction chamber of the plurality of reaction chambers is configured to perform a wafer clean process, a post-application bake process, a post-exposure bake process, a dry development process, or any combinations thereof.

32. The system of claim 27, wherein the development chamber and the PR deposition chamber, the PEB chamber, the pre-treatment chamber, or any combinations thereof are the same chamber.

33. The system of claim 27, wherein the plurality of reaction chambers are each below atmospheric pressure, and the PR is under below-atmospheric pressure until after the dry development process.

34. The system of claim 27, wherein dry developing the patterned PR is performed at a pressure between about 100 Torr and about 760 Torr.

35. The system of claim 27, wherein an ambient environment of the substrate is controlled to reduce exposure of the photoresist to moisture prior to dry developing the patterned PR.

36. The system of claim 27, wherein the processes performed in the plurality of reaction chambers include wet and dry processes.

37. The system of claim 27, wherein the cluster comprises multiple PR deposition chambers.

* * * * *